(12) United States Patent
Kasu et al.

(10) Patent No.: US 8,486,816 B2
(45) Date of Patent: Jul. 16, 2013

(54) DIAMOND SEMICONDUCTOR ELEMENT AND PROCESS FOR PRODUCING THE SAME

(75) Inventors: Makoto Kasu, Atsugi (JP); Toshiki Makimoto, Atsugi (JP); Kenji Ueda, Atsugi (JP); Yoshiharu Yamauchi, Kunitachi (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 12/956,893

(22) Filed: Nov. 30, 2010

(65) Prior Publication Data

US 2011/0070694 A1 Mar. 24, 2011

Related U.S. Application Data

(62) Division of application No. 12/023,690, filed on Mar. 24, 2008, now Pat. No. 7,973,339, which is a division of application No. 11/577,678, filed as application No. PCT/JP2006/312334 on Jun. 20, 2006.

(30) Foreign Application Priority Data

| Jun. 20, 2005 | (JP) | 2005-179751 |
| Sep. 16, 2005 | (JP) | 2005-270541 |
| Oct. 21, 2005 | (JP) | 2005-307231 |
| Mar. 7, 2006 | (JP) | 2006-061838 |

(51) Int. Cl.
*H01L 21/28* (2006.01)
*H01L 21/44* (2006.01)
*H01L 21/338* (2006.01)
*H01L 29/15* (2006.01)
*H01L 31/0312* (2006.01)

(52) U.S. Cl.
USPC ............ 438/573; 438/167; 438/577; 257/77; 257/E21.047

(58) Field of Classification Search
USPC .. 257/200, 194, 281, 282, E29.247; 438/577, 438/670, 591, 105, 167, 259, 270, 272, 290, 438/FOR. 118, 573, 570
See application file for complete search history.

(56) References Cited

U.S. PATENT DOCUMENTS

| 3,612,960 A | 10/1971 | Takeishi et al. |
| 4,226,667 A | 10/1980 | Logan |

(Continued)

FOREIGN PATENT DOCUMENTS

| EP | 0209257 | 1/1987 |
| EP | 0439114 | 7/1991 |

(Continued)

OTHER PUBLICATIONS

U.S. Appl. No. 12/023,660, Jul. 12, 2011, Office Action.

(Continued)

*Primary Examiner* — Matthew Landau
*Assistant Examiner* — Khaja Ahmad
(74) *Attorney, Agent, or Firm* — Workman Nydegger

(57) ABSTRACT

An integrated optical waveguide has a first optical waveguide, a second optical waveguide, and a groove. The second optical waveguide is coupled to the first optical waveguide and has a refractive index that is different from the first optical waveguide. The groove is disposed so as to traverse an optical path of the first optical waveguide and is separated from an interface between the first optical waveguide and the second optical waveguide by a predetermined spacing. The spacing from the interface and the width of the groove are determined such that reflection at a boundary between the first optical waveguide and the second optical waveguide is weakened. A semiconductor board may be disposed at a boundary between the first optical waveguide and the second optical waveguide. In this case, the width of the groove and the thickness of the semiconductor board are determined such that light reflected off an interface between the first optical waveguide and the groove is weakened by light reflected from an interface between the groove and the semiconductor board, and by light reflected from an interface between the semiconductor board and the second optical waveguide.

10 Claims, 43 Drawing Sheets

U.S. PATENT DOCUMENTS

| | | | |
|---|---|---|---|
| 4,767,608 | A | 8/1988 | Matsumoto et al. |
| 4,816,291 | A | 3/1989 | Desphandey et al. |
| 4,981,818 | A | 1/1991 | Anthony et al. |
| 4,982,243 | A | 1/1991 | Nakahata et al. |
| 5,086,013 | A * | 2/1992 | Shimizu et al. ............... 438/670 |
| 5,106,452 | A | 4/1992 | Kadono et al. |
| 5,202,273 | A | 4/1993 | Nakamura |
| 5,243,199 | A | 9/1993 | Shiomi et al. |
| 5,254,862 | A * | 10/1993 | Kalyankjumar et al. ....... 257/77 |
| H1287 | H | 2/1994 | Zeisse et al. |
| 5,368,681 | A | 11/1994 | Hiraoka et al. |
| 5,374,318 | A | 12/1994 | Rabalais et al. |
| 5,381,755 | A | 1/1995 | Glesener et al. |
| 5,389,799 | A | 2/1995 | Uemoto |
| 5,427,054 | A | 6/1995 | Saito et al. |
| 5,429,998 | A | 7/1995 | Someno et al. |
| 5,493,131 | A | 2/1996 | Miyata et al. |
| 5,538,911 | A | 7/1996 | Yamazaki |
| 5,541,423 | A | 7/1996 | Hirabayashi |
| 5,571,603 | A | 11/1996 | Utumi et al. |
| 5,612,548 | A | 3/1997 | Saito et al. |
| 5,670,788 | A | 9/1997 | Geis |
| 5,672,395 | A | 9/1997 | Anthony et al. |
| 5,903,015 | A | 5/1999 | Shiomi et al. |
| 5,994,208 | A | 11/1999 | Prins |
| 6,015,459 | A | 1/2000 | Jamison et al. |
| 6,262,444 | B1 | 7/2001 | Hori et al. |
| 6,376,276 | B1 | 4/2002 | Oishi et al. |
| 6,784,036 | B2 * | 8/2004 | Makiyama et al. ............ 438/182 |
| 6,858,080 | B2 | 2/2005 | Linares et al. |
| 6,872,981 | B1 | 3/2005 | Horiuchi et al. |
| 6,887,144 | B2 | 5/2005 | D'Evelyn et al. |
| 7,160,617 | B2 | 1/2007 | Scarsbrook et al. |
| 7,312,562 | B2 | 12/2007 | Dahl et al. |
| 7,402,835 | B2 | 7/2008 | Liu et al. |
| 7,560,086 | B2 | 7/2009 | Linares et al. |
| 7,981,721 | B2 | 7/2011 | Scarsbrook et al. |
| 2001/0043903 | A1 | 11/2001 | D'Evelyn et al. |
| 2002/0028314 | A1 | 3/2002 | Tischler et al. |
| 2003/0091826 | A1 | 5/2003 | Abe et al. |
| 2003/0131787 | A1 | 7/2003 | Linares et al. |
| 2003/0196385 | A1 | 10/2003 | Middlemiss |
| 2004/0021204 | A1 | 2/2004 | Liu et al. |
| 2004/0119100 | A1 | 6/2004 | Nowak et al. |
| 2005/0054937 | A1 | 3/2005 | Takaoka et al. |
| 2005/0118349 | A1 | 6/2005 | Whitehead et al. |
| 2005/0127373 | A1 | 6/2005 | Yokota et al. |
| 2005/0168122 | A1 | 8/2005 | Dahl et al. |
| 2005/0181131 | A1 | 8/2005 | Linares et al. |
| 2006/0024981 | A1 | 2/2006 | Nakamura et al. |
| 2006/0027840 | A1 | 2/2006 | Wahlmuth |
| 2006/0043379 | A1 * | 3/2006 | Zhang et al. .................... 257/77 |
| 2006/0060864 | A1 | 3/2006 | Gerbi |
| 2007/0109329 | A1 | 5/2007 | Roh et al. |
| 2007/0160842 | A1 | 7/2007 | Hirata et al. |
| 2008/0134959 | A1 | 6/2008 | Kasu et al. |
| 2008/0134960 | A1 | 6/2008 | Kasu et al. |

FOREIGN PATENT DOCUMENTS

| | | |
|---|---|---|
| EP | 0702413 | 3/1996 |
| EP | 1179621 | 2/2002 |
| GB | 2258760 | 2/1993 |
| JP | 02590161 | 5/1987 |
| JP | 62-212297 | 9/1987 |
| JP | 64-077000 | 3/1989 |
| JP | 01-158774 | 6/1989 |
| JP | 01-246867 | 10/1989 |
| JP | 03-222436 | 10/1991 |
| JP | 03-292744 | 12/1991 |
| JP | 05-117089 | 5/1993 |
| JP | 05-279183 | 10/1993 |
| JP | 06-048715 | 2/1994 |
| JP | 06-209015 | 7/1994 |
| JP | 08-015162 | 1/1996 |
| JP | 08-088236 | 4/1996 |
| JP | 2001-007385 | 1/2001 |
| JP | 2001-064094 | 3/2001 |
| JP | 2003-347580 | 12/2003 |
| JP | 2008-539575 | 11/2008 |
| WO | 2004/022821 | 3/1804 |
| WO | 2004/074557 | 9/2004 |
| WO | 2005/054937 | 6/2005 |
| WO | 2006/117621 | 11/2006 |

OTHER PUBLICATIONS

U.S. Appl. No. 12/023,690, Jan. 13, 2011, Notice of Allowance.
Japanese Notice of Rejection from related Application No. 2007-522296 dated Feb. 4, 2011.
U.S. Appl. No. 11/577,678, Aug. 12, 2011, Office Action.
U.S. Appl. No. 12/023,660, Nov. 14, 2011, Office Action.
U.S. Appl. No. 11/577,678, Dec. 6, 2011, Office Action.
Isoya et al., "ESR studies of high-energy phosphorus-ion implanted synthetic diamond crystals," Radiation Physics and Chemistry, Elsevier Science Publishers BV, Amsterdam, NL, vol. 50, No. 4, Oct. 1, 1997, pp. 321-330.
Huggins et al., "Diamonds containing controllable impurity concentrations," Nature UK, vol. 194, Jun. 2, 1962, pp. 829-830.
Dean et al., "Intrinsic and extrinsic recombination radiation from natural and synthetic aluminum-doped diamond," Physical Review USA, vol. 140, No. 1A, Oct. 4, 1965, pp. A352-A368.
European Search Report dated Nov. 4, 2011 from related divisional application No. 11182461.1.
European Search Report dated Nov. 23, 2011 from related divisional application No. 11182458.7.
European Search Report dated Nov. 3, 2011 from related divisional application No. 11182460.3.
Park et al. "Orientation relationship in diamond and silicon carbide composites," Diamond & Related Materials 16 (2007) pp. 562-565.
U.S. Appl. No. 12/023,631, Feb. 23, 2011, Office Action.
U.S. Appl. No. 12/023,631, Sep. 13, 2011, Office Action.
Lombardi, "A first principles study of lithium, sodium and aluminum in diamond," Diamond & Related Materials 17 (2008), pp. 1349-1352, Dec. 2007.
U.S. Appl. No. 12/023,631, Jan. 30, 2012, Office Action.
U.S. Appl. No. 12/023,660, Feb. 16, 2012, Notice of Allowance.
U.S. Appl. No. 12/956,784, Feb. 29, 2012, Office Action.
Extended European Search Report dated Jan. 20, 2012 from European Application No. 11182463.7.
Cai et al., "Ti/Ni/Au/diamond MIS field effect transistors with TiO2 gate dielectric," Materials Research Society, Mat. Res. Soc. Symp. Proc., vol. 744 (2003) (6 pages).
Kawarada et al., "Enhancement mode metal-semiconductor field effect transistors using homoepitaxial diamonds," Applied Physics Letters, AIP, American Institute of Physics, vol. 65, No. 12, pp. 1563-1565 (1994).
U.S. Appl. No. 11/577,678, May 10, 2012, Notice of Allowance.
U.S. Appl. No. 12/023,631, May 14, 2012, Office Action.
U.S. Appl. No. 13/276,081, Apr. 6, 2012, Office Action.
U.S. Appl. No. 12/956,784, Aug. 17, 2012, Office Action.
U.S. Appl. No. 13/276,081, Aug. 6, 2012, Notice of Allowance.
U.S. Appl. No. 12/956,784, Jan. 7, 2013, Office Action.
Official Notice of Rejection dated Dec. 18, 2012 in related Japanese application No. 2011-084110.
Makoto Kasu et al., *High-Frequency Characteristics of Diamond MESFET*, Journal of the Japan Society of Applied Physics, vol. 76, No. 3, Mar. 2007, pp. 363-367.
C. Kittel, *Introduction to Solid State Physics*, published by Maruzen, 5th edition, vol. 1, pp. 11-22, (Tokyo, 1985).
Michal Kubovic et al., *High-Frequency Characteristics of Diamond MESFET*, Journal of the Japan society of Applied Physics, vol. 73, No. 3, Mar. 2004, pp. 363-367 (with English translation).
M. Kasu, *Influence of Epitaxy on the Surface Conduction of Diamond Film*, Diamond and Related Materials, No. 13, 2004, pp. 226-232.
J. Ruan et al., *Cathodoluminescence and Annealing Study of Plasma-Deposited Polycrystalline Diamond Films*, Journal of Applied Physics, vol. 69, No. 9, May 1, 1991, pp. 6632-6636.
F.P. Bundy et al., *Diamond-Graphite Equilibrium Line from Growth and Graphitization of Diamond*, The Journal of Chemical Physics, vol. 35, No. 2, Aug. 1961, pp. 383-391.

N.M. Balzaretti et al., *High Pressure Annealing of CVD Diamond Films*, Diamond and Related Materials, vol. 12, 2003, pp. 290-294.

A. Aleksov et al., *Prospects of Bipolar Diamond Devices*, Solid-State Electronics, vol. 44, 2000, pp. 369-375.

Office Action dated Nov. 3, 2009 from related U.S. Appl. No. 12/023,631, filed Jan. 31, 2008.

Office Action dated Mar. 10, 2010 from related U.S. Appl. No. 12/023,631, filed Jan. 31, 2008.

Office Action dated Jun. 10, 2009 from related U.S. Appl. No. 12/023,631, filed Jan. 31, 2008.

Office Action dated Mar. 2, 2010 from related U.S. Appl. No. 12/023,690, filed Jan. 31, 2008.

Office Action dated Sep. 1, 2010 from related U.S. Appl. No. 12/023,690, filed Jan. 31, 2008.

Office Action dated Jul. 25, 2008 from corresponding CN Patent Application No. 200680001082.5 (English translation attached).

Office Action dated Aug. 25, 2008 from corresponding KR Patent Application No. 10-2007-7009125 (English translation attached).

Supplementary European Search Report dated May 11, 2009 from related European Patent Application No. 06766995.2 (9 pages).

Office Action dated Apr. 9, 2013 from related Japanese Application No. 2011-084110.

* cited by examiner

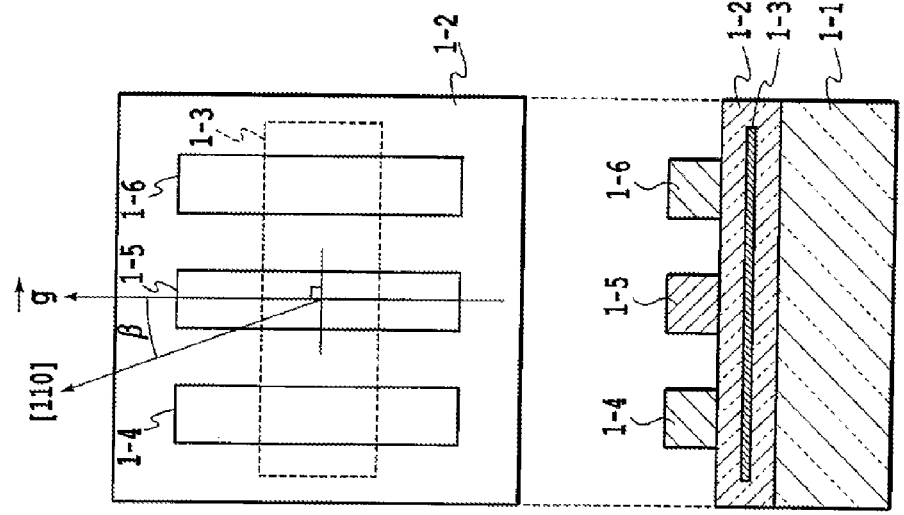
FIG. 3D
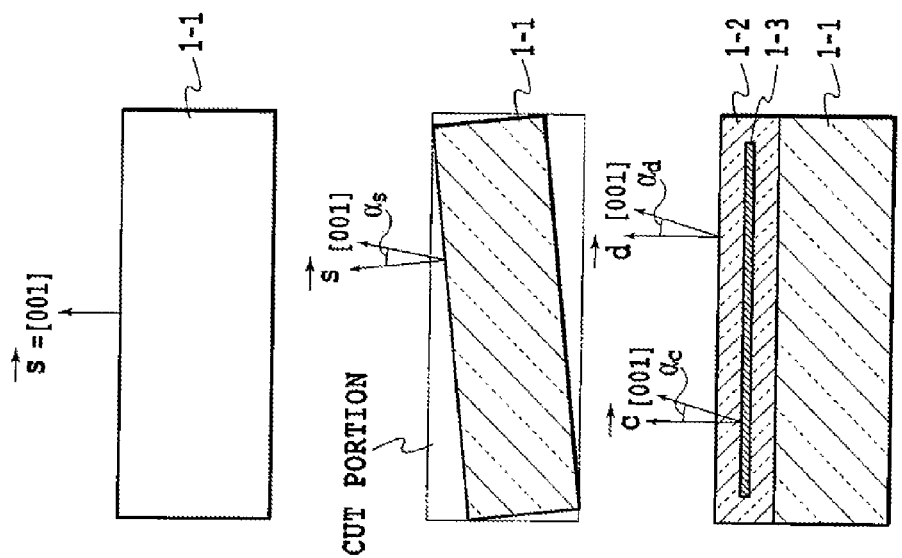
FIG. 3A
FIG. 3B
FIG. 3C

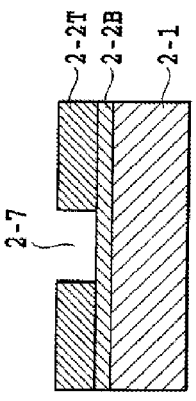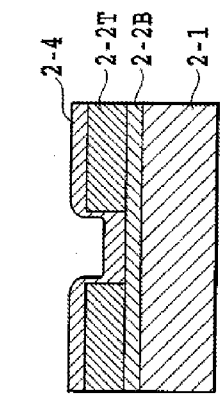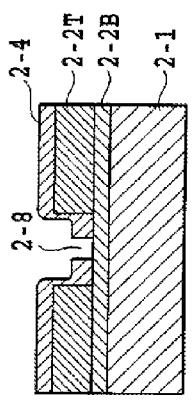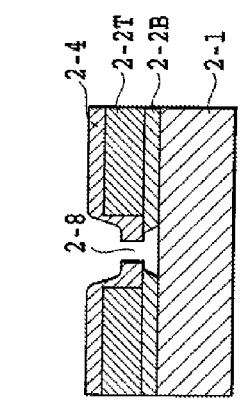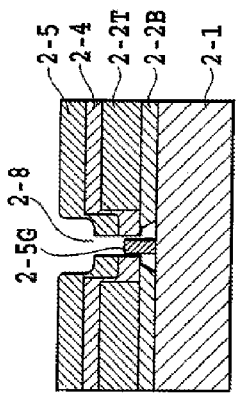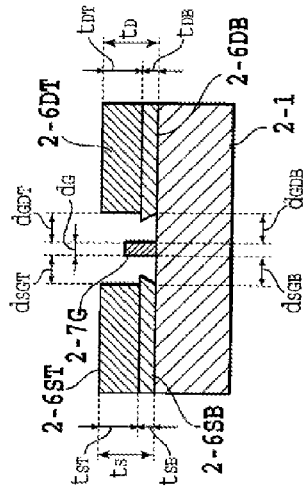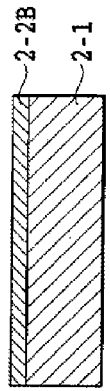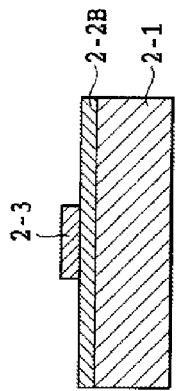
FIG.7A FIG.7B FIG.7C FIG.7D FIG.7E FIG.7F FIG.7G FIG.7H FIG.7I FIG.7J ic element, and more particularly, to a semiconductor element structure in which occurrence of a crystal defect peculiar to a diamond semiconductor element is suppressed, and a process for producing the same.

DIAMOND SEMICONDUCTOR ELEMENT AND PROCESS FOR PRODUCING THE SAME

CROSS-REFERENCE TO RELATED APPLICATIONS

This application is a divisional of U.S. patent application Ser. No. 12/023,690, filed Jan. 31, 2008, which is a divisional of U.S. patent application Ser. No. 11/577,678, filed Apr. 20, 2007, which is a nationalization of PCT Application No. PCT/JP2006/312334, filed Jun. 20, 2006, which claims priority to Japanese Patent Application Nos. 2005-179751 filed Jun. 20, 2005, 2005-270541 filed Sep. 16, 2005, 2005-307231 filed Oct. 21, 2005, and 2006-061838 filed Mar. 7, 2006, which are incorporated herein by reference.

FIELD OF THE INVENTION

The present invention relates to a diamond semiconductor element, and more particularly, to a semiconductor element structure in which occurrence of a crystal defect peculiar to a diamond semiconductor element is suppressed, and a process for producing the same.

BACKGROUND ART

A diamond has the highest thermal conductivity among a variety of materials, and has the highest breakdown electric field strength among semiconductors. Accordingly, the diamond is the semiconductor material most suitable for a high-power semiconductor requiring high voltage, large current operation. Since holes and electrons in the diamond have a high mobility and saturated velocity, the diamond is suitable for a high-frequency semiconductor element operable in high frequencies. A high-frequency diamond semiconductor element is a semiconductor element controlling high power in a high frequency band including a micro-wave band region and a millimeter-wave band region.

FIGS. 5A to 5C are diagrams illustrating conventional process-steps in producing a diamond semiconductor element. A description will be given below of the process-steps in producing a diamond semiconductor transistor by the use of a conventional technique disclosed in non-patent document 1 (see non-patent document 2 regarding surface orientation).

First, a single-crystal diamond substrate 1-31 is prepared as shown in FIG. 5A. The surface orientation of the surface of the single-crystal diamond substrate 1-31, which is $$\vec{s} \qquad \text{[Expression 1]}$$

has its surface orientation preciously in the [001] direction.

Then, as illustrated in FIG. 5B, crystal growth is performed on the single-crystal diamond substrate 1-31 to form a single-crystal diamond thin-film 1-32 thereon. In the crystal growth process-step, a two-dimensional-form hole channel 1-33 is formed in such a manner as to be parallel to the surface of the single-crystal diamond thin film 1-32. The surface orientation of the surface of the single-crystal diamond thin-film 1-32, which is $$\vec{d} \qquad \text{[Expression 2]}$$

and, the surface orientation of the forming face of the hole channel 1-33, which is $$\vec{c} \qquad \text{[Expression 3]}$$

becomes equal to the surface orientation of the surface of the single-crystal diamond substrate 1-31, and thus has the surface orientation preciously in the [001] direction.

Then, as illustrated in FIG. 5C, a source electrode 1-34, a gate electrode 1-35, and a drain electrode 1-36 are all formed on the single-crystal diamond thin-film 1-32. The longitudinal direction of the gate electrode 1-35, which is $$\vec{g} \qquad \text{[Expression 4]}$$

is the [100] direction.

The characteristics of the transistor produced by the aforementioned conventional method are disclosed in detail in non-patent document 1. The transistor characteristics data on all items with reference to the characteristics of a transistor having a gate length of 0.2 μm (normalized by the gate width) is disclosed. According to non-patent document 1, the maximum transconductance gmmax of the transistor is 150 mS/mm at the most.

However, a diamond single-crystal has the problem of an extremely high density of a crystal defect as compared with that of another semiconductor, for example, silicone, gallium arsenide, indium phosphide, gallium nitride, and the like. For this reason, the natural physical properties of a diamond, such as high thermal conductivity, a high breakdown electrical field, satisfactory high-frequency characteristics and the like, cannot be reflected in the transistor characteristics. A transistor using a diamond semiconductor is not yet in actual use. This problem is described in non-patent document 1. In consequence, for the achievement of the practically useful transistor using a diamond single-crystal, what is required is to produce an element by a method that minimizes the occurrence of the crystal defect peculiar to a diamond.

It is a first object of the present invention to significantly suppress occurrence of a crystal defect specific to a diamond by shifting the surface orientation of a diamond substrate slightly from the [001] direction.

It is theoretically clear that because a diamond has the highest thermal conductivity among materials and has the highest breakdown electric field strength among semiconductors, the diamond is the semiconductor material most suitable for a high-power semiconductor operable at high voltage and large current. In addition, it is known that because a diamond has a high mobility and saturated velocity of electrons and holes, the diamond is suitable for a high-frequency semiconductor element operable at high frequency.

FIGS. 13A to 13G illustrate process-steps in producing a conventional diamond semiconductor element. Gold (Au) is evaporated onto a diamond single-crystal thin-film 2-11 (FIG. 13A) having a two-dimensional hole channel close to the surface to form an Au thin-film 2-12 (FIG. 13B). The Au thin-film 2-12 is coated with a resist 2-13 (FIG. 13C). Then, photolithography or an electron beam is applied for exposure and development to remove part of the resist 2-13 to form an aperture in the resist 2-13 above the area in which a gate electrode will be formed (FIG. 13D). Then, a sample is immersed in an Au etchant to etch a portion of the Au thin-film 2-12 close to the aperture in the resist 2-13 (FIG. 13 E).

As illustrated in FIG. 13E, the etching is performed on the portion of the surface of the Au thin-film 2-12 exposed by the aperture of the resist 2-13, then proceeds from there in the depth direction (the direction at right angles to the diamond single-crystal thin-film 2-11) and simultaneously in the lateral direction (the direction horizontal to the diamond single-crystal thin-film 2-11). For this reason, an area of the Au thin-film 2-12 below the resist 2-13 is also cut away. The portion cut away or, as it were, hollowed out is called the "undercut". When the Au thin-film 2-12 is etched in the lateral direction by the etchant in this manner, because the bonding strength between the Au thin-film 2-12 and the resist 2-13 is greater than the bonding strength between the Au thin-film 2-12 and the diamond single-crystal thin-film 2-11, the etching velocity in the lateral diction is slower close to the resist 2-13 and faster close to the diamond single-crystal thin-film 2-11. For this reason, an angle θ of the end face of the etched portion of the Au thin-film 2-12 is about 45 degrees. In other words, each section of the Au thin-film 2-12 divided into two by the etching has an inverted mesa shape having the upper side wider than the lower side.

Next, Al (aluminum) is evaporated (FIG. 13F). The Al, which passes through the apertures of the resist 2-13 and the Au thin-film 2-12 to be evaporated directly onto the surface of the diamond single-crystal thin-film 2-11, and the Al, which is evaporated onto the resist 2-13, respectively form Al thin-films 2-15G, 2-15. Then, a sample is immersed in a liftoff fluid for the liftoff of the resist 2-13 to remove the resist 2-13 and the Al thin-film 2-15 evaporated thereon (FIG. 13G). At this stage, one of the Au thin-films 2-12 is defined as a source electrode 2-16S and the other thin-film 2-12 is defined as a drain electrode 2-16D, and also, the Al thin-film 2-15G remaining on the diamond single-crystal thin-film 2-11 is defined as a gate electrode 2-17G. At this point, the thickness $t_S$, $t_D$ is 0.6 μm, and the gate length $d_G$ corresponding to the length from the end of the gate electrode 2-17G close to the source to the end close to the drain is 0.2 μm.

The diamond semiconductor has the physically derived limitation that the channels in which the electron and the hole of a transistor travel are required to be located within 0.1 μm from the surface unlike other semiconductors, for example, silicone, gallium arsenide, indium, gallium nitride, and the like (see non-patent document 3).

Under this theoretically limitation, a requirement for an increase in the transconductance $g_m$, which is the degree of amplification of the diamond semiconductor element, to produce an enhancement up to a practical level in the maximum oscillation frequency $f_{max}$, which is the upper limit to operation frequency in the high-frequency characteristics, is to reduce the source-gate electrode distance $d_{SG}$ between an end of the face of the source electrode 2-16S making contact with the diamond single-crystal thin-film 2-11 and the end of the gate electrode 2-17G close to the source, and the gate-drain electrode distance $d_{GD}$ between the end of the gate electrode 2-17G close to the drain and an end of the face of the drain electrode 2-16D making contact with the diamond single-crystal thin-film 2-11. This presents fewer problems in the cases of other semiconductors, but in the diamond semiconductor element this is a critical problem resulting from its physical properties that needs to be solved. In addition, a reduction as great as possible in the gate length $d_G$ in FIG. 13G is also required for an increase in the maximum oscillation frequency $f_{max}$.

Non-patent document 4 discloses that the source-gate electrode distance $d_{SG}$ and the gate-drain electrode distance $d_{GD}$ are respectively from 1.3 μm to 1.4 μm, because the distance between the source electrode 2-16S and the drain electrode 2-16D is 2.6 μm or 2.7 μm, and the gate length $d_G$ is 0.2 μm.

At the same time, for the prevention of an unwanted voltage drop from occurring in transistor operation, the source electrode resistance and the drain electrode resistance are required to be reduced as much as possible. For a reduction in the source electrode resistance and the drain electrode resistance, the thickness $t_S$ of the source electrode 2-16S and the thickness $t_D$ of the drain electrode 2-16D are required to be increased as much as possible.

However, in the process of etching the Au thin-film 2-12, the inverted mesa structure having an angle θ of about 45 degrees, as shown in FIG. 13E, occurs at the end faces of the source electrode 2-16S and the drain electrode 2-16D close to the gate electrode 17G. This gives rise to the problem of the impossibility of reducing the source-gate electrode distance $d_{SG}$ and the gate-drain electrode distance $d_{GD}$ so as to be smaller than the thickness $t_S$ of the source electrode 2-16S and the thickness $t_D$ of the drain electrode 2-16D. In other words, the conventional art is incapable of simultaneously satisfying the two requirements, "a reduction in the source-gate electrode distance and the gate-drain electrode distance" and "an increase in the thickness of the source electrode and the thickness of the drain electrode".

FIGS. 14A to 14C show the characteristics of a diamond transistor produced by a conventional process. They are the results disclosed in non-patent document 3, all of which are standardized with reference to the characteristics of a transistor having a gate length of 0.2 μm. In the drain current-voltage characteristics shown in FIG. 14A, the maximum drain current normalized by the gate length $d_G$ is 0.35 A/mm at the most. In the dependence of the transconductance $g_m$ on the gate voltage $V_G$ (transfer characteristics) shown in FIG. 14B, the maximum transconductance $g_{mmax}$ normalized by the gage length $d_G$ is 150 mS/mm at the most. Further, in the dependence of the power gain U on the frequency f shown in FIG. 14C, the maximum oscillation frequency $f_{max}$ which is an upper limit to the operation frequency is 81 GHz at the most. The drain breakdown voltage, which is not shown in Figures, is 45V at the most.

Accordingly, it is a second object of the present invention to achieve the compatibility between "a reduction in the source-gate electrode distance $d_{SG}$ and the gate-drain electrode distance $d_{GD}$" and "an increase in the thickness $t_S$ of the source electrode and the thickness $t_D$ of the drain electrode" to increase the maximum oscillation frequency $f_{max}$ for a great improvement in the characteristics of a diamond field-effect transistor, and also to bring the voltage drop down, thus reaching a practical level.

Next, a process for producing a conventional diamond single-crystal thin-film will be described using FIGS. 22A and 22B. A diamond single-crystal substrate 3-1 having surface orientation (100) is prepared (FIG. 22A). Then, a microwave plasma CVD (chemical vapor deposition) apparatus is used to deposit a diamond single-crystal thin-film 3-2 of about 1 μm to 5 μm thickness onto the diamond single-crystal substrate 3-1 at a substrate temperature of 700° C. using methane as a reaction gas (FIG. 22B). The surface of the diamond thin-film obtained by the CVD technique is hydrogen-terminated in an as-grown state and has surface conduction properties, and functions as a P-type semiconductor.

Non-patent document 5 describes that, in order to improve the crystallinity of a diamond thin-film deposited on a silicone substrate, the above diamond thin-film is placed in a ceramic tube in which a vacuum of $1 \times 10^{-6}$ Torr is produced, and high-temperature annealing of 1000° C. or more is performed in the vacuum.

Then, the diamond single-crystal thin-film produced by the process for producing the conventional diamond single-crystal thin-film described in FIGS. 22A and 22B has an average mobility of about 800 cm²/Vs at room temperature, and a high quality thin-film is obtained with satisfactory reproducibility. However, impurities and a large number of crystal defects such as a growth hillock, abnormal growth particles and the like exist in the above diamond single-crystal thin-film.

In non-patent document 5, when the temperature at which the annealing is performed reaches 1200° C. or more, band-A emissions associated with deterioration of the diamond thin-film (emission resulting from defects) are increased. In short, in patent document 2, deterioration in crystallinity is increased at 1200° C. or more.

Because the higher the annealing temperature becomes, the more the crystallinity is improved, the annealing is desirably performed at higher temperatures. However, in non-patent document 5, if the temperature is increased for an improvement in crystallinity, when the temperature reaches a certain degree (1200° C.) or more, the conversion to graphite progresses in the diamond thin-film, resulting in an increase in deterioration in crystallinity.

Accordingly, it is a third object of the present invention to provide a diamond-thin-film producing process which is capable of reducing crystal defects, impurities and the like existing in a diamond thin-film to produce a high quality diamond thin-film.

It is known that a diamond has physical characteristics as a semiconductor superior to those of silicon (Si). It is recognized in a theory that the diamond element has characteristics regarding high-temperature operation five times that of the Si element, high-voltage performance 30 times that of the Si element and an increase in speed three times that of the Si element. For this reason, it is expected that the diamond will realize a high-output device having a high thermal conductivity and a breakdown electric field strength, a high-frequency device having a high carrier mobility and a high saturated drift velocity, and the like. In other words, because a field-effect transistor (FET) or a bipolar transistor uses a diamond semiconductor, an electron element capable of driving at a high frequency for high-power operation, significantly exceeding the conventional semiconductors, is provide. In addition, it is clear in theory that the realization of a semiconductor laser and a light emitting diode using a diamond semiconductor realizes a high intensity light emitting element with a wavelength of 225 nm in the ultraviolet region (see non-patent document 6).

A diamond has a band gap of 5.5 eV and is originally an insulator, but, as in the case of Si, if the diamond is doped with B which is a III group element, an acceptor level occurs, resulting logically in a p-type semiconductor.

Since a p-type semiconductor layer in a transistor or optical device structure has a high resistance, as in the case of an insulator when the hole concentration is less than $1.0 \times 10^{15}$ $cm^{-3}$, the p-type semiconductor layer does not fully function as a p-type semiconductor, and is thus of no use. Also, since a p-type semiconductor layer in a transistor or optical device structure shows a metallic electrical conduction when the density of the dopant element exceeds $1.0 \times 10^{21}$ $cm^{-3}$, in this case, the p-type semiconductor layer also does not fully functions as a p-type semiconductor, and is thus of no use. Thus, in the p-type semiconductor layer the hole concentration is required to be $1.0 \times 10^{15}$ $cm^{-3}$ or more and the dopant element concentration to be $1.0 \times 10^{21}$ $cm^{-3}$ or less.

Also, because the hole concentration and the dopant element concentration in a semiconductor depend on temperatures, it is important to satisfy the above requirements in operational temperatures around room temperature (300K) in order to ensure the practicality of the device. In addition, in high power use such as in appliances, electrical apparatuses, industrial equipment and the like, operation in a high-temperature condition is particularly required. For this reason, there is a necessity to satisfy the above requirements in, for example, about 500K which is higher than room temperature.

However, as shown in FIG. 38, the conventional technique of doping a diamond with boron (B) has the problem of only a hole concentration of $6 \times 10^{14}$ $cm^{-3}$ being obtained at room temperature (300 k) even when the B-atom concentration is $1.0 \times 10^{21}$ $cm^{-3}$. In FIG. 38, the horizontal axis represents the measurement temperature (K) and the vertical axis represents the hole concentration ($cm^{-3}$) in a conventional p-type diamond semiconductor, in which the measured values at each B-atom concentration in the conventional p-type diamond semiconductor are plotted. These values do not satisfy the $1.0 \times 10^{15}$ $cm^{-3}$ required for practical use at 300K. As a result, there arises the problem of the incapability of the practical use of a diamond semiconductor as a transistor or an optical device.

As means for increasing the hole concentration at about 300K of the diamond semiconductor, a greater increase in the B-atom concentration than $1.0 \times 10^{21}$ $cm^{-3}$ is conceivable. However, the crystal quality of a diamond becomes poor as the B-atom concentration becomes greater than $1.0 \times 10^{21}$ $cm^{-3}$, so that the diamond loses its semiconductor properties, resulting in the problem that it is of no practical use.

Accordingly, it is a fourth object of the present invention to provide a practically useful p-type diamond semiconductor having a hole concentration of $1.0 \times 10^{15}$ $cm^{-3}$ or more at room temperature (300K) or more and a dopant atom concentration of $1.0 \times 10^{21}$ $cm^{-3}$ or less, and to provide a process for producing the same.

A diamond is a semiconductor having both the highest thermal conductivity (22 W/cmK) and the highest breakdown electric field (>10 MV/cm) among substances as described above, and also a high carrier mobility (electron: 4500 $cm^2$/Vs, hole: 3800 $cm^2$/Vs), and if highly efficient doping is accomplished, a transistor operating at a high frequency and high output surpassing that of Si, GaAs, GaN is realized.

One of the methods of doping a diamond is an ion implantation technique. The ion implantation technique is a method for accelerating impurities at high voltage so as to lend them energy of some kV to some MV for the introduction of impurity ions into the crystal, in which because a high energy process is involved, damage (crystal defects, amorphous layer and the like) occurs in the crystal in proportion to the acceleration voltage. The damage can be removed by performing appropriate high-temperature annealing treatment, with the result that the dopant is electrically activated and the semiconductor characteristics caused by the implanted impurities emerge. However, since a diamond is thermodynamically a meta-stable layer under ordinary pressure (1 atmospheric pressure), a high-quality diamond semiconductor is not obtained by the generally employed annealing process performed under ordinary pressure or vacuum. For this reason, in patent document 1 high-temperature annealing under high pressure is performed as described below.

FIGS. 43A to 43E illustrate the process-steps in producing a diamond semiconductor using an ion implantation technique according to conventional art. An ion implantation apparatus is used to implant dopant (boron) into a diamond single-crystal (FIG. 43A) under the conditions of an acceleration voltage of 150 kV and a dose of $1 \times 10^{16}$ $cm^{-2}$ (FIGS. 43B to 43C) and then firing (annealing) is performed for one hour at a pressure and a temperature of 5 GPa and 1700K (FIG. 43D).

However, the diamond thin-film subjected to the annealing treatment in this manner has a high resistance, thus giving rise to the problem of exhibiting no semiconductor characteristics. This is because etching occurs on the diamond surface during the process of the high-temperature and high-pressure annealing treatment so as to cut away the layer into which the ion is implanted (FIG. 43D). In this manner, the conventional technique has the problem of the impossibility of providing a diamond semiconductor because the diamond layer formed by ion implantation is etched during the high-temperature and high-pressure annealing.

Accordingly, it is a fifth object of the present invention to provide a process for producing a diamond semiconductor which is capable of preventing the diamond surface from being etched by the high-temperature and high-pressure annealing performed on ion-implanted diamond to provide high-quality P-type and N-type diamond semiconductors which cannot be provided by conventional processes.

Patent document 1: Japanese Patent Publication No. 8-15162

Non-patent document 1: Makoto KASU et al., "High-frequency characteristics of diamond MESFET", Journal of the Japan society of applied physics "Applied Physics", vol. 73, No. 3 (March, 2004), pp. 363-367

Non-patent document 2: C. Kittel, "Introduction to Solid State Physics", published by Maruzen, the fifth edition, first volume, pp. 11-22

Non-patent document 3: Makoto KASU and 6 others, "High-frequency characteristics of diamond MESFET", Journal of Applied Physics, the Japan society of applied physics, 2004, vol. 73, No. 3, pp. 0363-0367

Non-patent document 4: M. Kasu, "Influence of epitaxy on hydrogen-passivated diamond" Diamond and Related Materials, 2004, No. 13, pp. 226-232

Non-patent document 5: J. Ruan et al., "Cathodoluminescence and annealing study of plasma-deposited polycrystalline diamond films" J. Appl. Phys. 69(9), 1 May 1991

Non-patent document 6: Kasu et al., "High-frequency characteristics of diamond MESFET", Journal of Applied Physics, 2004, vol. 73, No. 3, pp. 363-367

Non-patent document 7: F. P. Bundy, H. P. Bovenkerk, H. M. Strong, and R. H. Wentorf, "Diamond-Graphite Equilibrium Line from Growth and Graphitization of Diamond", The Journal of Chemical Physics, August, 1961, Vol. 35m Number 2, pp. 383

SUMMARY OF THE INVENTION

In the present invention, in order to attain the above-described first object, an aspect of the present invention is characterized in that, in a field-effect transistor comprising a single-crystal diamond thin-film, a hole or electron channel which is formed inside the single-crystal diamond thin-film, and a drain electrode, a gate electrode and a source electrode which are formed on the single-crystal diamond thin-film, a [001] direction of the crystal axis of the single-crystal diamond thin-film is inclined with respect to surface orientation of a surface of the single-crystal diamond thin-film, or alternatively, a [001] direction of the crystal axis of the single-crystal diamond thin-film is inclined with respect to surface orientation of a forming face of the channel.

The angle $\alpha d$ formed between the surface orientation of the surface of the single-crystal diamond thin-film and the [001] direction of the crystal axis of the single-crystal diamond thin-film, or the angle $\alpha c$ formed between the surface orientation of the forming face of the channel and the crystal axis [001] direction of the single-crystal diamond thin-film may be in the range of from 0.05 degrees to 1.1 degrees.

Another aspect of the present invention is characterized in that, in a field-effect transistor comprising a single-crystal diamond thin-film formed on a substrate, a hole or electron channel which is formed inside the single-crystal diamond thin-film, and a drain electrode, a gate electrode and a source electrode which are formed on the single-crystal diamond thin-film, a [001] direction of the crystal axis of the single-crystal diamond thin-film is inclined with respect to surface orientation of a surface of the single-crystal diamond thin-film, or alternatively, a [001] direction of the crystal axis of the single-crystal diamond thin-film is inclined with respect to surface orientation of a forming face of the channel.

The angle $\alpha d$ formed between the surface orientation of the surface of the single-crystal diamond thin-film and the [001] direction of the crystal axis of the single-crystal diamond thin-film, or the angle $\alpha c$ formed between the surface orientation of the forming face of the channel and the [001] direction of the crystal axis of the single-crystal diamond thin-film may be in the range of from 0.05 degrees to 1.1 degrees.

Another aspect of the present invention is characterized in that, in a field-effect transistor comprising a single-crystal diamond thin-film formed on a substrate, a hole or electron channel which is formed on the single-crystal diamond thin-film, and a drain electrode, a gate electrode and a source electrode which are formed on the channel, a [001] direction of the crystal axis of the single-crystal diamond thin-film is inclined with respect to surface orientation of a surface of the channel.

The angle $\alpha c$ formed between the surface orientation of the surface of the channel and the [001] direction of the crystal axis of the single-crystal diamond thin-film may be in the range of from 0.05 degrees to 1.1 degrees.

These substrates are a single-crystal diamond substrate, and the angle $\alpha s$ formed between the surface orientation of an interface between the single-crystal diamond substrate and the single-crystal diamond thin-film and the [001] direction of the crystal axis of the single-crystal diamond thin-film may be in the range of from 0.05 degrees to 1.1 degrees.

The angle $\beta$ formed between the longitudinal direction of these gate electrodes and the [110] direction of the crystal axis of the single-crystal diamond thin-film may be in the range of from minus 30 degrees to plus 30 degrees.

Another aspect of the present invention is characterized by comprising, in a process for producing a field-effect transistor comprising a single-crystal diamond thin-film formed on a substrate, a hole or electron channel which is formed inside the single-crystal diamond thin-film, and a drain electrode, a gate electrode and a source electrode which are formed on the single-crystal diamond thin-film, the step of forming the single-crystal diamond thin-film on the substrate; the step of forming the channel on the single-crystal diamond thin-film; the step of further forming the single-crystal diamond thin-film on the channel thus formed; and the step of performing a grinding process on a surface of the single-crystal diamond thin-film in such a manner as to incline surface orientation of the surface of the single-crystal diamond thin-film with respect to the [001] direction of the crystal axis of the single-crystal diamond thin-film.

Still another aspect of the present invention is characterized by comprising, in a process for producing a field-effect transistor comprising a single-crystal diamond thin-film formed on a substrate, a hole or electron channel which is formed inside the single-crystal diamond thin-film, and a drain electrode, a gate electrode and a source electrode which are formed on the single-crystal diamond thin-film, the step of forming the single-crystal diamond thin-film on the substrate; the step of performing a grinding process on a surface of the single-crystal diamond thin-film thus formed in such a manner as to incline the surface of the single-crystal diamond thin-film with respect to the [001] direction of a crystal axis of the single-crystal diamond thin-film; and the step of forming the channel on the single-crystal diamond thin-film after subjection to the grinding process.

Another aspect of the present invention is characterized by comprising, in a process for producing a field-effect transistor comprising a single-crystal diamond thin-film formed on a single-crystal diamond substrate, a hole or electron channel which is formed inside the single-crystal diamond thin-film, and a drain electrode, a gate electrode and a source electrode which are formed on the single-crystal diamond thin-film, the step of performing a grinding process on a surface of the single-crystal diamond substrate in such a manner as to incline surface orientation of the single-crystal diamond substrate with respect to the [001] direction of the crystal axis of the single-crystal diamond substrate; the step of forming the single-crystal diamond thin-film on the single-crystal diamond substrate after subjection to the grinding process; and the step of forming the channel on the single-crystal diamond thin-film.

The surface orientation of conventional single-crystal diamond substrates points precisely in the [001] direction. However, the 001 surface orientation is a surface orientation in which defects occur extremely readily. To avoid this, the surface of the diamond substrate is shifted slightly from the [001] direction, thereby making it possible to significantly reduce the occurrence of crystal defects peculiar to a diamond. A high transconductance of the field-effect transistor is provided.

In the present invention, in order to attain the aforementioned second object, an aspect of the present invention is a diamond semiconductor element which is characterized in that, in a diamond semiconductor element having a gate electrode, a source electrode and a drain electrode formed on a diamond single-crystal thin-film at a distance from each other, the source electrode includes a first area close to the diamond single-crystal thin-film and a second area except the first area, where a first distance between a first end face of the first area close to the gate electrode and the gate electrode is no more than a second distance between a second end face of the second area close to the gate electrode and the gate electrode, and the drain electrode includes a third area close to the diamond single-crystal thin-film and a fourth area except the third area, where a third distance between a third end face of the third area close to the gate electrode and the gate electrode is no more than a fourth distance between a fourth end face of the fourth area close to the gate electrode and the gate electrode.

The first distance may be in the range of from 0.1 μm to 10 μm, and the second distance may be in the range of from the first distance to 30 μm.

The third distance may be in the range of from 0.1 μm to 50 μm, and the fourth distance may be in the range of from the third distance to 50 μm.

The thickness of the first area may be in the range of from 0.01 μm to 0.2 μm, and the thickness of the second area may be no less than 0.2 μm.

The thickness of the third area may be in the range of from 0.01 μm to 0.2 μm, and the thickness of the fourth area may be no less than 0.2 μm.

An aspect of the present invention is a diamond semiconductor element which is characterized in that, in a diamond semiconductor having a gate electrode, a source electrode and a drain electrode formed on a diamond single-crystal thin-film at a distance from each other, the source electrode includes, at least, a first lower metal film formed on the diamond single-crystal thin-film and a first upper metal film formed on the first lower metal film, where a first distance between a first end face of the first lower metal film close to the gate electrode and the gate electrode is no more than a second distance between a second end face of the first upper metal film close to the gate electrode and the gate electrode, and the drain electrode includes at least a second lower metal film formed on the diamond single-crystal thin-film and a second upper metal film formed on the second lower metal film, where a third distance between a third end face of the second lower metal film close to the gate electrode and the gate electrode is no more than a fourth distance between a fourth end face of the second upper metal film close to the gate electrode and the gate electrode.

The first distance may be in the range of from 0.1 μm to 10 μm, and the second distance may be in the range of from the first distance to 30 μm.

The third distance may be in the range of from 0.1 μm to 50 μm, and the fourth distance may be in the range of from the third distance to 50 μm.

The thickness of the first lower metal film may be in the range of from 0.01 μm to 0.2 μm, and the thickness of the first upper metal film may be no less than 0.2 μm.

The invention described in claim 10 is the diamond semiconductor element described in claims 6 to 9, which is characterized in that the thickness of the second lower metal film may be in the range of from 0.01 μm to 0.2 μm, and the thickness of the second upper metal film may be no less than 0.2 μm.

The first lower metal film may be formed of either gold or an alloy including gold, and the first upper metal film may be formed either of any of the metals, gold, platinum, palladium, titanium, molybdenum and tungsten, or of an alloy including the metal.

The second lower metal film may be formed of either gold or alloy including gold, and the second upper metal film may be formed either of any of the metals, gold, platinum, palladium, titanium, molybdenum and tungsten, or of an alloy including the metal.

Another aspect of the present invention is a process for producing a diamond semiconductor element, which is characterized by comprising: the step of forming a first metal film on a diamond single-crystal thin-film; the step of forming a second metal film on the first metal film; the step of forming, in a first area of the second metal film, a first aperture reaching the surface of the first metal film; the step of etching away a part of the surface of the first metal film exposed by the aperture to form a second aperture reaching the surface of the diamond single-crystal thin-film; and the step of forming a third metal film on the diamond single-crystal thin-film exposed by the second aperture.

In the step of forming the first aperture, the first aperture may be formed such that the width of the first aperture is larger than the thickness of the second metal film.

According to the present invention, in a diamond semiconductor, the source electrode and the drain electrode are formed in such a manner as to divide each electrode into a layer for liftoff and a layer for etching, thereby making it possible to achieve the compatibility between "a reduction in the source-gate electrode distance and the gate-drain electrode distance" and "an increase in the thickness of the source electrode and the thickness of the drain electrode" to greatly improve the characteristics of a diamond field-effect transistor to reach a practical level.

In the present invention, in order to attain the aforementioned third object, an aspect of the present invention is a process for producing a diamond thin-film, which is characterized by comprising: a first process-step of forming a diamond crystal thin-film on a substrate; and a second process-step of firing the diamond crystal thin-film thus formed under a high pressure under which a diamond is stable.

Another aspect of the present invention is a process for producing a diamond thin-film, which is characterized by comprising: a first process-step of forming a diamond crystal thin-film on a substrate; a second process-step of putting two of the diamond crystal thin-film thus formed in readiness; and a third process-step of firing the two diamond crystal thin-films, superimposed one on another such that surfaces of the two diamond crystal thin-films make at least partial contact with each other, under a high pressure under which a diamond is stable.

Another aspect of the present invention is a process for producing a diamond thin-film, which is characterized by comprising: a first process-step of forming a diamond crystal thin-film on a substrate; a second process-step of either forming a protective member on at least a part of a surface of the diamond crystal thin-film thus formed, or overlaying the at-least part with a protective member, to use the protective member to protect the at-least part; and a third process-step of firing the diamond crystal thin-film thus protected by the protective member under a high pressure under which a diamond is stable.

The protective member may be any one of the three, silicon oxide, silicon nitride or aluminum oxide.

The protective member may be titanium, tungsten, platinum, palladium or molybdenum, or alternatively an alloy including at least one of them.

Further, the substrate may be a diamond single-crystal substrate.

The diamond crystal thin-film may be a diamond single-crystal thin-film.

Surface orientation of the diamond single-crystal substrate and the diamond single-crystal thin-film may be (111).

The diamond crystal thin-film may be a diamond polycrystal thin-film.

In the first process-step, at least either control of temperature for heating the substrate when the diamond crystal thin-film is formed, or control of the of the flow rate of methane to the flow rate of hydrogen in the methane and the hydrogen used when the diamond crystal thin-film is formed may be performed.

The temperature may be controlled so as to be no less than growing temperatures when the diamond crystal thin-film is formed, and no more than 700° C.

The may be controlled so as to exceed 0% and to be no more than 0.5%.

The smoothness of the surface of the diamond crystal thin-film may be no more than 30 nm in a region of 1 $\mu m^2$ in terms of average square roughness.

The relation between a pressure P(GPa) when the firing is carried out and a temperature T(K) when the firing is carried out may satisfy the relation of the expression $P \geqq 0.71 + 0.0027T$, and also the firing may be carried out under a pressure of $P \geqq 1.5$ GPa.

In the first process-step, the diamond crystal thin-film may be formed by a microwave plasma CVD technique.

According to the present invention, the diamond crystal thin-film is subjected to high-pressure and high-temperature annealing treatment in such a manner as to make a diamond stable, thus making it possible to reduce the crystal defects and impurities in the diamond crystal thin-film, resulting in an increase in quality of the diamond crystal thin-film.

In the present invention, in order to attain the aforementioned fourth object, an aspect of the present invention is a p-type diamond semiconductor, which is characterized by comprising, as a dopant element, any of the elements, Al, Be, Ca, Cd, Ga, In, Li, Mg and Zn.

The concentration of the dopant element may be a concentration enabling a hole concentration in the p-type diamond semiconductor to be no less than $1.0 \times 10^{15}$ cm$^{-3}$ and also to be no more than $1.0 \times 10^{21}$ cm$^{-3}$ at each temperature.

Al may be contained as the dopant element in a concentration of no less than $2.6 \times 10^{16}$ cm$^{-3}$ and no more than $1.0 \times 10^{21}$ cm$^{-3}$.

Be may be contained as the dopant element in a concentration of no less than $1.3 \times 10^{16}$ cm$^{-3}$ and no more than $1.0 \times 10^{21}$ cm$^{-3}$.

Ca may be contained as the dopant element in a concentration of no less than $3.2 \times 10^{16}$ cm$^{-3}$ and no more than $1.0 \times 10^{21}$ cm$^{-3}$.

Cd may be contained as the dopant element in a concentration of no less than $6.4 \times 10^{15}$ cm$^{-3}$ and no more than $1.0 \times 10^{21}$ cm$^{-3}$.

Ga may be contained as the dopant element in a concentration of no less than $8.1 \times 10^{15}$ cm$^{-3}$ and no more than $1.0 \times 10^{21}$ cm$^{-3}$.

In may be contained as the dopant element in a concentration of no less than $5.1 \times 10^{15}$ cm$^{-3}$ and no more than $1.0 \times 10^{21}$ cm$^{-3}$.

Li may be contained as the dopant element in a concentration of no less than $3.2 \times 10^{16}$ cm$^{-3}$ and no more than $1.0 \times 10^{21}$ cm$^{-3}$.

Mg may be contained as the dopant element in a concentration of no less than $1.0 \times 10^{17}$ cm$^{-3}$ and no more than $1.0 \times 10^{21}$ cm$^{-3}$.

Zn may be contained as the dopant element in a concentration of no less than $1.6 \times 10^{16}$ cm$^{-3}$ and no more than $1.0 \times 10^{21}$ cm$^{-3}$.

Another aspect of the present invention is a process for producing a p-type diamond semiconductor, which is characterized in that a diamond is doped with any of the elements Al, Be, Ca, Cd, Ga, In, Li, Mg and Zn by ultra-high-temperature and high-pressure synthesis.

Another aspect of the present invention is a process for producing a p-type diamond semiconductor, which is characterized in that a diamond is doped with any of elements Al, Be, Ca, Cd, Ga, In, Li, Mg and Zn by ion implantation.

Still another aspect of the present invention is a process for producing a p-type diamond semiconductor, which is characterized in that a p-type diamond semiconductor film is grown, by a chemical vapor deposition (CVD) technique, on a diamond substrate from a source gas including, at least, a gas that includes carbon (C) and a dopant gas in which the ratio of the number of Al atoms to the number of C atoms (Al/C) is no less than 0.26 ppm and no more than $10^4$ ppm.

The Al dopant gas may include any of the following four: aluminum (Al) vaporized by introducing solid-state Al into plasma, trimethylaluminum ($(CH_3)_3Al$: TMAl), triethylaluminum ($(C_2H_5)_3Al$: TEAl) and aluminium chloride ($AlCl_3$).

Another aspect of the present invention is a process of producing a p-type diamond semiconductor, which is characterized in that, a p-type diamond semiconductor film is grown, by a chemical vapor deposition (CVD) technique, on a diamond substrate from a source gas including, at least, a gas that includes carbon (C) and a dopant gas in which the ratio of the number of Be atoms to the number of C atoms (Be/C) is no less than 0.13 ppm and no more than $10^4$ ppm.

The Be dopant gas may include beryllium (Be) vaporized by introducing solid-state Be into plasma.

Another aspect of the present invention is a process of producing a p-type diamond semiconductor, which is characterized in that, a p-type diamond semiconductor film is grown, by a chemical vapor deposition (CVD) technique, on a diamond substrate from a source gas including, at least, a gas that includes carbon (C) and a dopant gas in which the ratio of the number of Ca atoms to the number of C atoms (Ca/C) is no less than 0.32 ppm and no more than $10^4$ ppm.

The Ca dopant gas may include either calcium (Ca) vaporized by introducing solid-state Ca into plasma, or calcium chloride ($CaCl_2$).

Another aspect of the present invention is a process for producing a p-type diamond semiconductor, which is characterized in that a p-type diamond semiconductor film is grown, by a chemical vapor deposition (CVD) technique, on a diamond substrate from a source gas including, at least, a gas that includes carbon (C) and a dopant gas in which the ratio of the number of Cd atoms to the number of C atoms (Cd/C) is no less than 0.064 ppm and no more than $10^4$ ppm.

The Cd dopant gas may include any of the following three: dimethylcadmium (($CH_3)_2Cd$: DMCd), diethylcadmium (($C_2H_5)_2Cd$: DECd) and cadmium chloride ($CdCl_2$).

Another aspect of the present invention is a process for producing a p-type diamond semiconductor, which is characterized in that a p-type diamond semiconductor film is grown, by a chemical vapor deposition (CVD) technique, on a diamond substrate from a source gas including, at least, a gas that includes carbon (C) and a dopant gas in which the ratio of the number of Ga atoms to the number of C atoms (Ga/C) is no less than 0.081 ppm and no more than $10^4$ ppm.

The Ga dopant gas may include any of the following three: trimethylgallium (($CH_3)_3Ga$: TMGa), triethylgallium (($C_2H_5)_3Ga$: TEGa) and gallium chloride ($GaCl_3$).

Another aspect of the present invention is a process for producing a p-type diamond semiconductor, which is characterized in that a p-type diamond semiconductor film is grown, by a chemical vapor deposition (CVD) technique, on a diamond substrate from a source gas including, at least, a gas that includes carbon (C) and a dopant gas in which the ratio of the number of In atoms to the number of C atoms (In/C) is no less than 0.051 ppm and no more than $10^4$ ppm.

The In dopant gas may include any of the following three: trimethylindium (($CH_3)_3In$: TMIn), triethylindium (($C_2H_5)_3In$: TEIn) and indium chloride ($InCl_3$).

Another aspect of the present invention is a process for producing a p-type diamond semiconductor, which is characterized in that a p-type diamond semiconductor film is grown, by a chemical vapor deposition (CVD) technique, on a diamond substrate from a source gas including, at least, a gas that includes carbon (C) and a dopant gas in which the ratio of the number of Li atoms to the number of C atoms (Li/C) is no less than 3.0 ppm and no more than $10^4$ ppm.

The Li dopant gas may include any of the following three: methyllithium ($CH_3Li$), ethyllithium ($C_2H_5Li$) and propyllithium ($C_3H_7Li$).

Another aspect of the present invention is a process for producing a p-type diamond semiconductor, which is characterized in that a p-type diamond semiconductor film is grown, by a chemical vapor deposition (CVD) technique, on a diamond substrate from a source gas including, at least, a gas that includes carbon (C) and a dopant gas in which the ratio of the number of Mg atoms to the number of C atoms (Mg/C) is no less than 1.0 ppm and no more than $10^4$ ppm.

The dopant gas including Mg may include any of the following three: bis-cyclopentadienyl magnesium (($C_5H_5)_2Mg$: $Cp_2Mg$), bis-methylcyclopentadienyl magnesium (($CH_3C_5H_4)_2Mg$: $MCp_2Mg$) and magnesium chloride ($MgCl_2$).

Another aspect of the present invention is a process for producing a p-type diamond semiconductor, which is characterized in that a p-type diamond semiconductor film is grown, by a chemical vapor deposition (CVD) technique, on a diamond substrate from a source gas including, at least, a gas that includes carbon (C) and a dopant gas in which the ratio of the number of Zn atoms to the number of C atoms (Zn/C) is no less than 0.16 ppm and no more than $10^4$ ppm.

The dopant gas including Zn may include any of the following three: dimethylzinc (($CH_3)_2Zn$: DMZn), diethylzinc (($C_2H_5)_2Zn$: DEZn) and zinc chloride ($ZnCl_2$).

Another aspect of the present invention is an MESFET, which is characterized by comprising: a diamond substrate; the p-type diamond semiconductor layer, produced by any of the aforementioned processes, formed on the diamond substrate; a source electrode and a drain electrode formed on the p-type diamond semiconductor layer at a distance from each other; and a gate electrode formed between the source electrode and the drain electrode on the p-type diamond semiconductor layer.

Still another aspect of the present invention is an MISFET, which is characterized by comprising: a diamond substrate; the p-type diamond semiconductor layer, produced by any of the aforementioned processes, formed on the diamond substrate; a source electrode and a drain electrode formed on the p-type diamond semiconductor layer at a distance from each other; an insulating layer formed between the metal electrodes on the p-type diamond semiconductor layer: and a gate electrode formed on the insulating layer.

Another aspect of the present invention is an npn-type bipolar transistor, which is characterized by comprising: a diamond substrate; a first n-type diamond semiconductor layer formed on the diamond substrate; the first p-type diamond semiconductor layer produced by any of the aforementioned processes, and a first metal electrode that are formed on the first n-type diamond semiconductor layer at a distance from each other; a second n-type diamond semiconductor layer and a second metal electrode that are formed on the p-type diamond semiconductor layer at a distance from each other; and a third metal electrode formed on the second n-type diamond semiconductor layer.

Another aspect of the present invention is a pnp-type bipolar transistor, which is characterized by comprising: a diamond substrate; the first p-type diamond semiconductor layer, produced by any of the aforementioned processes, formed on the diamond substrate; an n-type diamond semiconductor layer and a first electrode that are formed on the first p-type diamond semiconductor layer at a distance from each other; the second p-type diamond semiconductor layer, produced by any of the aforementioned processes and formed on the diamond substrate, and a second electrode that are formed on the n-type diamond semiconductor layer at a distance from each other; and a third electrode formed on the second p-type diamond semiconductor layer.

Another aspect of the present invention is an LED, which is characterized by comprising: a diamond substrate; the p-type diamond semiconductor layer, produced by any of the aforementioned processes, formed on the diamond substrate; an n-type diamond semiconductor layer and an anode electrode that are formed on the p-type diamond semiconductor layer at a distance from each other; and a cathode electrode formed on the n-type diamond semiconductor layer.

According to the present invention, it becomes possible to produce a practically useful p-type diamond semiconductor having a hole concentration of no less than $1.0 \times 10^{15}$ $cm^{-3}$ and a dopant atom concentration of no more than $1.0 \times 10^{21}$ $cm^{-3}$ at no less than room temperature (300K). In addition, it is possible to significantly increase the hole concentration of the p-type diamond semiconductor while reducing the dopant atom concentration to no more than $1.0 \times 10^{21}$ $cm^{-3}$.

In the present invention, in order to attain the aforementioned fifth object, an aspect of the present invention is characterized, in a process for producing a diamond semiconductor, by comprising: a first process-step of implanting dopant into a diamond by an ion implantation technique; a second process-step of forming a protective layer on at least part of the surface of the ion-implanted diamond; and a third process-step of firing the ion-implanted diamond protected by the protective layer under a pressure of no less than 3.5 GPa and at a temperature of no less than 600° C.

Another aspect of the present invention is characterized, in a process for producing a diamond semiconductor, by comprising: a first process-step of implanting dopant into a diamond by an ion implantation technique; and a second process-step of superimposing two of the ion-implanted diamond on one another such that at least part of the surfaces of the ion-implanted diamonds make contact with each other, and then of firing them under a pressure of no less than 3.5 GPa and at a temperature of no less than 600° C.

The dopant implanted by the ion implantation technique may include at least one of kinds, B, Al, Ga, In, Zn, Cd, Be, Mg, Ca, P, As, Sb, O, S, Se, Li, Na, and K.

The pressure P (kbar) and the temperature T (K) when the ion-implanted diamond is fired may be a pressure of no less than 35 kbar and a temperature of no less than 873K which satisfy the relation of the expression P>7.1+0.027T.

The protective layer may be any of the following layers: a layer of a metal including at least one of the metals titanium, tungsten, platinum, palladium and molybdenum, a layer of $Al_{1-x}Si_xO_{1-y}N_y$ ($0 \leq x \leq 1$, $0 \leq y \leq 1$) and a layer comprising many layers of no less than two of them.

The diamond used in the first process-step may be a diamond thin-film produced by a CVD technique.

According to the present invention, the provision of high-quality P-type and N-type diamond semiconductors having high mobility is made possibly by performing high-temperature and high-pressure annealing treatment on the ion-implanted diamond after the surface is protected by a protective layer. In addition, because a semiconductor having a sufficiently high free-electron and hole concentration at room temperature is obtained, it is possible to implement a high-frequency high-power transistor with high performance.

BRIEF DESCRIPTION OF THE DRAWINGS

FIG. 3A is a diagram illustrating a process-step in producing the diamond semiconductor element of the first embodiment.

FIG. 3B is a diagram illustrating a process-step in producing the diamond semiconductor element of the first embodiment.

FIG. 3C is a diagram illustrating a process-step in producing the diamond semiconductor element of the first embodiment.

FIG. 3D is a diagram illustrating a process-step in producing the diamond semiconductor element of the first embodiment.

FIG. 7A is a diagram illustrating a process-step in producing a diamond semiconductor element according to an embodiment of the present invention.

FIG. 7B is a diagram illustrating a process-step in producing a diamond semiconductor element according to the embodiment of the present invention.

FIG. 7C is a diagram illustrating a process-step in producing a diamond semiconductor element according to the embodiment of the present invention.

FIG. 7D is a diagram illustrating a process-step in producing a diamond semiconductor element according to the embodiment of the present invention.

FIG. 7E is a diagram illustrating a process-step in producing a diamond semiconductor element according to the embodiment of the present invention.

FIG. 7F is a diagram illustrating a process-step in producing a diamond semiconductor element according to the embodiment of the present invention.

FIG. 7G is a diagram illustrating a process-step in producing a diamond semiconductor element according to the embodiment of the present invention.

FIG. 7H is a diagram illustrating a process-step in producing a diamond semiconductor element according to the embodiment of the present invention.

FIG. 7I is a diagram illustrating a process-step in producing a diamond semiconductor element according to the embodiment of the present invention.

FIG. 7J is a diagram illustrating a process-step in producing a diamond semiconductor element according to the embodiment of the present invention.

DETAILED DESCRIPTION OF THE INVENTION

In order to attain the first object, a diamond semiconductor element according to the present invention is characterized in that each surface orientation of a single-crystal diamond substrate, a single-crystal diamond thin-film, and a hole channel or electron channel, and the direction of forming a gate electrode are defined as directions peculiar to the present invention. The structure of a diamond semiconductor element according to the present invention in order to attain the first object and a process for producing the diamond semiconductor element will be described below in detail.
(Embodiment 1)

Figure 1A:
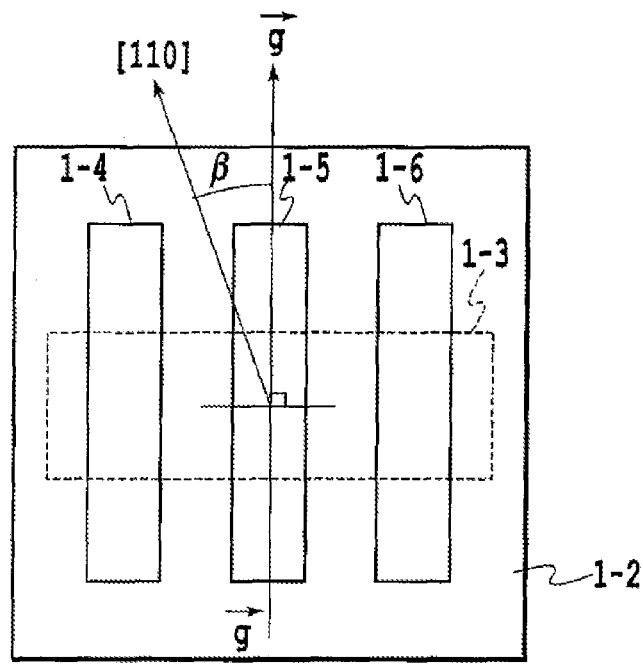
FIG. 1A is a diagram illustrating the structure of a diamond semiconductor element according to a first embodiment of the present invention.
Figure 1B:
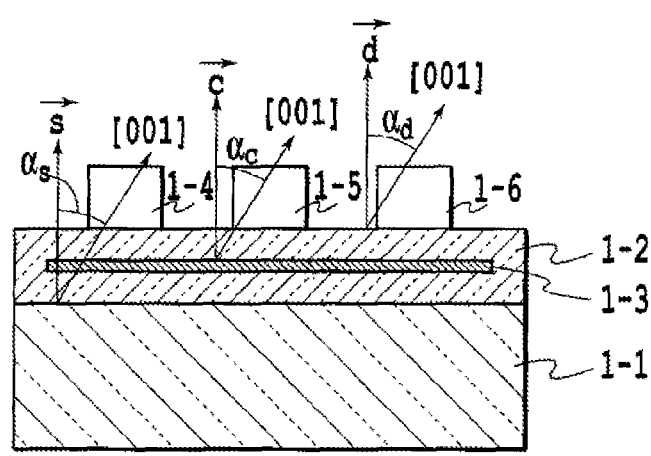
FIG. 1B is a diagram illustrating the structure of a diamond semiconductor element according to a first embodiment of the present invention.

FIGS. 1A and 1B are schematic diagrams of a diamond semiconductor element according to embodiment 1 of the present invention. As illustrated in the sectional view in FIG. 1B, a single-crystal diamond thin-film 1-2 is formed on a single-crystal diamond substrate 1-1. A two-dimensional hole or electron channel 1-3 is formed in the single-crystal diamond thin-film 1-2. Then, an angle formed by the surface orientation of the single-crystal diamond substrate 1-1 and the crystal axis [001] direction of the single-crystal diamond substrate 1-1 is defined as αs, an angle formed by the surface orientation of the single-crystal diamond thin-film 1-2 and the crystal axis [001] direction of the single-crystal diamond thin-film 1-2 is defined as αd, and an angle formed by the surface orientation of the channel 1-3 and the crystal axis [001] direction of the single-crystal diamond thin-film 1-2 is defined as αc. As illustrated in the top view in FIG. 1A, a source electrode 1-4, a gate electrode 1-5 and a drain electrode 1-6 are formed on the surface of the single-crystal diamond thin-film 1-2. The channel 1-3 formed in the single-crystal diamond thin-film 1-2 is indicated with a dotted line. An angle formed by the longitudinal direction of the gate electrode 1-5, which is $$\vec{g},$$ [Expression 5]

and the crystal axis [110] of the single-crystal diamond thin-film is defined as β. A description of αs, αd, αc and β will be given later. Next, a process of producing the diamond semiconductor element will be described.

FIGS. 3A to 3D are diagrams illustrating the process-steps in producing the diamond semiconductor element according to the present invention. As shown in FIG. 3A, first, a single-crystal diamond substrate 1-1 having surface orientation oriented mainly in the direction of the crystal axis is prepared.

Then, as shown in FIG. 3B, surface grinding is performed such that the surface direction of the surface of the single-crystal diamond substrate 1-1, which is $$\vec{s},$$ [Expression 6]

is inclined αs (°) from the [001] direction of the crystal axis of the single-crystal diamond substrate 1-1. The surface grinding may be carried out by the following procedure, for example. First, the inclined angle from the [001] surface orientation of the substrate surface is measured in advance by X-ray diffraction measurement. Then, the single-crystal diamond substrate 1-1 is bonded to a sample tray with wax. Then, an iron flat plate is coated with diamond abrasive grain (particle diameter of from 0.3 μm to 1 μm) together with oil. The sample tray on which the single-crystal diamond substrate 1-1 is bonded is placed on the iron flat plate, and is then fixed, and then the iron flat plate is rotated for grinding. After grinding has been performed for a fixed time-period, the inclined angle is measured by X-ray diffraction measurement. The above-described grinding and the X-ray diffraction measurement are repeated until the desired angle αs is obtained. In other words, as shown in FIG. 3B, the substrate is cut away until the surface orientation of the single-crystal diamond substrate reaches a predetermined as by grinding. The face inclined αs(°) may be only the face on which a single-crystal diamond thin-film will be grown in the next process-step described later.

Next, as shown in FIG. 3C, crystal growth is performed on the single-crystal diamond substrate 1-1 having the surface orientation angle αs to form a single-crystal diamond thin-film 1-2 thereon. This crystal growth of the thin-film may be carried out by, for example, a microwave plasma CVD technique. More specifically, a methane gas and a hydrogen gas (the flow of methane gas is 1%) are fed as a source gas into a reaction tube in which the single-crystal diamond substrate 1-1 is placed. The degree of vacuum in the reaction tube is set at 50 Torr, and a microwave is applied at 2.45 GHz and 1.3 kW to generate plasma in the reaction tube. The temperature of the single-crystal diamond substrate 1-1 is set at 700 degrees (all this is condition 1). The surface orientation of the surface of the single-crystal diamond thin-film 1-2, which is $$\vec{d},$$ [Expression 7]

is able to be formed at an inclination of αd(°) from the [001] direction of the crystal axis of the single-crystal diamond thin-film 1-2, as in the case of the surface of the single-crystal diamond substrate 1-1.

A two-dimensional hole or electron channel 1-3 is formed inside the single-crystal diamond thin-film 1-2 along the surface of the single-crystal diamond thin-film 1-2. The channel 1-3 is formed by, for example, a microwave plasma CVD technique as in the case of the aforementioned single-crystal diamond thin-film 1-2. Specifically, the conditions of the temperature and the degree of vacuum in the reaction tube and the microwave are the same, but the condition of the source gas is changed so that only a hydrogen gas is used (condition 2). Under this condition 2, plasma is applied for 15 minutes to the surface of the single-crystal diamond thin-film 1-2 under the growing process, thereby forming the channel 1-3. Then, the previous condition (condition 1) is restored, the single-crystal diamond thin-film 1-2 is formed again, thereby forming the channel 1-3 inside the single-crystal diamond thin-film 1-2.

Note that the aforementioned condition 1 and condition 2 apply to an example when a hole channel is used. When an electron channel is used to constitute a diamond semiconductor element, it is possible to use hydrogen, a methane gas, a phosphine (PH3) gas as a source gas (condition 3). In this case, the single-crystal diamond thin-film 1-2 is formed initially under condition 1, then the condition is changed to condition 3 to form an electron channel 1-3, and then the condition is changed back to condition 1 to form the single-crystal diamond thin-film 1-2 again. The surface orientation of the forming face of the two-dimensional channel 1-3, which is $$\vec{c},$$ [Expression 8]

is able to be formed at an inclination of αc(°) from the [001] direction of the crystal axis of the single-crystal diamond thin-film 1-2.

Next, as shown in FIG. 3D, a source electrode 1-4, a gate electrode 1-5 and a drain electrode 1-6 are formed on the surface of the single-crystal diamond thin-film 1-2. When the surface of the single-crystal diamond thin-film 1-2 is viewed from above, the channel 1-3 exists directly below the source electrode 1-4 and the drain electrode 1-6 (the channel 1-3 is indicated with the dotted line in the top view in FIG. 3D). The gate electrode 1-5 is positioned midway between the source electrode 1-4 and the drain electrode 1-6. When the surface of the single-crystal diamond thin-film 1-2 is viewed from above, the gate electrode 1-5 is positioned so as to intersect with the channel 1-3. The gate electrode 1-5 is produced such that the longitudinal direction of the gate electrode 1-5 above the channel 1-3, which is $$\vec{g},$$ [Expression 9]

becomes the [001] direction of the crystal axis of the single-crystal diamond thin-film or a direction inclining β (degrees) from the [001] direction of the crystal axis, as shown in FIG. 3D. By way of each of the above process-steps, the field-effect transistor based on the diamond semiconductor element structure according to the present invention is completed.

At this stage, the relationship between αs, αd and αc will be described in further detail. First, αs is determined by the process-step of grinding the aforementioned single-crystal diamond substrate 1-1, and then without further processing, the single-crystal diamond thin-film layer 1-2 and the channel 1-3 are formed, resulting in αs=αd=αc. However, without limiting to this condition, each of the angles can be independently controlled. For example, after the single-crystal diamond thin-film 1-2 is formed and before the electrodes are formed, the surface of the single-crystal diamond thin-film 1-2 is ground for inclination. Thereby, it is possible to make the angle αd and the angle αs different from each other. Also, immediately before the channel 1-3 is formed, the substrate is temporarily removed from the reaction tube, and then the surface of the single-crystal diamond thin-film which has been formed up to that time is ground for inclination. Then, the channel 1-3 is formed. Thereby, it is possible to control αs and αc independently of each other.

Figure 4A:
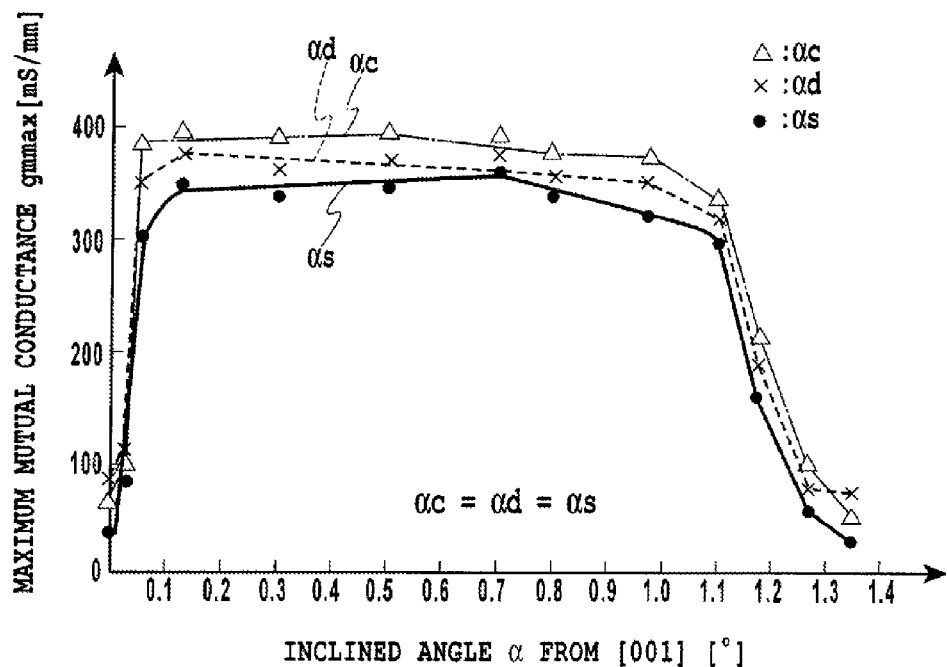
FIG. 4A shows transistor characteristics of the diamond semiconductor element according to the first embodiment of the present invention.
Figure 4B:
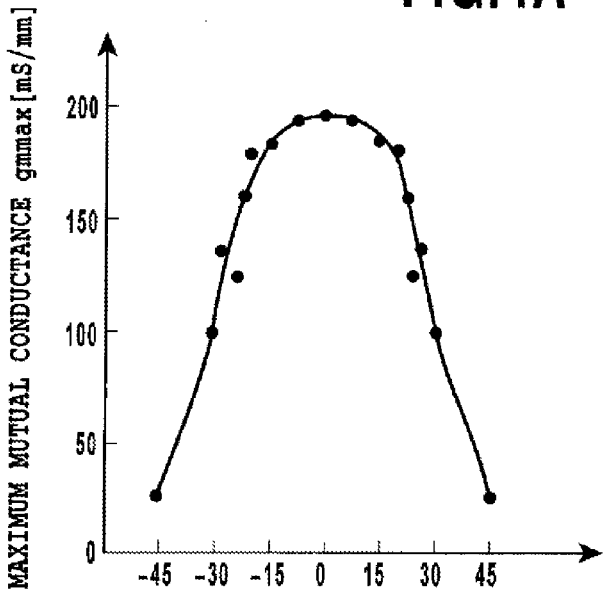
FIG. 4B shows transistor characteristics of the diamond semiconductor element according to the first embodiment of the present invention.
Figure 5A:
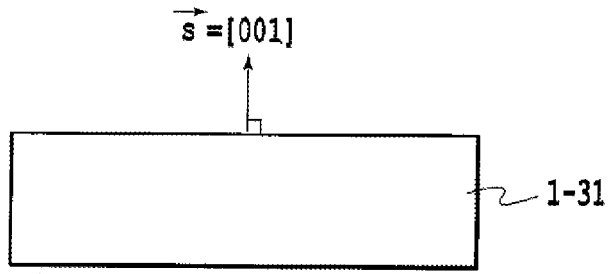
FIG. 5A is a diagram illustrating a process-step in producing a diamond semiconductor element according to conventional art.
Figure 5B:
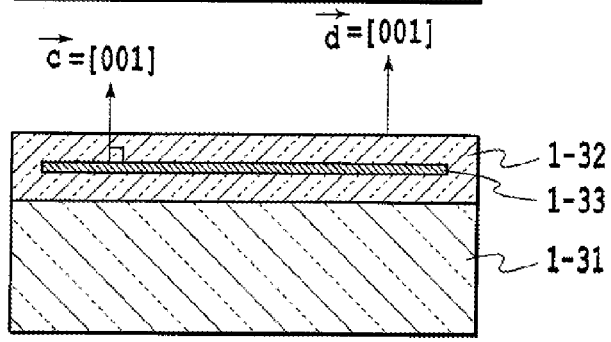
FIG. 5B is a diagram illustrating a process-step in producing a diamond semiconductor element according to conventional art.
Figure 5C:
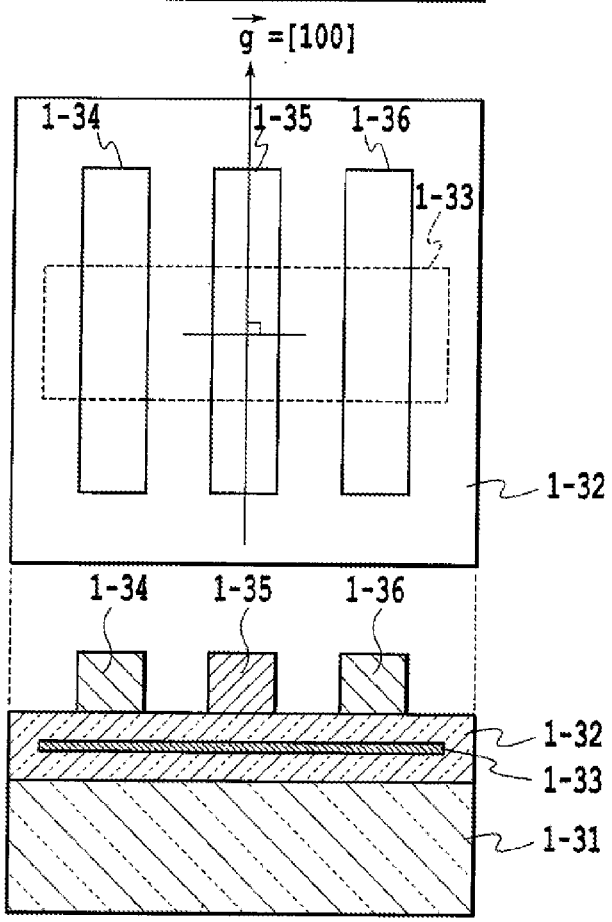
FIG. 5C is a diagram illustrating a process-step in producing a diamond semiconductor element according to conventional art.

FIGS. 4A and 4B are graphs showing the characteristics of the field-effect transistor produced by the above-described process-steps according to the present invention. FIG. 4A is a graph showing the relationship between the maximum transconductance gmmax and the angles (αs, αd, αc) inclined from the [001] direction of orientation of each surface. Here, the angles αs, αd, αc are equally formed are simultaneously changed. The transconductance is a basic parameter representing the performance of the field-effect transistor. In general, the existence of crystal defects is able to be evaluated by the representative device performance gm. If the gm is high, fewer crystal defects can be evaluated. Note that the value of β in FIG. 4B, described later, is zero degrees.

In a transistor produced by conventional art, the surface orientation of the single-crystal diamond substrate or the like points precisely in the [001] direction. In other words, the state of αs=0°, αc=0° and αd=0° results. In this case, the gmmax is about 40 mS/mm to about 80 mS/mm.

As seen from FIG. 4A, with an increase of αs, αc and αd, the gmmax sharply increases, and under the condition that αs=0.05°, αc=0.05° and αd=0.05°, gmmax=310 mS/mm to 390 mS/mm results. When αs, αc and αd are within the range of 0.05° to 1.1°, the gmmax is 300 mS/mm or more. On the other hand, when αs, αc and αd exceed 1.1°, gmmax sharply decreases. In this manner, the setting of αs, αc and αd within the range of 0.05° to 1.1° makes it possible to obtain a significantly higher gmmax than that in the case of conventional art. As described earlier, the shifting of the surface orientation of the single-crystal diamond substrate or the like slightly from the [001] direction makes it possible to remarkably suppress the occurrence of the crystal defects peculiar to a diamond, thus providing transconductance of a large field-effect transistor.

FIG. 4B is a graph showing the relationship between the maximum transconductance gmmax and the inclination of the angle β from the [110] direction with respect to the longitudinal direction of the gate electrode. In this case, αs=αc=αd=0.05° is established.

In the conventional art, the [100] direction is used for the longitudinal direction of the gate electrode. In other words, when the longitudinal direction of the gate electrode is pointed in the [100] direction, it corresponds to the state of β=±45° in FIG. 4B. Under this condition that β=±45° which is the conventional art, the gmmax is 25 mS/mm at the most.

In the diamond semiconductor element according to the present invention, when β is in the range from −30° to 30°, the gmmax is 100 mS/mm or more, and in β=0° (corresponding to g=[110]), the gmmax reaches 200 mS/mm. In this way, only after the direction in which the gate electrode 1-5 has been formed is optimized within the above-described range, it is possible to produce a field-effect transistor using a diamond semiconductor having a transconductance at a practical level.

The foregoing has described the case when the channel 1-3 is formed inside the single-crystal diamond thin-film 1-2. However, even in a structure in which the single-crystal diamond thin-film is not formed again after the process-step of forming the channel 1-3, and the source electrode 1-4, the gate electrode 1-5 and the drain electrode 1-6 are formed directly on the surface of the channel 1-3, what results can be operated as a semiconductor element. In other words, a structure without the single-crystal diamond thin-film 1-2 formed above the channel 1-3 in FIG. 1B is also allowable. In this case, if the angle αc formed between the surface orientation of the surface of the channel 1-3 and the crystal axis [001] direction of the single-crystal diamond thin-film 1-2, and the angle αs formed between the surface orientation of the single-crystal diamond substrate 1-1 and the crystal axis [001] direction of the single-crystal diamond substrate 1-1 are each set within the aforementioned range, the same effect of suppressing the occurrence of crystal defects is obtained by a more simple structure. Thus, it is needless to say that, the structure of the channel 1-3 is not limited to being placed exactly halfway in the thickness direction of the single-crystal diamond thin-film layer 1-2 as illustrated in FIG. 1B.

Figure 6:
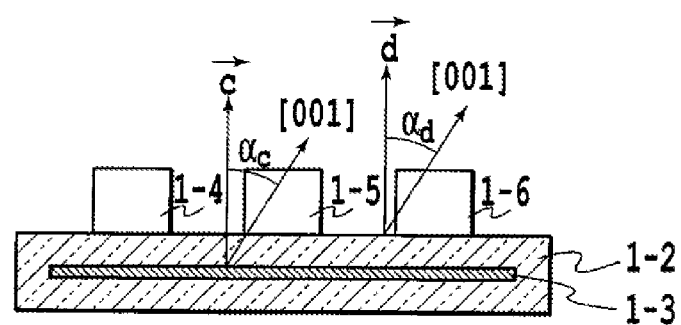
FIG. 6 is a diagram illustrating the structure of a diamond semiconductor element according to the present invention in which a diamond substrate is removed.

Also, it is possible to provide a structure without the single-crystal diamond substrate 1-1 as a result of the removal of the single-crystal diamond substrate 1-1 in FIG. 1 before the source electrode 1-4, the gate electrode 1-5 and the drain electrode 1-6 are formed. That is, the effects peculiar to the present invention can be provided by the structure, as illustrated in FIG. 6, constituted of the single-crystal diamond thin-film 1-2, channel 1-3, source electrode 1-4, gate electrode 1-5 and the drain electrode 1-6 after the single-crystal diamond substrate 1-1 has been removed from FIG. 1. In this case, the single-crystal diamond thin-film 1-2 has a relatively thicker film-thickness such that the film alone can structurally support itself alone. The removal of the single-crystal diamond substrate 1-1 may be performed by, for example, grinding.

Next, the definition of the surface orientation used in this specification will be described. It is needless to say that the [110] direction and the [100] direction are the definition of the direction when a principal direction of the plane of the single-crystal diamond substrate 1-1 or the principal direction of the surface of the single-crystal diamond thin-film 1-2 is designated as the [001] direction. A diamond crystallographically has the lattice system, which is a cubic lattice (cubic crystal). Typically, the crystal plane has the property of being apt to appear as the number of atom bonds necessary to be broken when the plane is formed becomes fewer. For this reason, in the case of a diamond, the surface orientations apt to appear are [001], [111] and [011]. As described above, since the diamond is of a cubic crystal system, [001], [100], [010] and the like are physically equivalent. Mathematically, [100], [−100], [010], [0-10], [00-1] are also present. However, they are all equivalent to [001] because of the crystal symmetry (for details see non-patent document 2). In this specification, the principal direction of the single-crystal diamond substrate 1-1 plane or the principal direction of the single-crystal diamond thin-film 1-2 surface is described as the [001] direction. Note that the "principal direction" means the surface orientation which is most apt to appear as described above.

When the principal direction of the single-crystal diamond substrate 1-1 plane or the principal direction of the single-crystal diamond thin-film 1-2 surface is defined as the direction, the [100] direction, which is a preferable direction of the longitudinal direction of the gate electrode 1-5, is crystallographically equivalent to the [010] direction. Accordingly, it goes without saying that the description of the [100] direction in this specification includes the [010] direction. Note that [100], [−100], [010], [0-10], [00-1] are equivalent as described earlier, and they are generically referred to as the [100] direction which is a preferable direction of the longitudinal direction of the gate electrode 1-5. It is to be noted that the [110] direction also is a generic name.

In the process-steps shown in FIGS. 3A to 3D, the single-crystal diamond substrate 1-1 is used. However, even when the single-crystal diamond substrate 1-1 is not used, as long as the surface orientation of the single-crystal diamond thin-film 1-2 or the surface orientation of the channel 1-3 plane falls within each of the αd, αc angle ranges described in FIG. 4, it is needless to say that the effect of increasing the transconductance is produced by the same token. When the single-crystal diamond substrate 1-1 is not used, Ir (iridium metal), MgO, Si, for example, may be used as a substrate. What is required is for the substrate to allow the single-crystal diamond thin-film to be formed thereon.

(Embodiment 2)

Figure 2:
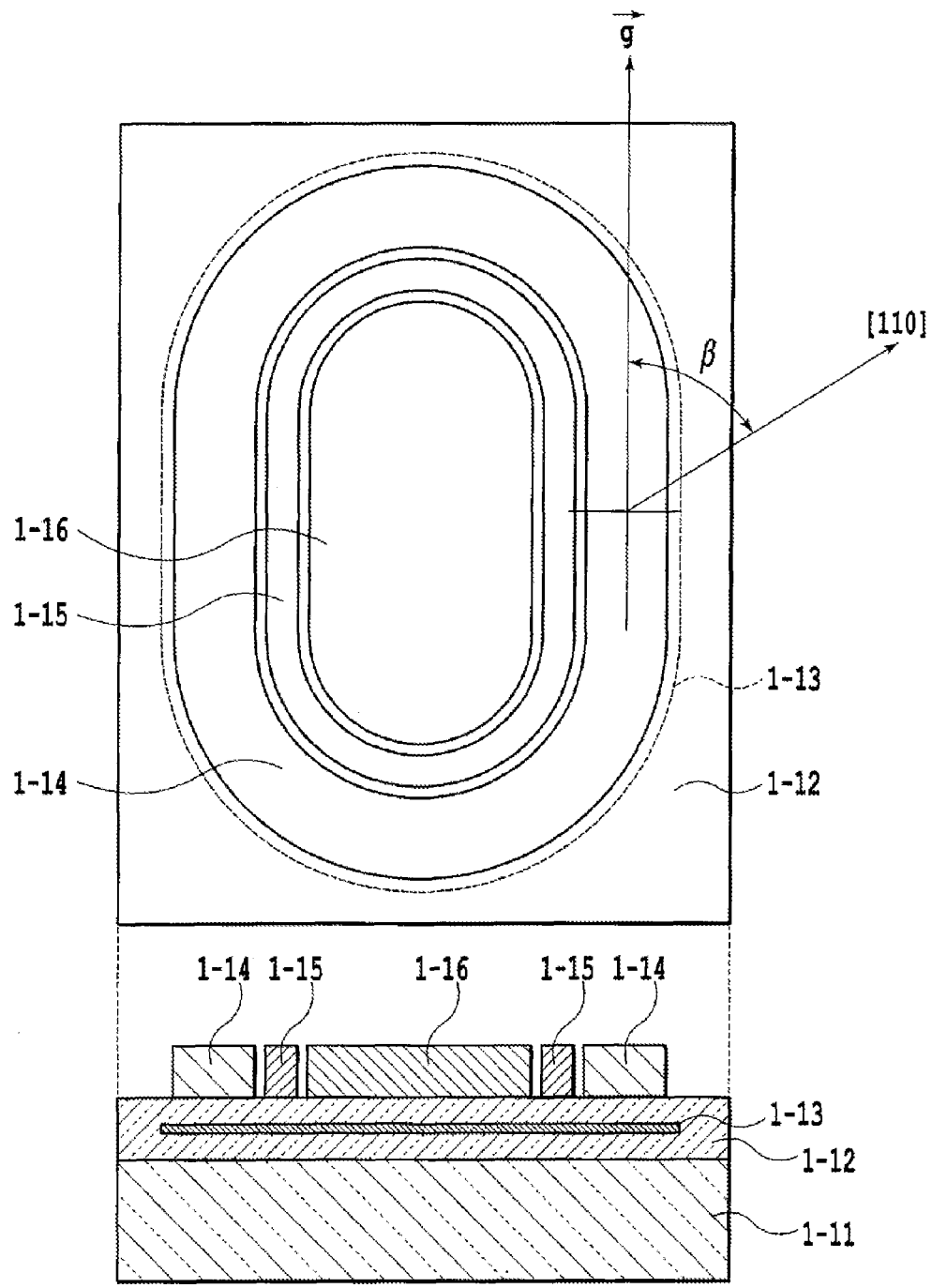
FIG. 2 is a diagram illustrating the structure of a diamond semiconductor element according to a second embodiment of the present invention.

FIG. 2 is a diagram illustrating the structure of a diamond semiconductor element according to embodiment 2 of the present invention. The structure of embodiment 2 is suitable for high power operation. In embodiment 2, a gate electrode is arranged in the form of a sport ground track. A single-crystal diamond thin-film 1-12 is formed on a single-crystal diamond substrate 1-11 and a two-dimensional hole or electron channel 1-13 is formed inside the single-crystal diamond thin-film. As shown in FIG. 2, the channel has an oval shape. Then, a source electrode 1-14, a gate electrode 1-15 and a drain electrode 1-16 are formed on the surface of the single-crystal diamond thin-film 1-12 above the channel 1-13. The gate electrode 1-15 and the source electrode 1-14 are arranged outward in order so as to encircle the periphery of the oval-shaped drain electrode 1-16 placed innermost.

FIG. 2 does not clearly show, but in embodiment 2, the surface orientations of the single-crystal diamond substrate 1-11, the single-crystal diamond thin-film 1-12 and the channel 1-13 are also set respectively at αs, αd, αc falling within the same range as in the case of embodiment 1. Each of the electrodes is placed such that in the linear area, except for the two arc portions corresponding to the two ends of the oval shape, the longitudinal direction of the gate electrode 1-15 is inclined β degrees from the crystal axis [110] direction. It is needless to say that the effect of increasing the transconductance is produced as in the case shown in FIG. 4.

As described above in detail, by shifting the surface orientation of the single-crystal diamond thin-film, the single-crystal diamond substrate or the channel-forming plane slightly from the [001] direction, it is possible to provide the effect peculiar to the present invention in which the occurrence of crystal defects peculiar to a diamond is significantly suppressed. Transconductance of a significantly large field-effect transistor is provided, resulting in the realization of a practically useful diamond semiconductor element.

Next, a diamond semiconductor element and a process for producing the diamond semiconductor element according to the present invention in order to attain the second object will be described in detail.

(Embodiment 3)

FIGS. 7A to 7J illustrate process-steps in producing a diamond semiconductor element according to an embodiment of the present invention. A thin-film 2-1, which is a diamond single-crystal and has a two-dimensional hole channel extending parallel to the surface, (hereinafter referred to as "diamond single-crystal thin-film 2-1") is prepared (FIG. 7A). Au is evaporated to a thickness of 0.1 μm onto the entire surface of the diamond single-crystal thin-film 2-1 to form an Au thin-film 2-2B (FIG. 7B). Then, the Au thin-film 2-2B is coated with a resist 2-3 with a width of 20 μm in the area in which a gate electrode will be provided (FIG. 7C), and from the above, an Au thin-film 2-2T is evaporated onto the entire surface of the sample (FIG. 7D). At this point, the thickness of the Au thin-film 2-2T is 0.4 μm.

Next, liftoff is performed on the resist 2-3 to remove the resist 2-3 and part of the Au thin-film 2-2T evaporated onto the resist 2-3 so as to form an aperture 2-7 in the Au thin-film 2-2T (FIG. 7E). For a successful liftoff of the resist 2-3, the distance in the direction vertical to the longitudinal direction of the resist 2-3 and in the direction parallel to the plane of the diamond single-crystal thin-film 2-1 is required to be longer than the thickness of the Au thin-film 2-2T in the direction vertical to the plane of the diamond single-crystal thin-film 2-1. Then, the full surface of the sample is coated with resist 2-4 (FIG. 7F). Exposure and development are performed on an area having a width of 0.05 μm, in which a gate electrode will be formed, within the area of the resist 2-4 in contact with the Au thin-film 2-2B, to remove part of the resist 2-4 and to form an aperture 2-8 in the Au thin-film 2-2B (FIG. 7G).

Then, an etching solution is used to etch the part of the Au thin-film 2-2B exposed by the aperture 2-8 (FIG. 7H). Because etching takes place in an isotropic manner, the area of the Au thin-film 2-2B under the resist 2-4 is also etched to produce an undercut. The etching is terminated before reaching the Au thin-film 2-2T.

Next, Al is evaporated onto the full surface of the sample (FIG. 7I). Part of the Al is evaporated onto the diamond single-crystal thin-film 2-1 from the aperture 2-8 in the Au thin-film 2-2B so as to form an Al thin-film 2-5G. On the other hand, the remaining major portion of the Al is evaporated onto the resist 2-4 so as to form an Al thin-film 2-5. Then, liftoff is performed on the resist 2-4 to remove the resist 2-4 and the Al thin-film 2-5 placed on the resist 2-4 (FIG. 7J).

Here, one of the Au thin-films 2-2B is defined as a lower source electrode 2-6SB, and the other is defined as a lower drain electrode 2-6DB. The Au thin-film 2-2T on the lower source electrode 2-6SB is defined as an upper source electrode 2-6ST, and the Au thin-film 2-2T on the lower drain electrode 2-6DB is defined as an upper drain electrode 2-6DT. It should be noted that this specification describes the lower source electrode and the upper source electrode as two separate ones, but the lower source electrode 2-6SB and the upper source electrode 2-6ST together function as a single source electrode in upper and lower combination. Thus the lower source electrode 2-6SB and the upper source electrode 2-6ST may be considered to constitute a single source electrode. Likewise, the lower drain electrode and the upper drain electrode may be considered to constitute a single drain electrode. Also, the Al thin-film 2-5G is defined as a gate electrode 2-7G.

In the diamond semiconductor element according to an embodiment of the present invention, the diamond single-crystal thin-film 2-1 may be of either single-crystal or polycrystal, and the channel formed in the diamond single-crystal thin-film 2-1 may be for either an electron or a hole.

Here, the gate length is defined as $d_G$. The lower source to gate distance between the end of the lower source electrode 2-6SB in contact with the surface of the diamond single-crystal thin-film 2-1 and the end of the gate electrode 2-7G close to the source is defined as $d_{SGB}$. The gate to lower drain distance between the end of the lower drain electrode 2-6DB in contact with the surface of the diamond single-crystal thin-film 2-1 and the end of the gate electrode 2-7G close to the drain is defined as $d_{GDB}$. The upper source to gate distance between the end of the upper source electrode 2-6ST and the end of the gate electrode 2-7G close to the source is defined as $d_{SGT}$. The gate to upper drain distance between the end of the upper drain electrode 2-6DT and the end of the gate electrode 2-7G close to the drain is defined as $d_{GDT}$.

The thickness of the entire source electrode is defined as $t_S$, in which the thickness of the lower source electrode 2-6SB is defined as $t_{SB}$, and the thickness of the upper source electrode 2-6ST is defined as $t_{ST}$. The thickness of the entire drain electrode is defined as $t_D$, in which the thickness of the lower drain electrode 2-6DB is defined as $t_{DB}$, and the thickness of the upper drain electrode 2-6DT is defined as $t_{DT}$.

In this manner, the source electrode and the drain electrode are divided into a layer to be etched using an etching solution and a layer subject to liftoff using resist. As a result, the inverted mesa portion of the electrode is reduced in size. This makes it possible to shorten the distance between the source electrode and the gate electrode to increase the maximum oscillation frequency $f_{max}$, and also to increase the thickness of the source electrode and the drain electrode to bring the drop in voltage down to a small value.

In the embodiment, the source electrode and the drain electrode are each constituted of a metal film made up of two layers, the Au thin-film 2-2T which is an upper metal film and the Au thin-film 2-2B which is a lower metal film, but the source electrode and the drain electrode may be made up of a number of layers as long as a reduction in the thickness of the metal film in contact with the diamond single-crystal thin-film 2-1 is possible.

In the embodiment, the lower source electrode 2-6SB and the lower drain electrode 2-6DB have the ends close to the gate electrode 2-7G formed in an inverted mesa shape. However, a matter of importance for the present invention is to independently form the layer for "reducing the source-gate electrode distance and the gate-drain electrode distance", and the layer for "increasing the thickness of the source electrode and the thickness of the drain electrode". For this reason, the structure of the ends of the lower source electrode 2-6SB and the lower drain electrode 2-6DB closer to the gate electrode 2-7G is not limited to the inverted mesa structure.

Figure 8A:
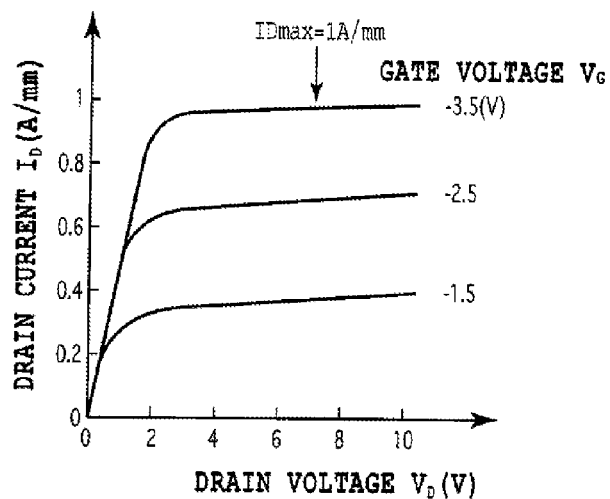
FIG. 8A is a graph showing the characteristics of a diamond field-effect transistor having a gate length of 0.2 μm using a diamond semiconductor element according to an embodiment of the present invention, which is a graph showing drain current-voltage characteristics.
Figure 8B:
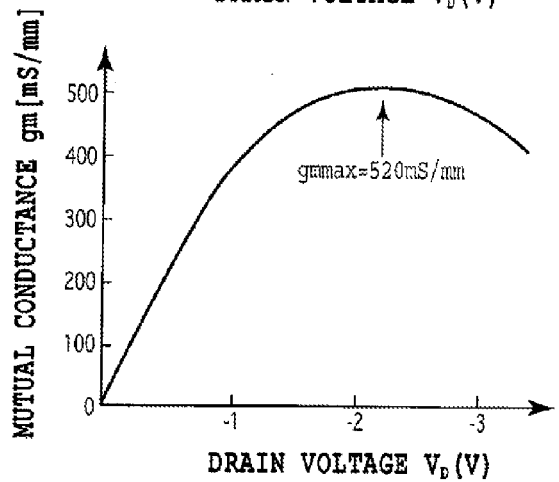
FIG. 8B is a graph showing the characteristics of a diamond field-effect transistor having a gate length of 0.2 μm using a diamond semiconductor element according to an embodiment of the present invention, which is a graph showing the dependence of the transconductance $g_m$ on the gate voltage $V_G$ (transfer characteristics).
Figure 8C:
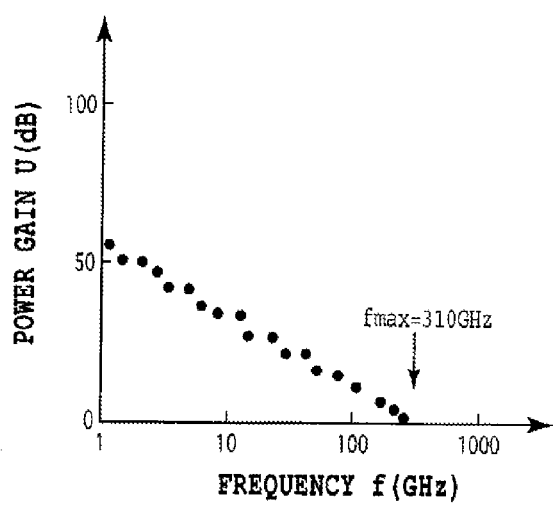
FIG. 8C is a graph showing the characteristics of a diamond field-effect transistor having a gate length of 0.2 μm using a diamond semiconductor element according to an embodiment of the present invention, which is a graph showing the dependence of the power gain U on the frequency f.

FIGS. 8A to 8C show the characteristics of a diamond field-effect transistor using the diamond semiconductor element according to an embodiment of the present invention. The diamond semiconductor element used here has the dimensions $d_G$=0.2 μm, $d_{SGB}$=$d_{GDB}$=0.1 μM, $d_{SGT}$=$d_{GDT}$=1 μm, $t_{SB}$=$t_{DB}$=0.05 μm, and $t_{ST}$=$t_{DT}$=10 μM.

FIG. 8A shows the drain current-voltage characteristics of the diamond field-effect transistor according to the embodiment. The maximum drain current $I_{Dmax}$ is 0.35 A/mm in a conventional type, but reaches 1 A/mm in the embodiment. FIG. 8B shows the dependence of the transconductance $g_m$ on the gate voltage $V_G$ (transfer characteristics) in the diamond field-effect transistor according to the embodiment. The maximum transconductance $g_{mmax}$ is 150 mS/mm in a conventional type, but reaches 520 mS/mm in the embodiment. FIG. 8C shows the dependence of the power gain U on the frequency f in the diamond field-effect transistor according to the embodiment. As shown in FIG. 8C, the maximum oscillation frequency $f_{max}$ is 81 GHz in a conventional type, but reaches 310 GHz in the embodiment.

In this manner, the diamond semiconductor element according to an embodiment of the present invention is greatly improved in the field-effect transistor characteristics as compared with that in a conventional diamond semiconductor element, and makes possible a diamond transistor with a practical level.

A change in characteristics caused by the dimensions of a diamond transistor according to an embodiment of the present invention is described in detail with reference to FIG. 7J. When the shape of the gate electrode 2-7G is the so-called T-type gate (also called mushroom-type gate) or the like, the distance of the portion of the gate electrode 2-7G making contact with the surface of the diamond single-crystal thin-film is defined as gate length $d_G$. In this case, the lower source-gate distance $d_{SGB}$ and the upper source-gate distance $d_{SGT}$ are respectively defined as the distance from the end of the gate electrode 2-7G which is closer to the source and makes contact with the surface of the diamond single-crystal thin-film 2-1, to the lower source electrode 2-6SB and the upper source electrode 2-6ST. The gate-lower drain distance $d_{GDB}$ and the gate-upper drain distance $d_{GDT}$ are respectively defined as the distance from the end of the gate electrode 2-7G which is closer to the drain and makes in contact with the surface of the diamond single-crystal thin-film 2-1, to the lower drain electrode 2-6DB and the upper drain electrode 2-6DT. The diamond semiconductor element used in FIGS. 9A, 9B to 12A and 12B is assumed to have the dimensions of $d_G$=0.2 μm, $d_{SGB}$=$d_{GDB}$=0.1 μm, $d_{SGT}$=10 μm, $d_{GDT}$=50 μm, $t_{SB}$=$t_{DB}$=0.05 μm, and $t_{ST}$=$t_{DT}$=10 μm, except for the dimensions of parts used as variables.

Figure 9A:
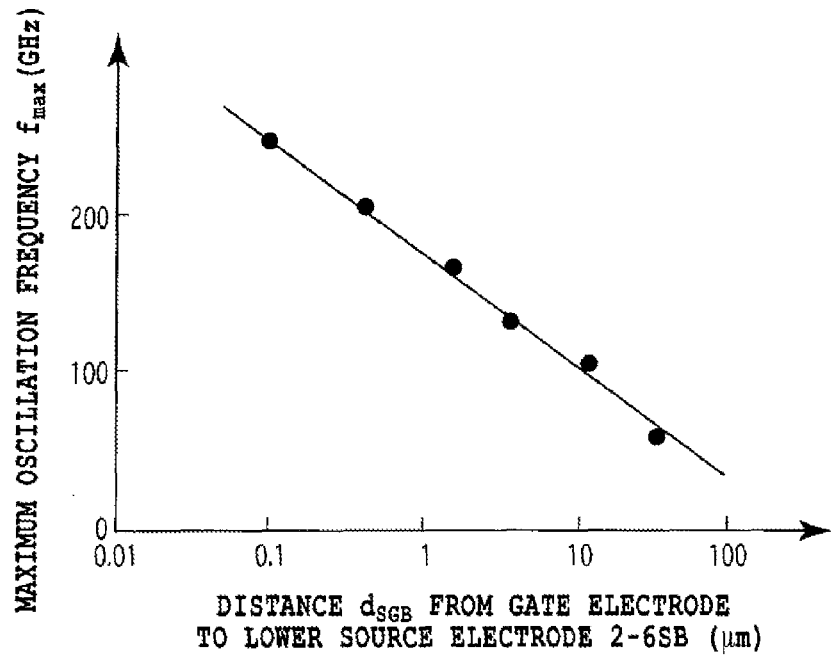
FIG. 9A is a graph showing the relationship between a lower source-gate distance $d_{SGB}$ and the maximum oscillation frequency $f_{max}$.

FIG. 9A shows the relationship between the lower source-gate distance $d_{SGB}$ and the maximum oscillation frequency $f_{max}$. With an increase in the $d_{SGB}$, the $f_{max}$ decreases, but when the $d_{SGB}$ increases from 0.1 μm to 10 μm, the decrease in $f_{max}$ is confined to from 250 GHz to 100 GHz, thus making it possible to provide satisfactory characteristics as compared with the case in the conventional structure where the $f_{max}$ is 81 GHz.

Figure 9B:
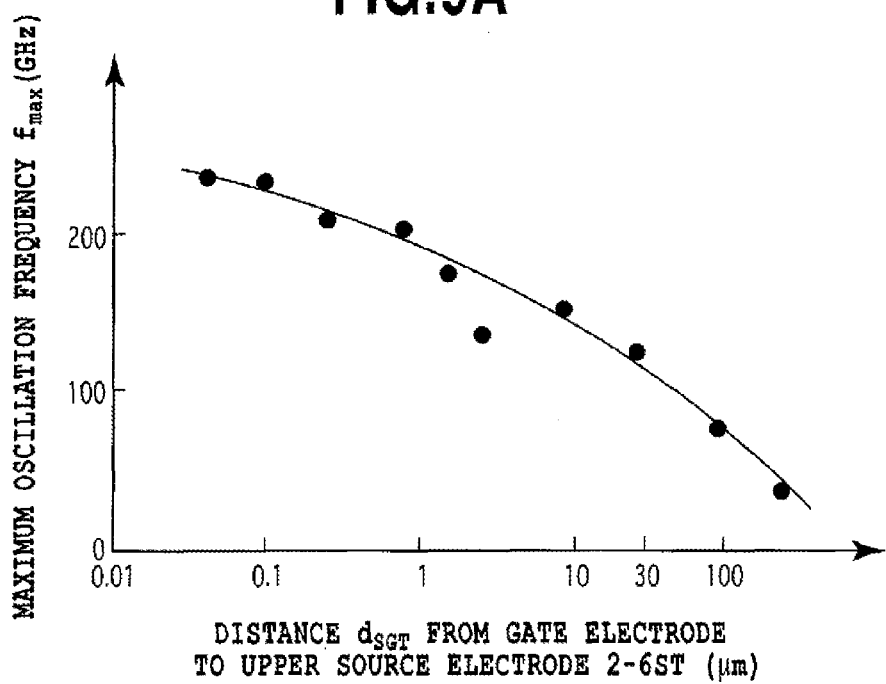
FIG. 9B is a graph showing the relationship between an upper source-gate distance $d_{SGT}$ and the maximum oscillation frequency $f_{max}$.

FIG. 9B shows the relationship between the upper source-gate distance $d_{SGT}$ and the maximum oscillation frequency $f_{max}$. With an increase in the $d_{SGT}$, the $f_{max}$ decreases, but when the $d_{SGB}$ increases from 0.07 μm to 30 μm, the decrease in the $f_{max}$ is confined to from 250 GHz to 120 GHz, thus making it possible to provide satisfactory characteristics as compared with the case in the conventional structure where the $f_{max}$ is 81 GHz.

Figure 10A:
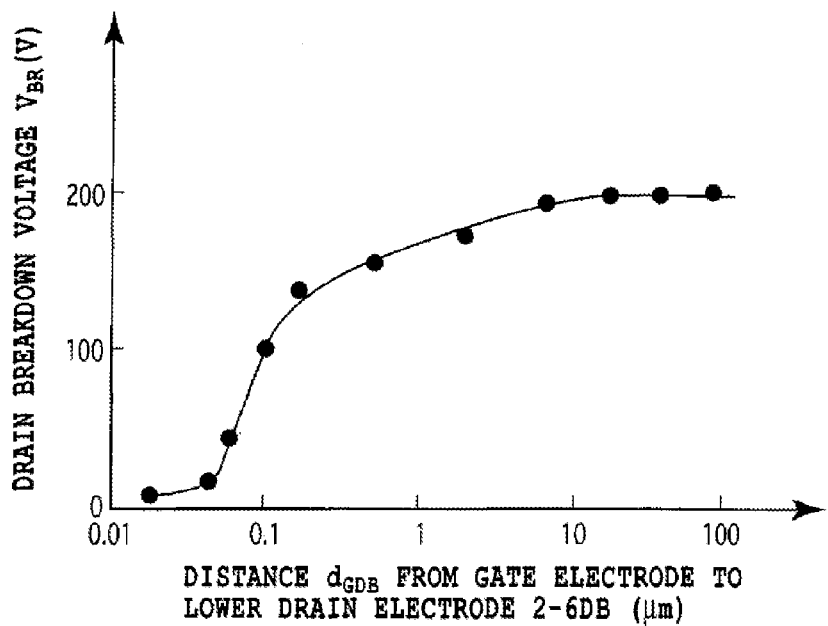
FIG. 10A is a graph showing the relationship between a gate-lower drain distance $d_{GDB}$ and the drain breakdown voltage $V_{BR}$.

FIG. 10A shows the relationship between the gate-lower drain distance $d_{GDB}$ and the drain breakdown voltage $V_{BR}$. With an increase in the $d_{GDB}$, the $V_{BR}$ increases, but the $V_{BR}$ sharply increases when the $d_{GDB}$ is in about from 0.05 μm to about 0.1 μm, and then the $V_{BR}$ becomes 100V or more when the $d_{GDB}$ is in a region of 0.1 μm or more, thus making it possible to provide satisfactory characteristics as compared with the case in the conventional structure where the $V_{BR}$ is 45V. However, when the $d_{GDB}$ exceeds 50 μm, the $f_{max}$ decreases.

Figure 10B:
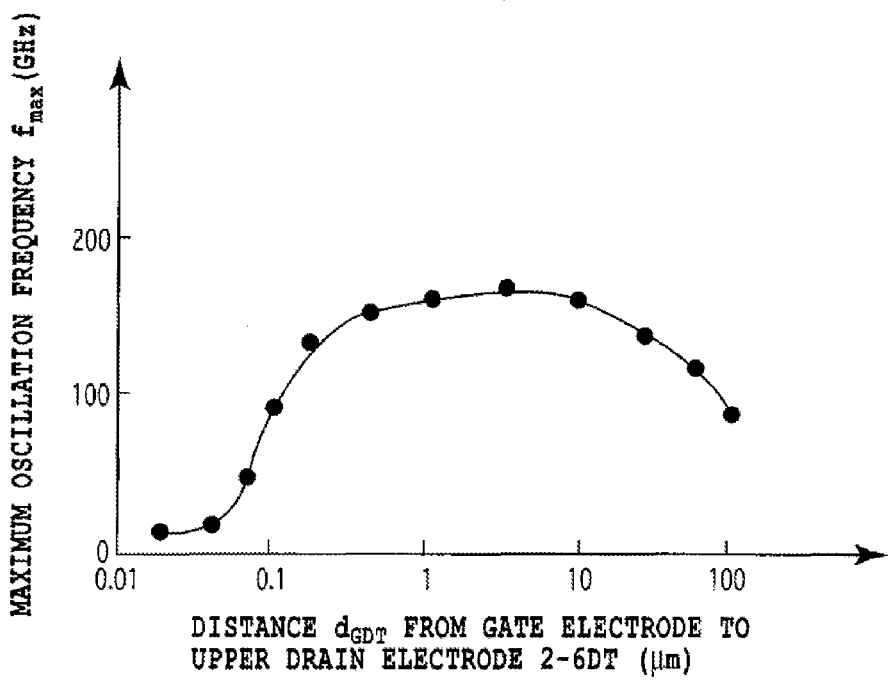
FIG. 10B is a graph showing the relationship between a gate-upper drain distance $d_{GDT}$ and the maximum oscillation frequency $f_{max}$.

FIG. 10B shows the relationship between the gate-upper drain distance $d_{GDT}$ and the maximum oscillation frequency $f_{max}$. With an increase in the $d_{GDT}$, the $f_{max}$ increases until the $d_{GDT}$ becomes 3 μm, but after the $d_{GDT}$ exceeds 3 μm, the $f_{max}$ decreases. In FIG. 10B, when the $d_{GDT}$ is 30 μm, the $f_{max}$ shows 140 GHz, thus making it possible to provide satisfactory characteristics as compared with the case in the conventional structure where the $f_{max}$ is 81 GHz.

Figure 11A:
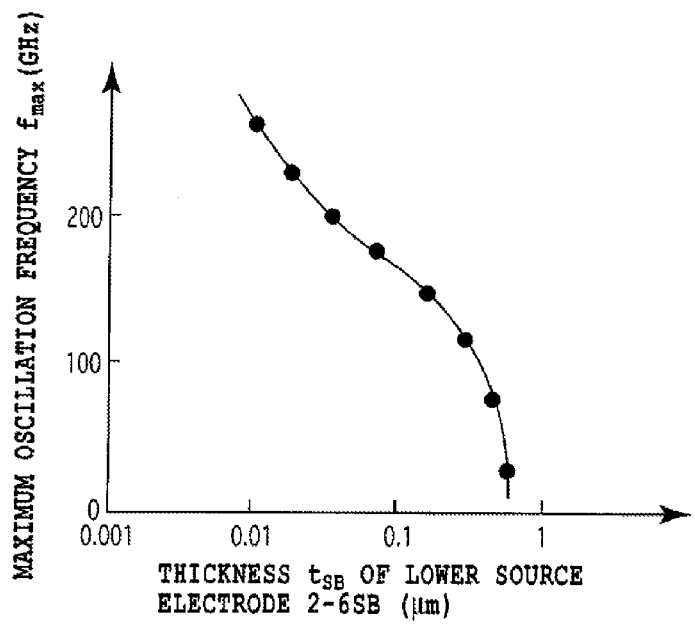
FIG. 11A is a graph showing the relationship between the thickness $t_{SB}$ of a lower source electrode 2-6SB and the maximum oscillation frequency $f_{max}$.

FIG. 11A shows the relationship between the thickness $t_{SB}$ of the lower source electrode 2-6SB and the maximum oscillation frequency $f_{max}$. With an increase in the $t_{SB}$, the $f_{max}$ decreases, but when the $t_{SB}$ increases from 0.01 μm to 0.2 μm, the decrease in the $f_{max}$ is confined to from 260 GHz to 130 GHz, thus making it possible to provide satisfactory characteristics as compared with the case in the conventional structure where the $f_{max}$ is 81 GHz.

Figure 11B:
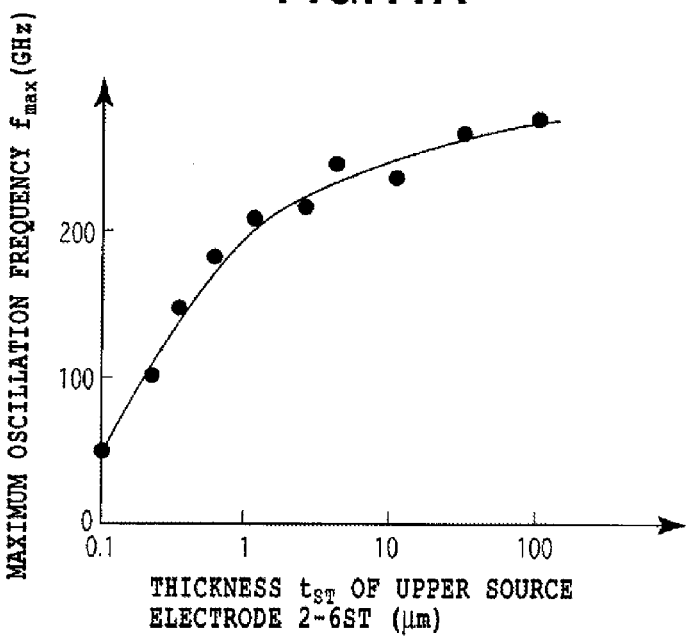
FIG. 11B is a graph showing the relationship between the thickness $t_{ST}$ of an upper source electrode 2-6ST and the maximum oscillation frequency $f_{max}$.

FIG. 11B shows the relationship between the thickness $t_{ST}$ of the upper source electrode 2-6ST and the maximum oscillation frequency $f_{max}$. With an increase in the $t_{ST}$, the $f_{max}$ also increases, but when the $t_{ST}$ is 0.2 μm, the $f_{max}$ is 100 GHz. When the $t_{ST}$ is 100 μm, the $f_{max}$ reaches 270 GHz. Thereby, it is possible to provide satisfactory characteristics as compared with the case in the conventional structure where the $f_{max}$ is 81 GHz.

Figure 12A:
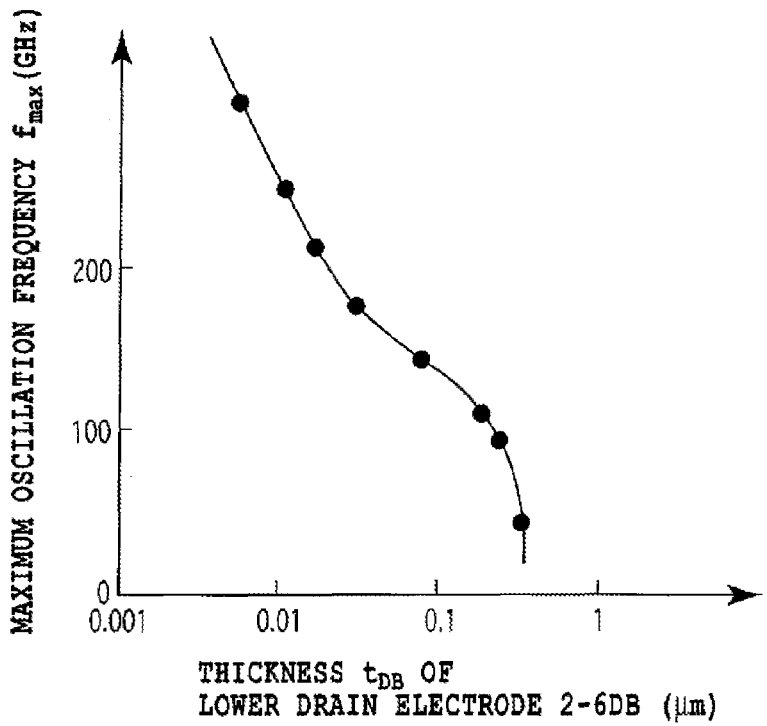
FIG. 12A is a graph showing the relationship between the thickness $t_{DB}$ of a lower drain electrode 2DB and the maximum oscillation frequency $f_{max}$.

FIG. 12A shows the relationship between the thickness $t_{DB}$ of the lower drain electrode 2-6DB and the maximum oscillation frequency $f_{max}$. With an increase in the $t_{DB}$, the $f_{max}$ decreases, but when the $t_{DB}$ increases from 0.01 μm to 0.2 μm, the decrease in the $f_{max}$ is confined to from 300 GHz to 100 GHz, thus making it possible to provide satisfactory characteristics as compared with the case in the conventional structure where the $f_{max}$ is 81 GHz.

Figure 12B:
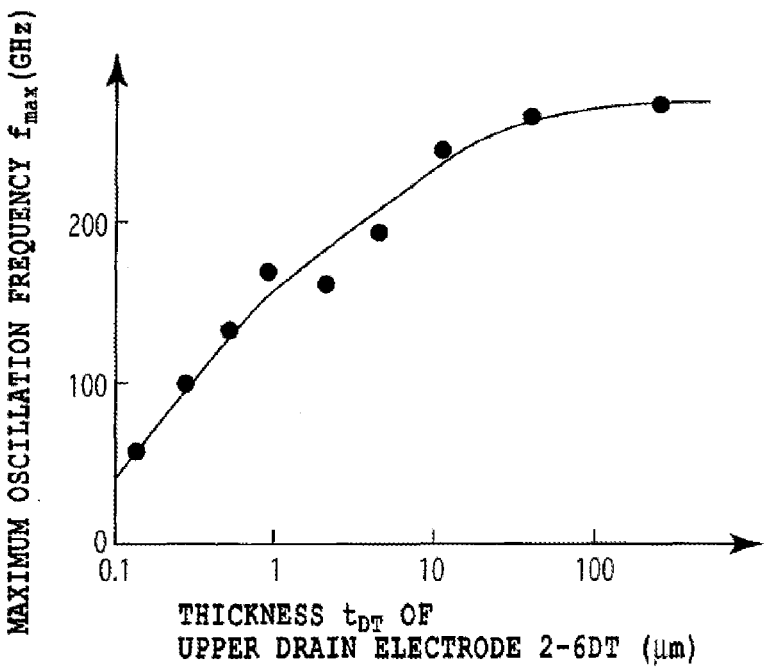
FIG. 12B is a graph showing the relationship between the thickness $t_{DT}$ of an upper drain electrode 2DB and the maximum oscillation frequency $f_{max}$.
Figure 13A:
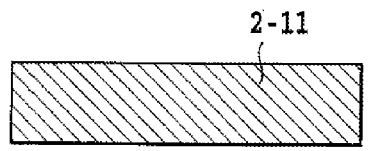
FIG. 13A is a diagram illustrating a process-step in producing a diamond semiconductor element according to conventional art.
Figure 13B:
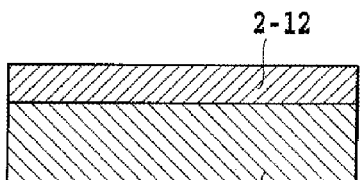
FIG. 13B is a diagram illustrating a process-step in producing a diamond semiconductor element according to conventional art.
Figure 13C:
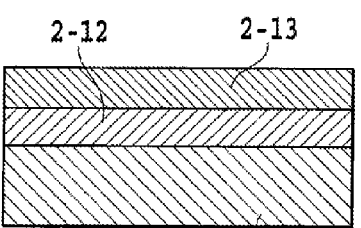
FIG. 13C is a diagram illustrating a process-step in producing a diamond semiconductor element according to conventional art.
Figure 13D:
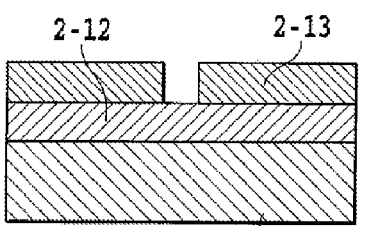
FIG. 13D is a diagram illustrating a process-step in producing a diamond semiconductor element according to conventional art.
Figure 13E:
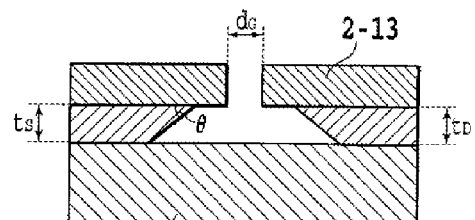
FIG. 13E is a diagram illustrating a process-step in producing a diamond semiconductor element according to conventional art.
Figure 13F:
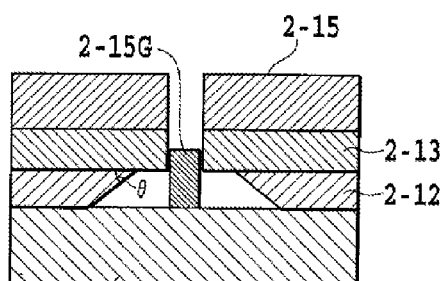
FIG. 13F is a diagram illustrating a process-step in producing a diamond semiconductor element according to conventional art.
Figure 13G:
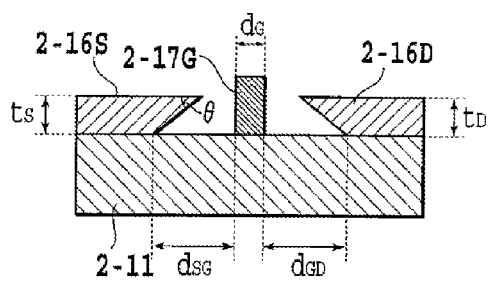
FIG. 13G is a diagram illustrating a process-step in producing a diamond semiconductor element according to conventional art.
Figure 14A:
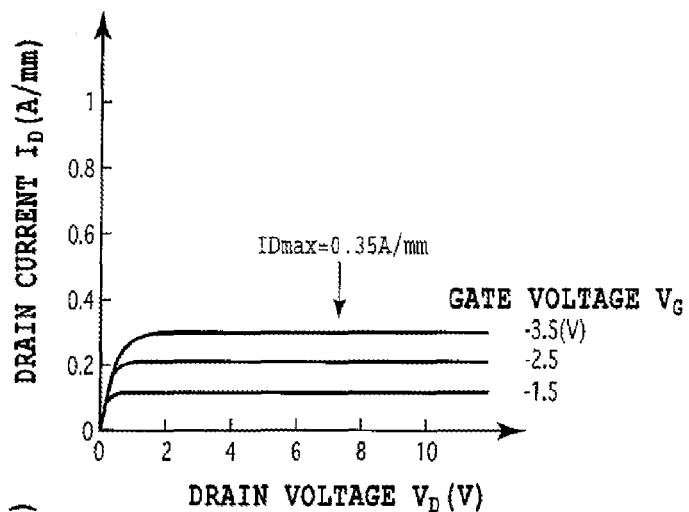
FIG. 14A is a graph showing the drain current-voltage characteristics which are characteristics of a transistor using a diamond semiconductor element according to conventional art.
Figure 14B:
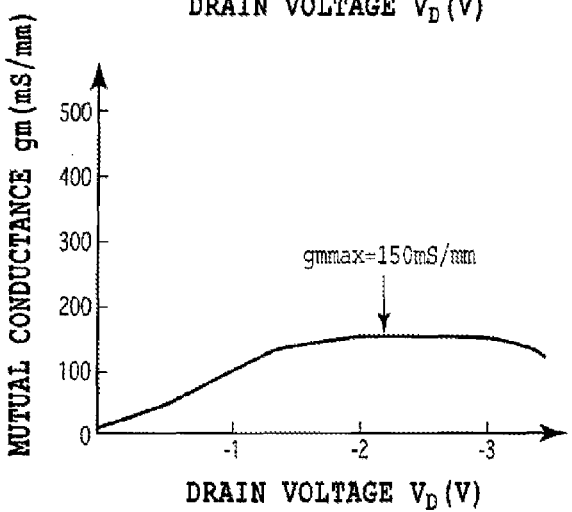
FIG. 14B is a graph showing the dependence of the transconductance $g_m$ on the gate voltage $V_G$ (transfer characteristics) which is characteristics of a transistor using a diamond semiconductor element according to conventional art.
Figure 14C:
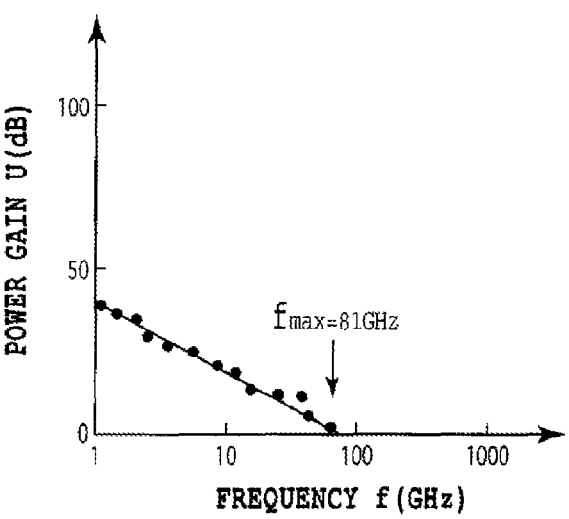
FIG. 14C is a graph showing characteristics of a transistor using a diamond semiconductor element according to conventional art, which shows the dependence of the power gain U on the frequency f.

FIG. 12B shows the relationship between the thickness $t_{DT}$ of the upper drain electrode 2-6DT and the maximum oscillation frequency $f_{max}$. With an increase in the $t_{DT}$, the $f_{max}$ increases, but when the $t_{DT}$ is 0.2 μm, the $f_{max}$ is 100 GHz, and when the $t_{DT}$ is 100 μm, the $f_{max}$ reaches 280 GHz. Thereby, it is possible to provide satisfactory characteristics as compared with the case in the conventional structure where the $f_{max}$ is 81 GHz.

Table 1 shows the maximum oscillation frequencies $f_{max}$ of a conventional diamond semiconductor element using Au as a material for a source electrode and a drain electrode, and of a diamond semiconductor element according to an embodiment of the present invention using an AuPt alloy as a material for the lower source electrode 2-6SB and the lower drain electrode 2-6DB. In this case, the material for the upper source electrode 2-6ST and the upper drain electrode 2-6DT is Au. The above diamond semiconductor element uses Au for the electrode material, but an AuPt alloy having a composition ratio Au:Pt=8:2 is used for the electrode material of the diamond semiconductor element according to an embodiment of the present invention, resulting in a dramatic increase in $f_{max}$ to 220 GHz.

TABLE 1

Electrode Material and Transistor Characteristics

| Electrode material | Maximum oscillation frequency (GHz) |
|---|---|
| Au (gold) conventional art | 81 |
| Au (gold) Pt (platinum) alloy | 220 |

Table 2 shows the maximum oscillation frequencies $f_{max}$ of a conventional diamond semiconductor element using Au as the material for the source electrode and the drain electrode, and of a diamond semiconductor element according to an embodiment of the present invention using an AuPt alloy, having a composition ratio Au:Pt=8:2, Pt, Pd, Ti, Mo, W as the material for the upper source electrode 2-6ST and the upper drain electrode 2-6DT. In this case, the material for the lower source electrode 2-6SB and the lower drain electrode 2-6DB is Au. The above diamond semiconductor element uses Au for the electrode material, but the electrode materials shown in Table 2 are used for the electrode material of the diamond semiconductor element according to an embodiment of the present invention, resulting in a dramatic increase in $f_{max}$.

TABLE 2

Electrode Material and Transistor Characteristics

| Electrode material | Maximum oscillation frequency (GHz) |
|---|---|
| Au (gold) conventional art | 81 |
| Au (gold) Pt (platinum) alloy | 112 |
| Pt (platinum) | 141 |
| Pd (palladium) | 185 |
| Ti (titanium) | 153 |
| Mo (molybdenum) | 159 |
| W (tungsten) | 143 |

In this manner, the lower source electrode 2-6SB and the lower drain electrode 2-6DB may be formed of a material different from that of the upper source electrode 2-6ST and the upper drain electrode 2-6DT.

Next, a process for producing a diamond thin-film according to the present invention in order to attain the third object will be described in detail.

An embodiment of the present invention has the key feature in that a diamond crystal thin-film is fired (annealed) at a sufficient temperature under high pressure under which a diamond is stable. A trial attempt for improving the crystallinity of a diamond crystal thin-film has been made using high-temperature annealing in a vacuum at 1000° C. or more (see non-patent document 5), but deterioration occurs in high-temperature vacuum annealing because a diamond is basically stable under an extremely high pressure of 1.5 Gpa or more. Hence, in an embodiment of the present invention, annealing is performed under high pressures under which a diamond is stable. Thereby, lattice defects included in a crystal, and the like are recovered or removed, thus enabling an enhancement in quality of the diamond crystal thin-film.

In this specification, "(a diamond is) stable or stably" means the condition in which the diamond maintains its diamond state without conversion to graphite. Specifically, "a diamond is stable" means a condition in which the diamond maintains its diamond state without conversion to graphite even when being subjected to annealing at high temperatures and high pressures. This is, for example, in the case of diamond of a single crystal, a condition in which a diamond single-crystal maintains its single-crystal state without conversion to graphite. Therefore, the diamond crystal thin-film is annealed under high pressures in such a manner as to allow the diamond to be in its stable state, thereby preventing or reducing the conversion of the diamond crystal thin-film to graphite.

Figure 21:
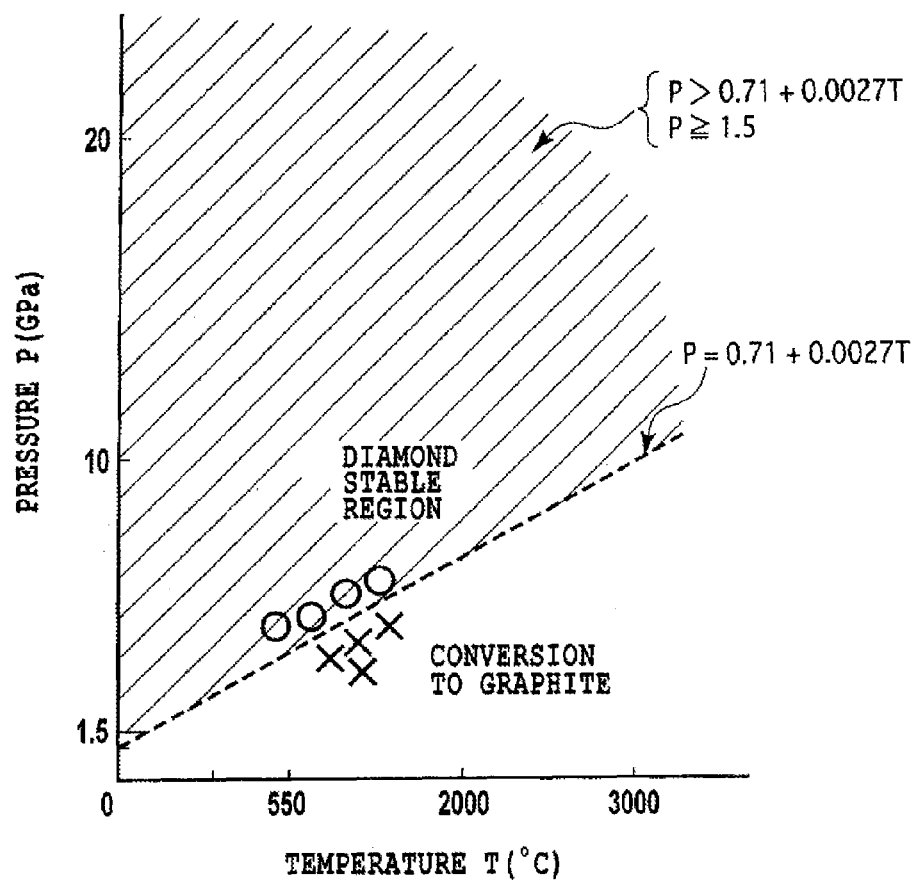
FIG. 21 is a graph showing the region in which diamond and graphite are in a stable state, according to an embodiment of the present invention.
Figure 22A:
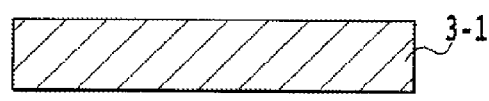
FIG. 22A is a diagram illustrating a process for producing a diamond thin-film according to a conventional method.
Figure 22B:
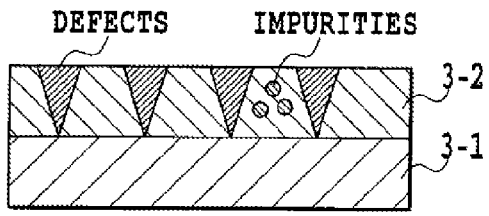
FIG. 22B is a diagram illustrating a process for producing a diamond thin-film according to a conventional method.

A temperature (also called annealing temperature) T for performing annealing and a pressure (also called annealing pressure) P for performing annealing are determined within a region in which a diamond can be stably annealed. This region satisfies P>0.71+0.0027T or P=0.71+0.0027T, which are shown in FIG. 21, and also is a region of P≧1.5 GPa. Such a region is the part marked with diagonal lines in FIG. 21. The relational expression P≧0.71+0.0027T is well known to persons skilled in the art. A more preferable temperature T is 550° C.

In FIG. 21, the symbol O and the symbol x indicate the conditions under which high-pressure and high-temperature annealing is performed on the diamond crystal thin-film. The symbol O represents the condition under which the diamond structure is still stable after the annealing, and the symbol x represents the condition under which the diamond substrate is converted to graphite after the annealing.

In an embodiment of the present invention, if the annealing temperature and the annealing pressure are set within the foregoing region, in other words, if the annealing temperature and the annealing pressure, under which a diamond is stable, are set, it is possible to reduce the deterioration of the diamond crystal thin-film. Even when a higher annealing temperature is set, by increasing the annealing pressure, the condition will fall within the foregoing region, thus making it possible to set a higher annealing temperature. Thus, a decrease in crystal defects becomes possible. In consequence, according to the embodiment of the present invention, it is possible to achieve an improvement in quality of the diamond crystal thin-film.

A diamond crystal thin-film is formed on a diamond single-crystal substrate by use of a microwave plasma CVD apparatus or the like, and then the diamond single-crystal substrate with the diamond crystal thin-film formed thereon is placed in an ultra-high-pressure and high-temperature firing furnace for performing the above-described annealing.

Two diamond single-crystal substrates with the above-described diamond crystal thin-films formed thereon are prepared, then the two substrates are superimposed each other such that the surfaces of the respective diamond crystal thin-films (the face of each diamond crystal thin-film opposite to the interface between the diamond single-crystal substrate and the diamond crystal thin-film formed thereon) are in contact with each other, and then annealing may be performed. It should be note that the two substrates may be superimposed such that at least parts of the surfaces of the two diamond crystal thin-films are in contact with each other. By such superimposition, the area of the surface of the diamond crystal thin-film exposed to air during the annealing disappears or is reduced, thus making it possible to lessen the effects of oxygen, nitrogen and moisture vapor in the air. Also, the periphery of the sample is surrounded by NaCl and the like during the annealing because pressure is applied thereto, but the above superimposition makes it possible to lessen the adhesion of NaCl and the like to the surface of the diamond crystal thin-film during the annealing.

In this manner, by superimposing the substrates such that the surfaces of the two diamond crystal thin-films face inward toward each other, each of the two diamond crystal thin-films can function as a protective member for the other diamond crystal thin-film. In other words, at least a part of the surface of one of the diamond crystal thin-films is in contact with at least a part of the surface of the other diamond crystal thin-film, whereby one diamond crystal thin-film overlies the contact area of the other. By performing the annealing on the substrates thus superimposed, while the two diamond crystal substrates mutually protect their surfaces, it is possible to perform the annealing simultaneously on the two substrates approximately in the same position, or alternatively it is possible to perform the annealing in a smaller space than the space required for annealing the two substrates individually. In consequence, because the space for performing the annealing can be reduced, it is possible to increase the number of substrates on which the annealing is performed at a time, thus making it possible to more efficiently produce high quality diamond crystal thin-films.

Further, a protective member such as an insulating thin-film, a metal thin-film or an alloy, may be formed on at least a part of the surface of the diamond crystal thin-film and then the annealing may be performed. Because at least a part of the surface of the diamond crystal thin-film is overlaid with the protective member in this manner and then the annealing is performed, it is possible to lessen the effects of oxygen, nitrogen and moisture vapor in the air during the annealing, as in the above-described case of superimposing the substrates each other. Also, it is possible to lessen the adhesion of NaCl and the like to the surface of the diamond crystal thin-film during the annealing.

It should be noted that, in this specification, the "protective member" is a member for lessening the effects of each component in the air, and of the materials such as NaCl and the like used for the application of pressure, on the surface of the diamond crystal thin-film. The protective member exerts its function by overlying or by being formed on at least a part of the surface of the diamond crystal thin-film. Specifically, the existence of the protective member on the diamond crystal thin-film makes it possible to prevent or lessen the contact and adhesion of the components of the air, such as oxygen, nitrogen and moisture vapor, and of materials such as NaCl used for the application of pressure, to the surface of the diamond crystal thin-film.

It should be noted that, in an embodiment of the present invention, the substrate on which the diamond crystal thin-film is formed is not limited to the diamond single-crystal substrate. For example, another substrate such as a diamond polycrystal substrate or a silicone substrate may be used.

Further, the diamond crystal thin-film formed on the substrate may be a diamond single-crystal thin-film or a diamond polycrystal thin-film.

A process for producing a diamond thin-film according to an embodiment of the present invention will be described below in detail on the basis of embodiment examples, but it goes without saying that the present invention is not limited to the embodiment examples, and many changes and variations can be made without departing from the scope of the present invention. For example, the diamond single-crystal thin-film may have any thickness, and is not limited to the values described in the following embodiment examples.

(Embodiment Example 1)

Figure 15A:
FIG. 15A is a diagram illustrating a process-step in producing a diamond thin-film according to embodiment example 1 of the present invention.
Figure 15B:
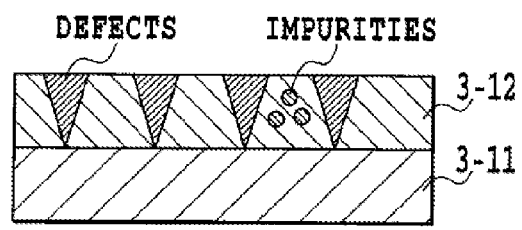
FIG. 15B is a diagram illustrating a process-step in producing a diamond thin-film according to embodiment example 1 of the present invention.

A process for producing a diamond thin-film according to embodiment example 1 of the present invention will be described using FIGS. 15A to 15D. A diamond single-crystal substrate 3-11 having surface orientation (100) is prepared (FIG. 15A). Then, a microwave plasma CVD apparatus is used to deposit a diamond single-crystal thin-film 3-12 of about 1-5 μm thickness onto the diamond single-crystal substrate 3-11 at a substrate temperature of 700° C. by use of methane as a reaction gas (FIG. 15B). The diamond single-crystal thin-film formed in such a manner may possibly include defects and/or impurities. In the embodiment example, the microwave plasma CVD apparatus is used, but any growing technique may be used as long as it can form a diamond thin-film.

Figure 15C:
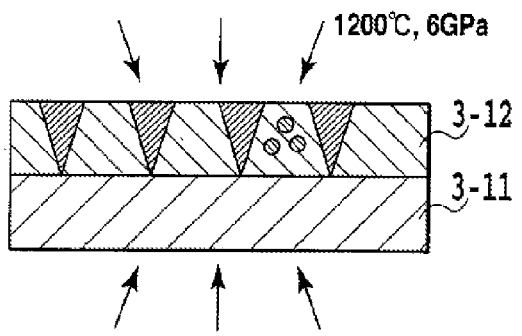
FIG. 15C is a diagram illustrating a process-step in producing a diamond thin-film according to embodiment example 1 of the present invention.
Figure 15D:
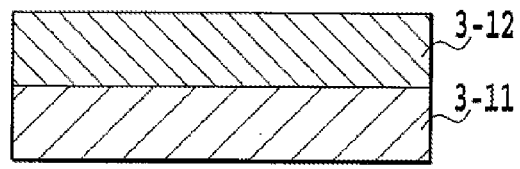
FIG. 15D is a diagram illustrating a process-step in producing a diamond thin-film according to embodiment example 1 of the present invention.

After that, the diamond single-crystal substrate 3-11 having the diamond single-crystal thin-film 3-12 formed thereon is placed in an ultra-high-pressure and high-temperature firing furnace to anneal the diamond single-crystal thin-film 3-12 under the conditions of 1200° C. and 6 GPa (FIG. 15C). A high-quality diamond crystal thin-film with decreased defects and impurities can be obtained by the annealing (FIG. 15D).

It should be noted that, in a preliminary experiment, a diamond single-crystal substrate having a diamond crystal thin-film formed thereon is annealed under conditions of various temperatures and pressures as shown in FIG. 21, in which the conditions of 1200° C. and 6 GPa is positioned in the region where a diamond can be stably annealed.

The holes in the diamond crystal thin-film are measured before and after the high-pressure and high-temperature annealing for a comparison of characteristics. In this connection, the mobility of the semiconductor which is obtained by the hole measurement is closely associated with the crystallinity, and the better the crystallinity, the more the mobility increases. In the embodiment example, some samples are produced under the same condition in order to reduce the variation between the samples, and the hole measurement is carried out to obtain an average value of the mobility (the average mobility).

As seen from Table 3, the average mobility of the yet-to-be-annealed sample (FIG. 15B), or the sample produced by a conventional process, at room temperature is about 800 cm$^2$/Vs. On the other hand, the average mobility of the sample subjected to the high-pressure and high-temperature annealing (FIG. 15D) is 1000 cm$^2$/Vs, resulting in an increase in the average mobility.

Figure 23A:
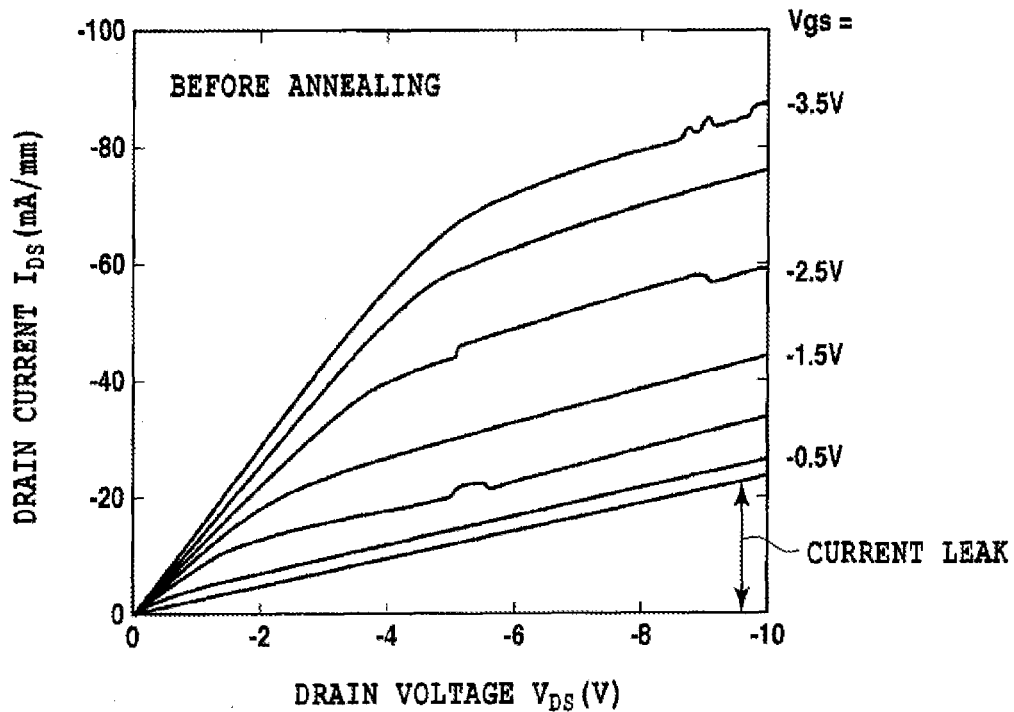
FIG. 23A is a graph for a comparison of the current-voltage characteristics of a field-effect transistor produced on a diamond single-crystal thin-film between before and after high-pressure and high-temperature annealing, according to embodiment example 1 of the present invention.
Figure 23B:
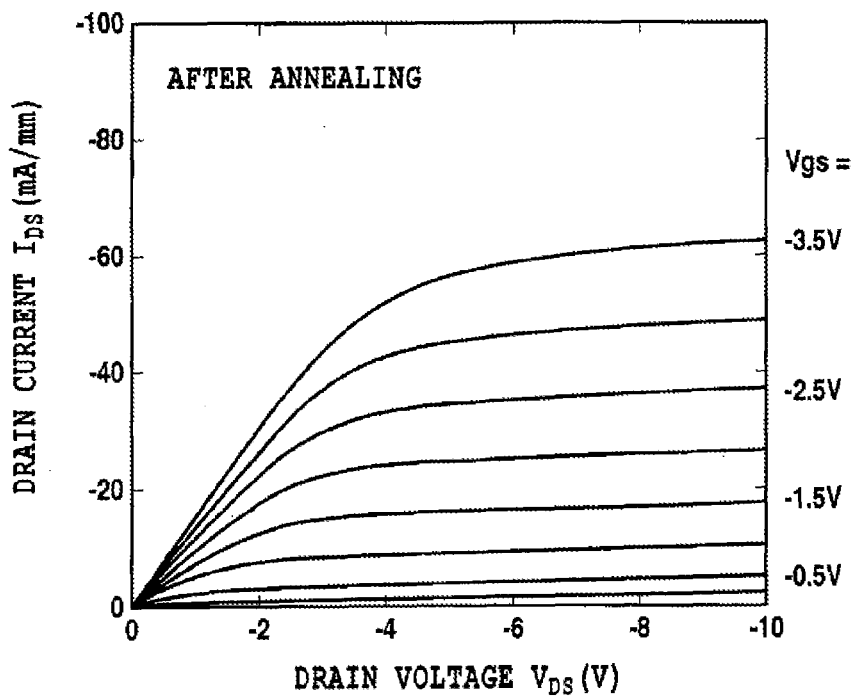
FIG. 23B is a graph for a comparison of the current-voltage characteristics of a field-effect transistor produced on a diamond single-crystal thin-film between before and after high-pressure and high-temperature annealing, according to embodiment example 1 of the present invention.

Further, the diamond crystal thin-films before and after the high-temperature and high-pressure annealing process are used to produce a field-effect transistor (FET), and current-voltage (Ids-Vds) measurement is conducted for a comparison of characteristics (FIG. 23). For this FET, gold is used as source and drain electrodes and aluminum is used as a gate electrode. The gate length is 5 μm and the gate width is 100 μm. The gate voltage is 0-3.5V and is measured in 0.5V steps.

As seen from FIG. 23, current leakage appearing before annealing is almost eliminated after annealing, resulting in an improvement in characteristics.

It is seen from these results that, by performing the high-pressure and high-temperature annealing on a diamond crystal thin-film formed on a substrate, the defects in the diamond crystal thin-film decrease and the diamond crystal thin-film is increased in quality. At this stage, because the annealing temperature and the annealing pressure are set such that a diamond is stable, it is possible to suppress deterioration of the diamond crystal thin-film. In addition, the annealing temperature can be increased as long as it falls within the region where the diamond can be annealed, thus achieving a further reduction in defects.

TABLE 3

|  | Average hole mobility at room temperature (cm$^2$/Vs) |
| --- | --- |
| Conventional art | 800 |
| Embodiment Example 1 | 1000 |
| Embodiment Example 2 | 1300 |
| Embodiment Example 3 | 1300 |
| Embodiment Example 4 | 1300 |
| Embodiment Example 5 | 1200 |
| Embodiment Example 6 | 1500 |

(Embodiment Example 2)

Figure 16A:
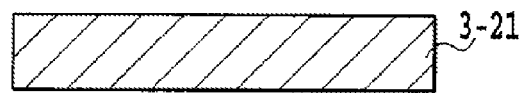
FIG. 16A is a diagram illustrating a process-step in producing a diamond thin-film according to embodiment example 2 of the present invention.
Figure 16B:
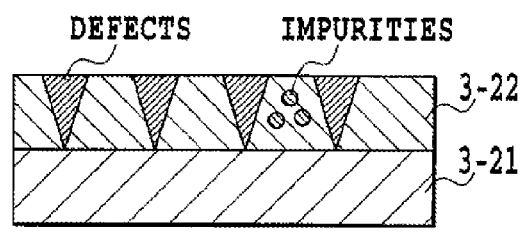
FIG. 16B is a diagram illustrating a process-step in producing a diamond thin-film according to embodiment example 2 of the present invention.

A process for producing a diamond thin-film according to embodiment example 2 of the present invention will be described using FIGS. 16A to 16D. A diamond single-crystal substrate 3-21 having surface orientation (100) is prepared (FIG. 16A). Then, a microwave plasma CVD apparatus is used to deposit a diamond single-crystal thin-film 3-22 of about 1 μm to about 5 μm thickness onto the diamond single-crystal substrate 3-21 at a substrate temperature of 700° C. by use of methane as a reaction gas (FIG. 16B). The diamond single-crystal thin-film thus formed may possibly include defects and/or impurities. In the embodiment example, two diamond single-crystal substrates 3-21 having the diamond single-crystal thin-films 3-22 formed as described above are prepared.

Figure 16C:
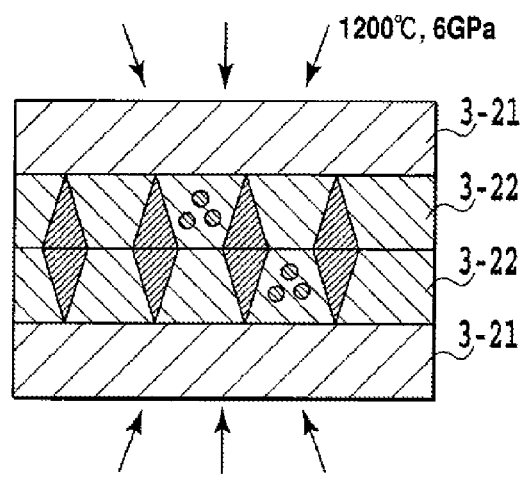
FIG. 16C is a diagram illustrating a process-step in producing a diamond thin-film according to embodiment example 2 of the present invention.

After that, the two substrates are superimposed each other such that, as illustrated in FIG. 16C, the surfaces of the respective diamond single-crystal thin-films 3-22 face inwardly, that is, such that the surfaces of the two diamond single-crystal thin-films 3-22 make contact with each other, and then the superimposed substrates are placed in an ultra-high-pressure and high-temperature firing furnace and then annealed under the conditions of 1200° C. and 6 GPa.

The above-described superimposition may be carried out by hand or alternatively by use of positioning means having means for picking up the substrate and putting it in position, and driving means for driving the means. In the case of using such positioning means, the driving means such as a motor is operated to pick up one of the diamond single-crystal substrate 3-21 and place it onto the other diamond single-crystal substrate 3-21 such that the surfaces of the two diamond single-crystal thin-films 3-22 are aligned in contact with each other.

In this manner, in the embodiment example, any means may be used as long as the substrates can be superimposed in such a manner as to make contact between the surfaces of the two diamond single-crystal thin-films 3-22.

Figure 16D:
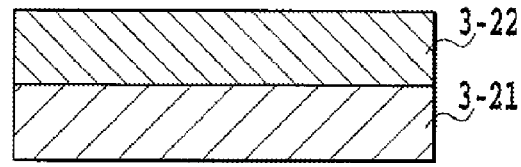
FIG. 16D is a diagram illustrating a process-step in producing a diamond thin-film according to embodiment example 2 of the present invention.

Upon the termination of the annealing, the two superimposed substrates are separated from each other, and high-quality diamond crystal thin-films reduced in defects and impurities through the above-described annealing are obtained (FIG. 16D).

Hole measurement is conducted on the diamond crystal thin-film before and after the high-pressure and high-temperature annealing for a comparison of characteristics. As seen from Table 3, the average mobility of the yet-to-be-annealed sample (FIG. 16B), or the sample produced by a conventional process, at room temperature is about 800 cm$^2$/Vs. On the other hand, the average mobility of the sample subjected to the high-pressure and high-temperature annealing (FIG. 16D) is 1300 cm$^2$/Vs, resulting in an increase in the average mobility. It is understood from these results that the defects in the diamond crystal thin-film are reduced by the high-pressure and high-temperature annealing, thus increasing the quality of the diamond thin-film. In addition, in the embodiment example, the surfaces of the diamond crystal thin-film are in contact with each other during the annealing process, which makes it possible to lessen the effects of oxygen, nitrogen, moisture vapor and the like in the air on the diamond crystal thin-film. Also, the above superimposition makes it possible to lessen the adhesion of NaCl, which is disposed around the substrate for the application of pressure, to the surface of the diamond crystal thin-film during the annealing.

It should be noted that the embodiment example has described the superimposition of the surfaces of the two diamond single-crystal thin-films 3-22 each other with their whole surfaces making contact with each other, but is not limited to this. What is important in the embodiment example is to lessen the effects of each component of the air, NaCl used for the application of pressure, and the like on the surface of the diamond single-crystal thin-film 3-22 during the annealing, and for this end, a matter of importance is that no part of the surface is exposed during the annealing. Thus, in an embodiment example of the invention, if the two substrates are superimposed such that at least parts of the surfaces of the two diamond crystal thin-films make at least partial contact with each other, the foregoing effects are lessened.

In this manner, in the embodiment example, what is required is to reduce the exposed area of the surface of the diamond crystal thin-film in order to lessen the effects of each component of the air, NaCl used for the application of pressure, and the like on the surface of the diamond crystal thin-film during the annealing. Hence, the procedure for this is not limited to the superimposition of the two diamond crystal thin-films such that their surfaces face inward. For example, annealing may be performed by placing a diamond crystal substrate or oxides, nitrides, metal, alloy or the like, described in embodiment examples 3 and 4, as a protective member on at least a part of the diamond crystal thin-film, so as to overlie at least the part with the protective member.

(Embodiment Example 3)

Figure 17A:
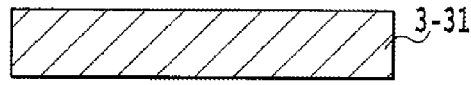
FIG. 17A is a diagram illustrating a process-step in producing a diamond thin-film according to embodiment example 3 of the present invention.
Figure 17B:
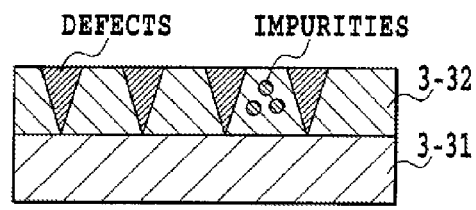
FIG. 17B is a diagram illustrating a process-step in producing a diamond thin-film according to embodiment example 3 of the present invention.

A process for producing a diamond thin-film according to embodiment example 3 of the present invention will be described using FIGS. 17A to 17F. A diamond single-crystal substrate 3-31 having surface orientation (100) is prepared (FIG. 17A). Then, a microwave plasma CVD apparatus is used to deposit a diamond single-crystal thin-film 3-32 of about 1 μm to about 5 μm thickness onto the diamond single-crystal substrate 3-31 at a substrate temperature 700° C. by use of methane as a reaction gas (FIG. 17B). The diamond single-crystal thin-film thus formed may possibly include defects and/or impurities.

Figure 17C:
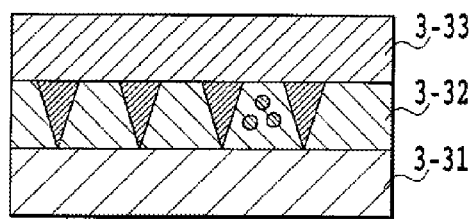
FIG. 17C is a diagram illustrating a process-step in producing a diamond thin-film according to embodiment example 3 of the present invention.

After that, a protective film 3-33 as the protective member is formed on the diamond single-crystal thin-film 3-32 as illustrated in FIG. 17C. The protective film 3-33 may be formed of various metallic compounds having a film-thickness of about 0.5 μm. Examples of the material for the protective film 3-33 include, but are not limited to, silicon monoxide ($SiO_x$), silicon nitride ($SiN_x$), aluminum oxide ($AlO_x$) and the like. These silicon monoxide, silicon nitride, aluminum oxide may be formed by an ECR sputtering technique.

Figure 17D:
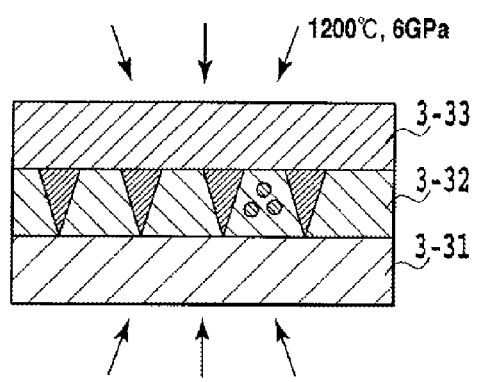
FIG. 17D is a diagram illustrating a process-step in producing a diamond thin-film according to embodiment example 3 of the present invention.
Figure 17E:
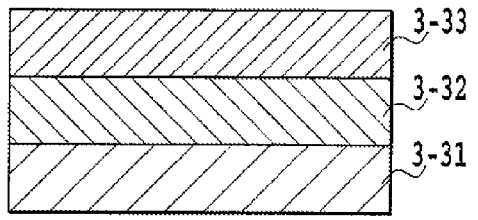
FIG. 17E is a diagram illustrating a process-step in producing a diamond thin-film according to embodiment example 3 of the present invention.
Figure 17F:
FIG. 17F is a diagram illustrating a process-step in producing a diamond thin-film according to embodiment example 3 of the present invention.

Next, the diamond single-crystal substrate 3-31 with the protective film 3-33 and the diamond single-crystal thin-film 3-32 formed thereon is placed in an ultra-high-pressure and high-temperature firing furnace, to anneal the diamond single-crystal thin-film 3-32 under the conditions of 1200° C. and 6 GPa (FIG. 17D). By the annealing, a high-quality diamond crystal thin-film with reduced defects and impurities is obtained (FIG. 17E). Then, etching is performed for removing the protective film 3-33 (FIG. 17F).

Hole measurement is conducted on the diamond crystal thin-film before and after the high-pressure and high-temperature annealing for a comparison of the characteristics of the samples. As seen from Table 3, the average mobility of the yet-to-be-annealed sample (FIG. 17B), or of the sample produced by a conventional process, at room temperature is about 800 $cm^2$/Vs. On the other hand, the average mobility of the sample subjected to the high-pressure and high-temperature annealing (FIG. 17F) is 1300 $cm^2$/Vs regardless of the type of protective film, which is higher than that produced by the conventional process. It can be seen from these results that the defects in the diamond crystal thin-film are reduced by the high-pressure and high-temperature annealing, thus increasing the quality of the diamond crystal thin-film. In addition, in the embodiment example, because the protective film is formed on the diamond crystal thin-film, it is possible during the annealing to lessen the effects of nitrogen, oxygen, moisture vapor and the like in the air on the surface of the diamond crystal thin-film. Also, the aforementioned protective film makes it possible to lessen the adhesion of NaCl, which is disposed around the substrate for the application of pressure, to the surface of the diamond crystal thin-film during the annealing.

It should be noted that the embodiment example has described the formation of the protective film 3-33 on the full surface of the diamond single-crystal thin-film 3-32, but is not limited to this. What is important in the embodiment example is to lessen the effects of each component of the air, NaCl used for the application of pressure, and the like on the surface of the diamond single-crystal thin-film 3-32 during the annealing, and for this end, a matter of importance is that no part of the surface is exposed during the annealing. Thus, in an embodiment example of the invention, if a protective film is formed on at least a part of the diamond single-crystal thin-film, the foregoing effects can be lessened.

(Embodiment Example 4)

Figure 18A:
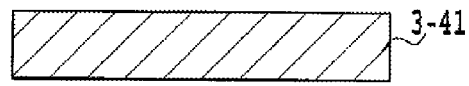
FIG. 18A is a diagram illustrating a process-step in producing a diamond thin-film according to embodiment example 4 of the present invention.
Figure 18B:
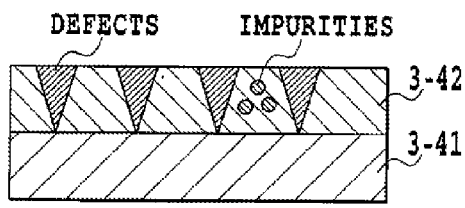
FIG. 18B is a diagram illustrating a process-step in producing a diamond thin-film according to embodiment example 4 of the present invention.

A process for producing a diamond thin-film according to embodiment example 4 of the present invention will be described using FIGS. 18A to 18F. A diamond single-crystal substrate 3-41 having surface orientation (100) is prepared (FIG. 18A). Then, a microwave plasma CVD apparatus is used to deposit a diamond single-crystal thin-film 3-42 of about 1 μm to about 5 μm thickness onto the diamond single-crystal substrate 3-41 at a substrate temperature 700° C. by use of methane as a reaction gas (FIG. 18B). The diamond single-crystal thin-film thus formed may possibly include defects and/or impurities.

Figure 18C:
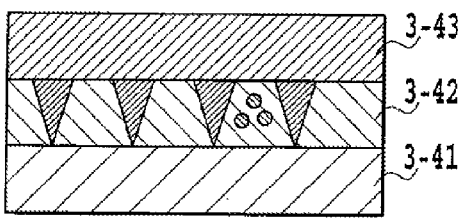
FIG. 18C is a diagram illustrating a process-step in producing a diamond thin-film according to embodiment example 4 of the present invention.

After that, a protective film 3-43 as a protective member is formed on the diamond single-crystal thin-film 3-42 as illustrated in FIG. 18C. As the protective film 3-43, various metallic films or alloy films having a film-thickness of about 0.5 μm may be used. Examples of the material for the protective film 3-43 include, but are not limited to, platinum (Pt), titanium (Ti), tungsten (W), palladium (Pd), molybdenum (Mo), a titanium-aluminum alloy (Ti65%-Al35%) and the like. These platinum, titanium, tungsten, palladium, molybdenum, titanium-aluminum alloy and the like may be formed by a vacuum evaporation technique.

A titanium-aluminum alloy is used as an alloy in the embodiment example, but the alloy may include a metal of at least one of Pt, Ti, W, Pd, and Mo.

Figure 18D:
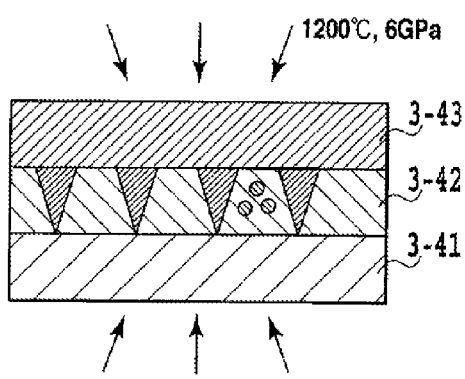
FIG. 18D is a diagram illustrating a process-step in producing a diamond thin-film according to embodiment example 4 of the present invention.
Figure 18E:
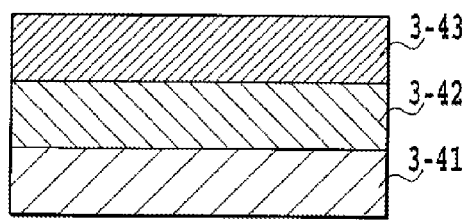
FIG. 18E is a diagram illustrating a process-step in producing a diamond thin-film according to embodiment example 4 of the present invention.
Figure 18F:
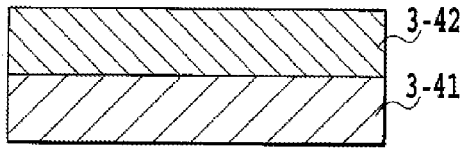
FIG. 18F is a diagram illustrating a process-step in producing a diamond thin-film according to embodiment example 4 of the present invention.

Next, the diamond single-crystal substrate 3-41 with the protective film 3-43 and the diamond single-crystal thin-film 3-42 formed thereon is placed in an ultra-high-pressure high temperature firing furnace, to anneal the above diamond single-crystal thin-film 3-42 under the conditions of 1200° C. and 6 GPa (FIG. 18D). By the annealing, a high-quality diamond crystal thin-film with reduced defects and impurities is obtained (FIG. 18E). Then, etching is performed for removing the protective film 3-43 (FIG. 18F).

Hole measurement is conducted on the diamond crystal thin-film before and after the high-pressure and high-temperature annealing for a comparison of the characteristics of the samples. As seen from Table 3, the average mobility of the yet-to-be-annealed sample (FIG. 18B), or of the sample produced by a conventional process, at room temperature is about 800 cm$^2$/Vs. On the other hand, the average mobility of the sample subjected to the high-pressure and high-temperature annealing (FIG. 18F) is 1300 cm$^2$/Vs regardless of the type of protective film, which is higher than that produced by the conventional process. It is understood from these results that the defects in the diamond crystal thin-film are reduced by the high-pressure and high-temperature annealing, thus increasing the quality of the diamond crystal thin-film. In addition, in the embodiment example, because the protective film is formed on the diamond crystal thin-film, it is possible during the annealing to lessen the effects of nitrogen, oxygen, moisture vapor and the like in the air on the surface of the diamond crystal thin-film. Also, the aforementioned protective film makes it possible to lessen the adhesion of NaCl, which is disposed around the substrate for the application of pressure, to the surface of the diamond crystal thin-film during the annealing.

(Embodiment Example 5)

Figure 19A:
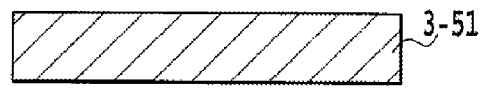
FIG. 19A is a diagram illustrating a process-step in producing a diamond thin-film according to embodiment example 5 of the present invention.
Figure 19B:
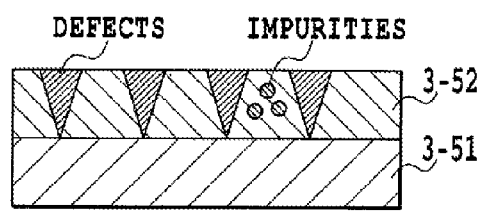
FIG. 19B is a diagram illustrating a process-step in producing a diamond thin-film according to embodiment example 5 of the present invention.

A process for producing a diamond thin-film according to embodiment example 5 of the present invention will be described using FIGS. 19A to 19D. A diamond single-crystal substrate 3-51 having surface orientation (111) is prepared (FIG. 19A). Then, a microwave plasma CVD apparatus is used to deposit a diamond single-crystal thin-film 3-52, having surface orientation (111), of about 1 μm to about 5 μm thickness onto the diamond single-crystal substrate 3-51 at a substrate temperature 700° C. by use of methane as a reaction gas (FIG. 19B). The diamond single-crystal thin-film thus formed may possibly include defects and/or impurities.

Figure 19C:
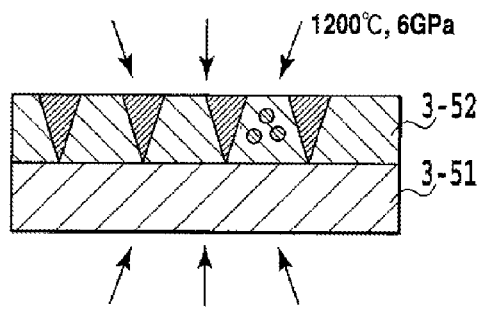
FIG. 19C is a diagram illustrating a process-step in producing a diamond thin-film according to embodiment example 5 of the present invention.
Figure 19D:
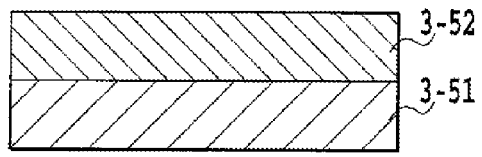
FIG. 19D is a diagram illustrating a process-step in producing a diamond thin-film according to embodiment example 5 of the present invention.

After that, the diamond single-crystal substrate 3-51 with the diamond single-crystal thin-film 3-52 formed thereon is placed in an ultra-high-pressure and high-temperature firing furnace, to anneal the above diamond single-crystal thin-film 3-52 under the conditions of 1200° C. and 6 GPa (FIG. 19C). By the annealing, a high-quality diamond crystal thin-film with reduced defects and impurities is obtained (FIG. 19D).

Hole measurement is conducted on the diamond crystal thin-film before and after the high-pressure and high-temperature annealing for a comparison of the characteristics of the samples. As seen from Table 3, the average mobility of the yet-to-be-annealed sample (FIG. 19B), or of the sample produced by a conventional process, at room temperature is about 800 cm$^2$/Vs. On the other hand, the average mobility of the sample subjected to the high-pressure and high-temperature annealing (FIG. 19D) is 1200 cm$^2$/Vs, resulting in an increase in the average mobility. It is understood from these results that the defects in the diamond crystal thin-film are reduced by the high-pressure and high-temperature annealing, thus increasing the quality of the diamond crystal thin-film.

(Embodiment Example 6)

Figure 20A:
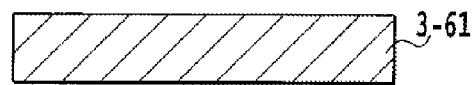
FIG. 20A is a diagram illustrating a process-step in producing a diamond thin-film according to embodiment example 6 of the present invention.
Figure 20B:
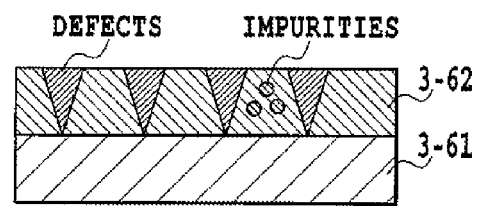
FIG. 20B is a diagram illustrating a process-step in producing a diamond thin-film according to embodiment example 6 of the present invention.

A process for producing a diamond thin-film according to embodiment example 6 of the present invention will be described using FIGS. 20A to 20D. A diamond single-crystal substrate 3-61 having surface orientation (100) is prepared (FIG. 20A). Then, a microwave plasma CVD apparatus is used to deposit a diamond single-crystal thin-film 3-62 of about 1 μm to about 5 μm thickness onto the diamond single-crystal substrate 3-61 at a substrate temperature 650° C. to 700° C. by use of methane as a reaction gas (gas concentration 0.5%) (FIG. 20B). In the embodiment example, because a substrate temperature (a temperature at which the substrate is heated when a diamond crystal thin-film is formed thereon), a flow rate of methane, and the like are controlled while the diamond crystal thin-film is growing, it is possible to obtain a diamond crystal thin-film having surface smoothness of 30 nm or less in a 1 μm$^2$ region in terms of average square roughness.

The conditions of controlling the substrate temperature and the flow rate of methane will be described below. That is, the substrate temperature is controlled to be a temperature of no less than 650° and no more than 700° C. Specifically, the substrate temperature is controlled to be no less than a growing temperature when a diamond crystal thin-film is formed and no more than a temperature of 700° C. The flow rate of methane is controlled such that the flow rate of methane divided by the flow rate of hydrogen, i.e., the ratio of the flow rate of methane to the flow rate of hydrogen (the ratio of the flow rate (sccm)), is greater than 0% and no more than 0.5%. Since the diamond crystal thin-film does not grow when the reaction gas comprises only hydrogen (the above ratio is 0%), the above ratio is required to be set greater than 0%. However, when the ratio exceeds 0% and is less than 0.1%, the growing speed is slower as compared with the case when the ratio is no less than 0.1% and no more than 0.5%. As a result, the ratio is preferably set no less than 0.1% and no more than 0.5%.

That is, in the embodiment example, by controlling at least one of controls of the substrate temperature and of the flow rate of methane, the surface evenness of the diamond crystal thin-film is able to be enhanced.

The diamond single-crystal thin-film thus formed may possibly include defects and/or impurities. In the embodiment example, two diamond single crystal substrates 3-61 with the diamond single-crystal thin-films 3-62 produced as described above are prepared.

Figure 20C:
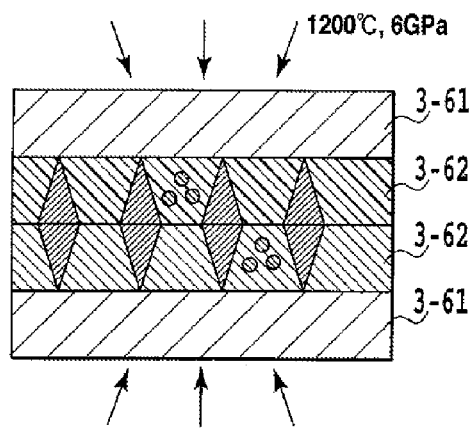
FIG. 20C is a diagram illustrating a process-step in producing a diamond thin-film according to embodiment example 6 of the present invention.
Figure 20D:
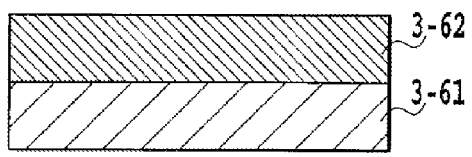
FIG. 20D is a diagram illustrating a process-step in producing a diamond thin-film according to embodiment example 6 of the present invention.

Then, the substrates are superimposed such that the two diamond single-crystal thin-film 3-62 face inward as illustrated in FIG. 20C, then the superimposed substrates are placed in an ultra-high-pressure and high-temperature firing furnace, and then annealing is carried out under the conditions of 1200° C. and 6 GPa. Upon the completion of the annealing, the two superimposed substrates are separated from each other, thus obtaining high-quality diamond crystal thin-films with reduced defects and impurities through the above-described annealing (FIG. 20D).

Hole measurement is conducted on the diamond crystal thin-film before and after the high-pressure and high-temperature annealing for a comparison of characteristics. As seen from Table 3, the average mobility of the yet-to-be-annealed sample (FIG. 20B), or the sample produced by a conventional process, at room temperature is about 800 cm$^2$/Vs. On the other hand, the average mobility of the sample subjected to the high-pressure and high-temperature annealing (FIG. 20D) is 1500 cm$^2$/Vs, resulting in an increase in the average mobility. It is understood from these results that the defects in the diamond crystal thin-film are reduced by the high-pressure and high-temperature annealing, thus increasing the quality of the diamond thin-film.

Next, a p-type diamond semiconductor and a process for producing the p-type diamond semiconductor according to the present invention in order to attain the fourth object will be described in detail.

In the present invention, for the purpose of simultaneous improvement in the hole concentration and the dopant atom concentration in the p-type diamond semiconductor, aluminum (Al), beryllium (Be), calcium (Ca), cadmium (Cd), gallium (Ga), indium (In), magnesium (Mg) or zinc (Zn), which have activation energy lower than that of B, is used as a p-type dopant element for diamond. As a result, the use of the p-type diamond in a part of the structure makes it possible to realize a semiconductor element for a MES-type and a MIS-type field-effect transistor (FET), a PNP-type and a NPN-type bipolar transistor, a semiconductor laser and a light-emitting diode, which functions even at 300K.

(Embodiment 4)

In a microwave plasma chemical vapor deposition technique, by using as a feedstock a gas mixture of a total flow rate of 300 ccm comprising a reaction gas including a methane gas ($CH_4$) at a flow ratio of 1%, a dopant gas and $H_2$ as the remainder, a diamond semiconductor film of the present invention is grown to 1.0 μm thickness on a diamond single-crystal of (001) surface orientation. The pressure in the reaction tube is 50 Torr and the microwave source has a frequency of 2.45 GHz and a power of 1.3 kW. Here, as the dopant gas, either trimethylaluminum (($CH_3)_3Al$: TMAl) or triethylaluminum (($C_2H_5)_3Al$: TEAl), which are organometallic materials including Al, is used. Alternatively, instead of the dopant gas, solid-state Al may be introduced into plasma and the varporized Al may be used as a dopant gas.

Hole measurement is made on the diamond semiconductor films thus obtained to evaluate the hole coefficient, whereby it can be confirmed that these diamond semiconductor films are p-type semiconductors.

Figure 24:
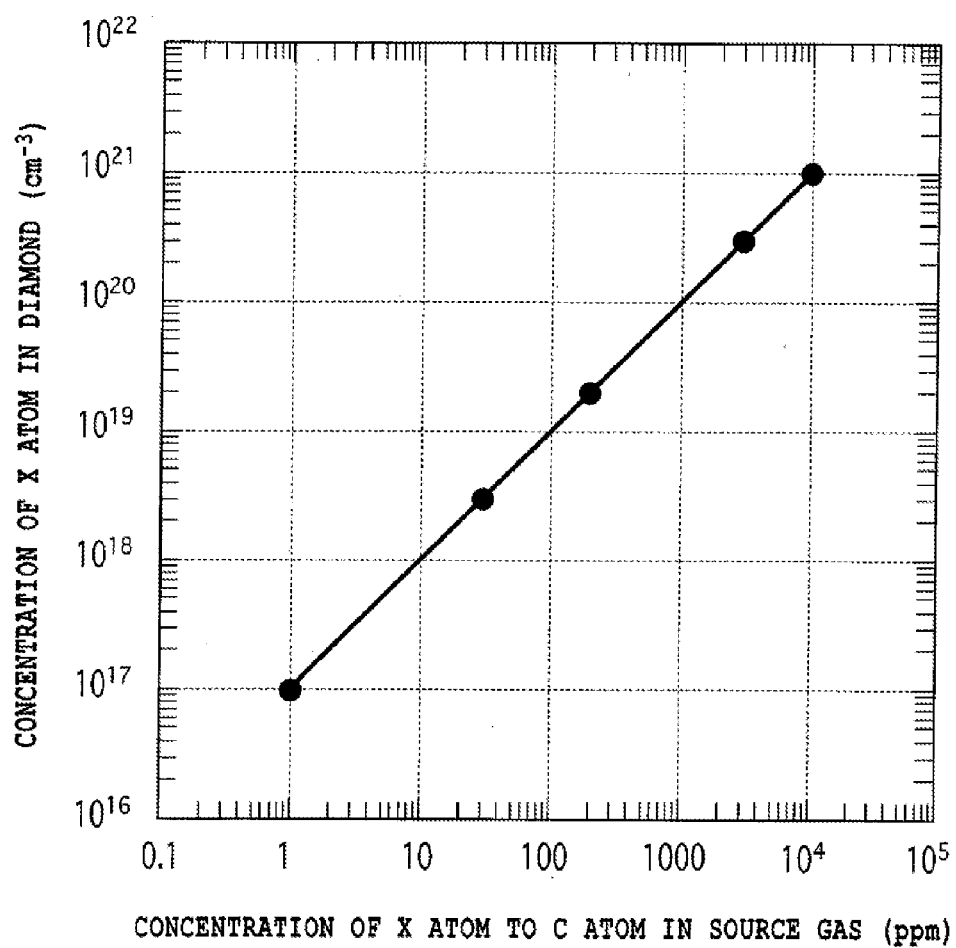
FIG. 24 is a graph showing the relationship between the concentration of dopant atoms in a source gas and the concentration of dopant atoms in a p-type diamond semiconductor, according to an embodiment of the present invention.

FIG. 24 shows the relationship between the concentration of dopant atoms in a source gas and the concentration of dopant atoms in a p-type diamond semiconductor, according to the embodiment of the present invention. By use of SIMS (Secondary Ion Mass Spectrometer) measurement, the concentration of Al atoms in the diamond semiconductor film is measured, and when the ratio of the number of Al atoms to the number of carbon (C) atoms in the source gas (Al/C)x (ppm) is represented by the horizontal axis and the concentration of AL atoms in the semiconductor film y ($cm^{-3}$) is represented by the vertical axis, the relationship is, as shown in FIG. 24, $$X(\text{ppm}) \times 10^{17} = y(\text{cm}^{-3}) \quad (1)$$

Figure 25:
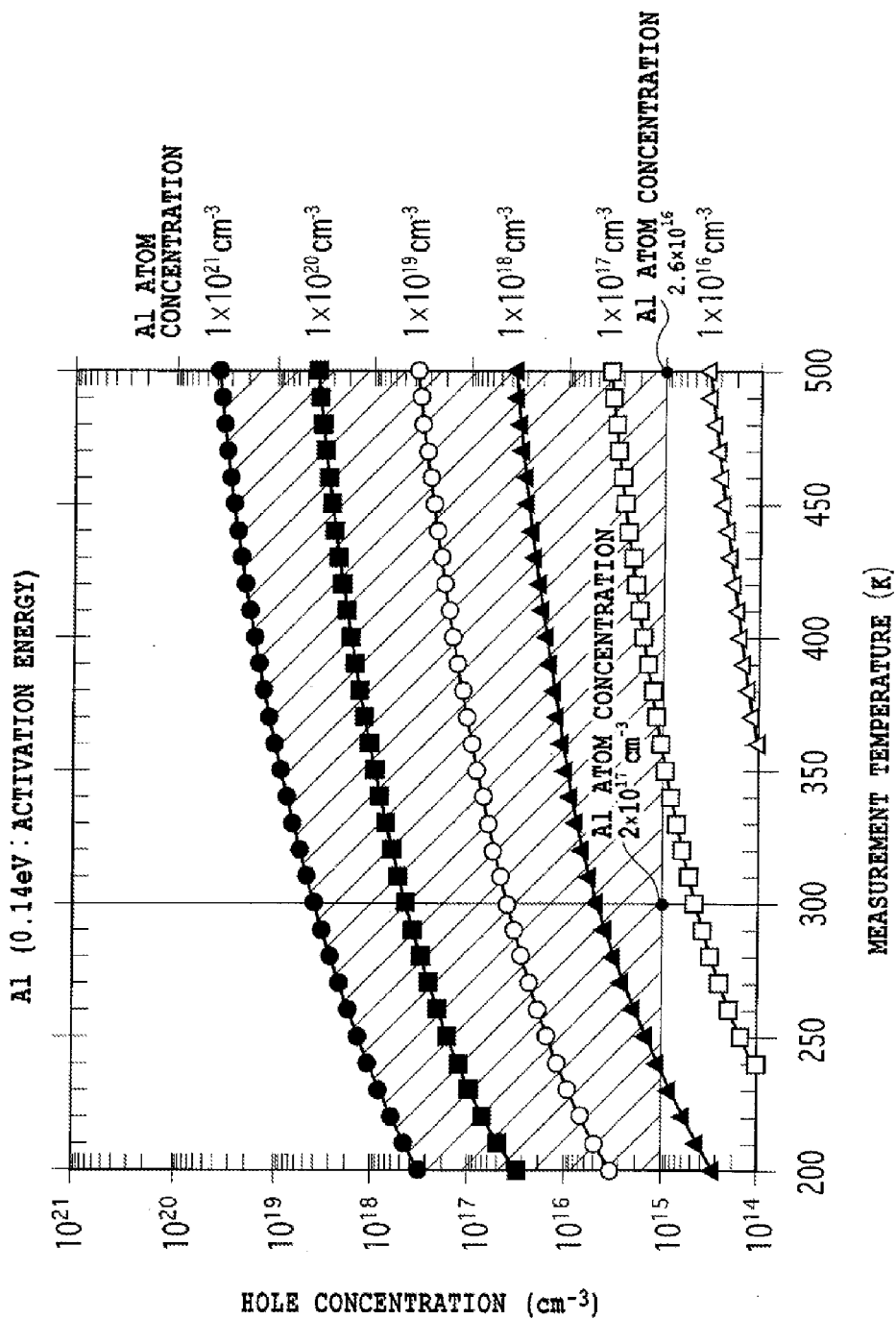
FIG. 25 is a graph showing temperature dependence of a hole concentration for each Al atom concentration in a p-type diamond semiconductor according to embodiment 4 of the present invention.

FIG. 25 shows the temperature dependence of a hole concentration for each Al atom concentration in a p-type diamond semiconductor according to embodiment 4 of the present invention. In FIG. 25 measurement temperature (K) is represented by the horizontal axis and the hole concentration ($cm^{-3}$) in the p-type diamond semiconductor is represented by the vertical axis, and the measured values for each Al atom concentration ($cm^{-3}$) in the p-type diamond semiconductor are plotted.

In order to obtain a hole concentration of $1.0 \times 10^{15}$ $cm^{-3}$ at 300K which is a practical level, an Al atom concentration of $2.0 \times 10^{17}$ $cm^{-3}$ or more is required. In the case of the Al atom concentration exceeding $1.0 \times 10^{21}$ $cm^{-3}$, it is known that deterioration in the quality of the diamond crystal occurs. Accordingly, the dopant atom concentration in the Al-doped p-type diamond semiconductor element at 300K which is a practical level is required to be no less than $2.0 \times 10^{17}$ $cm^{-3}$ and no more than $1.0 \times 10^{21}$ $cm^{-3}$.

It is seen from this that, using equation (1), the ratio (Al/C) of the number of Al atoms to the number of C atoms in the source gas is required to fall within a range of from no less than 2 ppm to no more than $10^4$ ppm.

Using FIG. 25 which is the plot of the values of the hole concentration in the p-type diamond semiconductor at each temperature for each concentration of the dopant atoms, a dopant atom concentration enabling the hole concentration in the p-type diamond semiconductor to reach $1.0 \times 10^{15}$ $cm^{-3}$ at each temperature can be found. For example, $2.6 \times 10^{16}$ $cm^{-3}$ is derived from FIG. 25 as an Al atom concentration enabling the hole concentration in the p-type diamond semiconductor to reach $1.0 \times 10^{15}$ $cm^{-3}$ at 500K. It is seen from equation (1) that the ratio (Al/C) of the number of Al atoms to the number of C atoms in the source gas in this case is required to fall within the range of from no less than 26 ppm to not more than $10^4$ ppm.

In the range of no more than $1.0 \times 10^{21}$ $cm^{-3}$, the higher the Al atom concentration in the p-type diamond semiconductor film, the higher the hole concentration that is obtained, resulting in, needless to say, a diamond semiconductor further suited to practical use.

Also, the requirement for functioning as a p-type semiconductor is that the hole concentration is no less than $1.0 \times 10^{15}$ $cm^{-3}$ and the dopant atom concentration is no more than $1.0 \times 10^{21}$ $cm^{-3}$. For this reason, the p-type diamond semiconductor according to embodiment 4 functions as a p-type semiconductor under the conditions of being included in the region enclosed by the line of the hole concentration $1.0 \times 10^{15}$ $cm^{-3}$ and the line of the Al atom concentration $1.0 \times 10^{21}$ $cm^{-3}$. For example, embodiment 4 can function as the p-type semiconductor even in any temperature other than 300K. The region in which the function as a p-type semiconductor is achieved in embodiment 4 is considerably wider than that in the case of a conventional p-type diamond semiconductor doped with B, resulting in superiority in function as a p-type semiconductor under various conditions.

Also, Table 4 shows the mobility, at 300K, of holes in each of the p-type diamond semiconductor films obtained when trimethylaluminum (($CH_3)_3Al$: TMAl), triethylaluminum (($C_2H_5)_3Al$: TEAl) or aluminium chloride ($AlCl_3$) of the present invention is used as a dopant gas.

TABLE 4

| (All in Al atom concentration of $1.0 \times 10^{19}$ $cm^{-3}$) | |
|---|---|
| Al dopant material | Hole mobility at room temperature ($cm^2$/Vs) |
| TMAl | 1500 |
| TEAl | 1400 |
| $AlCl_3$ | 200 |

As shown in Table 4, the hole mobility at room temperature in the case of using trimethylaluminum (($CH_3)_3Al$: TMAl) or triethylaluminum (($C_2H_5)_3Al$: TEAl) is about 7 times higher than that in the case of using aluminium chloride ($AlCl_3$), resulting in the diamond semiconductor having notably outstanding characteristics.

(Embodiment 5)

Be may be used as dopant and an ion implantation technique may be used to implant the Be dopant into a diamond single-crystal under the conditions of an acceleration voltage of 150 kV and a dose of $10^{15}$ $cm^{-2}$ to produce Be-impurity-doped diamond. As an alternative to the ion implantation technique, the Be-impurity-doped diamond may be produced by a microwave plasma chemical vapor deposition technique in which solid-state Be may be introduced into plasma and the vaporized Be is used as a dopant gas. In the microwave plasma chemical vapor deposition technique, by using as a feedstock a reaction gas of a total flow rate of 300 ccm comprising a methane gas ($CH_4$) at a flow ratio of 1%, solid-state Be, and $H^2$ as the remainder, a diamond semiconductor film of the present invention is grown to 1.0 μm thickness on a diamond single-crystal of (001) surface orientation. Here, the pressure in the reaction tube is 50 Torr and the microwave source has a frequency of 2.45 GHz and a power of 1.3 kW.

Then, annealing is performed on the Be-impurity-doped diamond thus obtained. Hole measurement is conducted on the Be-doped diamond semiconductor film of the present invention thus obtained to evaluate the hole coefficient, whereby it can be confirmed that this diamond semiconductor film is a p-type semiconductor.

By use of SIMS measurement, the Be atom concentration y in the diamond semiconductor film is measured, and when the ratio of the number of Be atoms to the number of C atoms in the source gas (Be/C)x (ppm) is represented by the horizontal axis and the concentration of Be atoms in the semiconductor film y (cm$^{-3}$) is represented by the vertical axis, the relationship is, as shown in FIG. 24, $$X(\text{ppm}) \times 10^{17} = y(\text{cm}^{-3}) \qquad (1)$$

Figure 26:
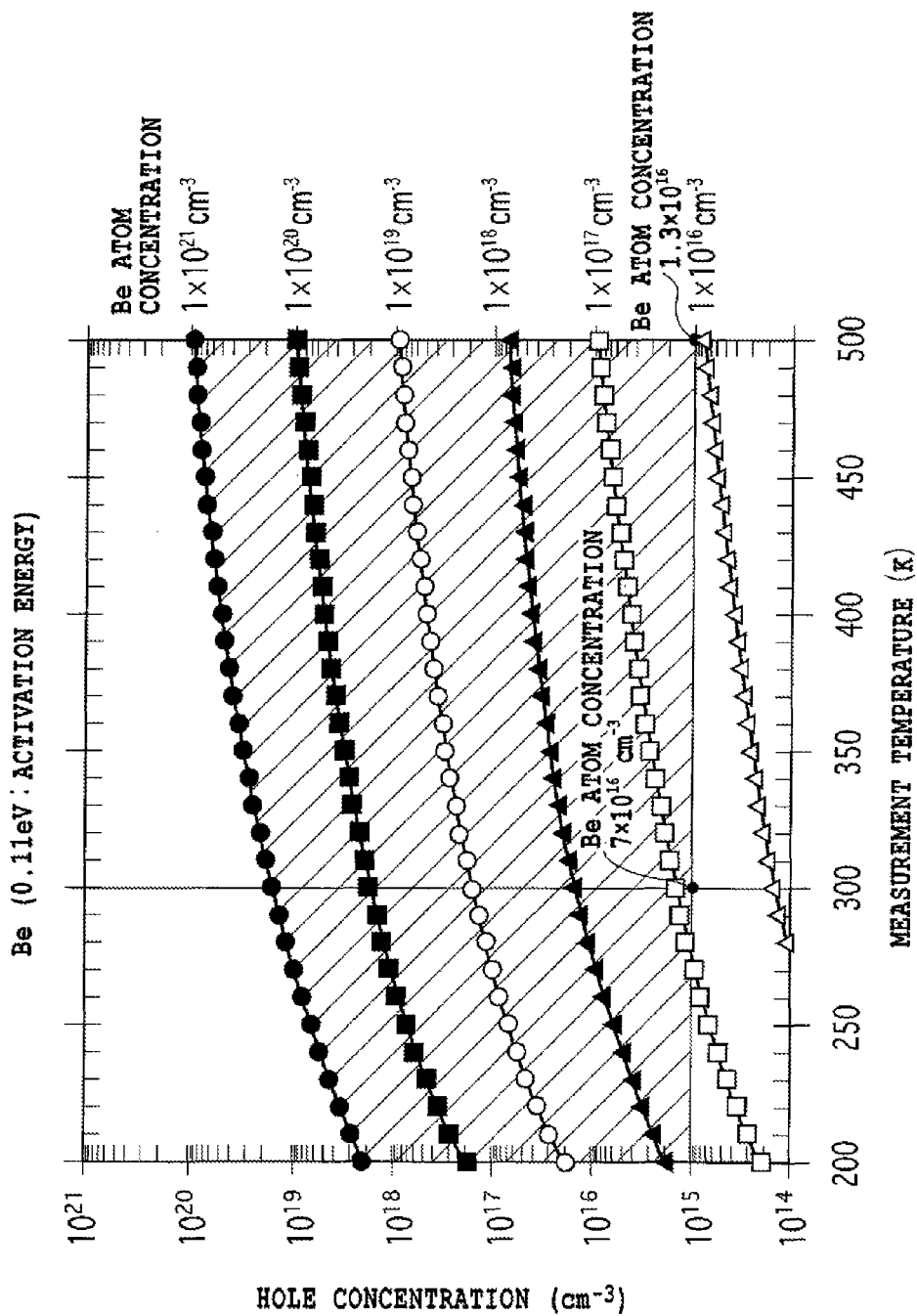
FIG. 26 is a graph showing temperature dependence of a hole concentration for each Be atom concentration in a p-type diamond semiconductor according to embodiment 5 of the present invention.

Through the hole measurement, the temperature dependence of the hole concentration in a sample of each of the Be dopant atom concentrations from $1.0 \times 10^{16}$ cm$^{-3}$ to $1.0 \times 10^{21}$ cm$^{-3}$, is measured. From this result, FIG. 26 shows the temperature dependence of a hole concentration for each Be atom concentration in the p-type diamond semiconductor according to embodiment 5 of the present invention. In FIG. 26 measurement temperature (K) is represented by the horizontal axis and the hole concentration (cm$^{-3}$) in the p-type diamond semiconductor is represented by the vertical axis, and the measured values for each Be atom concentration (cm$^{-3}$) in the p-type diamond semiconductor are plotted.

In order to obtain a hole concentration of $1.0 \times 10^{15}$ cm$^{-3}$ at about 300K which is a practical level, a Be atom concentration of no less than $7.0 \times 10^{16}$ cm$^{-3}$ is required. It is known that a deterioration in the quality of the diamond crystal occurs in the Be atom concentration exceeding $1.0 \times 10^{21}$ cm$^{-3}$. Accordingly, the dopant atom concentration in the Be-doped p-type diamond semiconductor element at about 300K in the practical level is required to be no less than $7.0 \times 10^{16}$ cm$^{-3}$ and no more than $1.0 \times 10^{21}$ cm$^{-3}$.

It is seen from this that, using equation (1), a ratio (Be/C) of the number of Be atoms to the number of C atoms in the source gas is required to fall within a range from no less than 0.7 ppm to no more than $10^4$ ppm.

Using FIG. 26 which is the plot of the values of the hole concentration in the p-type diamond semiconductor at each temperature for each concentration of the dopant atoms, a dopant atom concentration enabling the hole concentration in the p-type diamond semiconductor to reach $1.0 \times 10^{15}$ cm$^{-3}$ at each temperature can be found. For example, $1.3 \times 10^{16}$ cm$^{-3}$ is derived from FIG. 26 as a Be atom concentration enabling the hole concentration in the p-type diamond semiconductor to reach $1.0 \times 10^{15}$ cm$^{-3}$ at 500K.

In the range of $1.0 \times 10^{21}$ cm$^{-3}$ or less, the higher the Be atom concentration, the higher the hole concentration, resulting in, needless to say, a diamond semiconductor further suited to practical use.

Also, in the P-type diamond semiconductor according to the embodiment it is possible to obtain a room-temperature hole concentration about 25000 times that in a conventional p-type diamond semiconductor doped with B, with the same dopant atom concentration.

Also, the requirement for functioning as a p-type semiconductor is that the hole concentration is no less than $1.0 \times 10^{15}$ cm$^{-3}$ and the dopant atom concentration is no more than $1.0 \times 10^{21}$ cm$^{-3}$. For this reason, the p-type diamond semiconductor according to embodiment 5 functions as a p-type semiconductor under the conditions of being included in the region enclosed by the line of the hole concentration $1.0 \times 10^{15}$ cm$^{-3}$ and the line of the Be atom concentration $1.0 \times 10^{21}$ cm$^{-3}$. For example, embodiment 5 can function as a p-type semiconductor even in any temperature other than 300K. The region enabling functioning as a p-type semiconductor in embodiment 5 is considerably wider than that in the case of a conventional p-type diamond semiconductor doped with B, resulting in superiority in function as a p-type semiconductor under various conditions.

(Embodiment 6)

Ca may be used as dopant and an ion implantation technique may be used to implant the Ca dopant into a diamond single-crystal under the conditions of an acceleration voltage of 150 kV and a dose of $10^{15}$ cm$^{-2}$ to produce Ca-impurity-doped diamond. As an alternative to the ion implantation technique, the Ca-impurity-doped diamond may be produced by a microwave plasma chemical vapor deposition technique. In the microwave plasma chemical vapor deposition technique, by using as a feedstock a gas mixture of a total flow rate of 300 ccm comprising a reaction gas including a methane gas (CH$_4$) at a flow ratio of 1%, a dopant gas and H$^2$ as the remainder, a diamond semiconductor film of the present invention is grown to 1.0 µm thickness on a diamond single-crystal of (001) surface orientation. The pressure in the reaction tube is 50 Torr and the microwave source has a frequency of 2.45 GHz and a power of 1.3 kW. Here, calcium chloride CaCl$_2$ is used as the dopant gas. Alternatively, instead of the dopant gas, solid-state Ca may be introduced into plasma and the vaporized Ca may be used as a dopant gas.

By use of SIMS measurement, the Ca atom concentration y in the diamond semiconductor film is measured, and when the ratio of the number of Ca atoms to the number of C atoms in the source gas (Ca/C)x (ppm) is represented by the horizontal axis and the concentration of Ca atoms in the semiconductor film y (cm$^{-3}$) is represented by the vertical axis, the relationship is, as shown in FIG. 24, $$X(\text{ppm}) \times 10^{17} = y(\text{cm}^{-3}) \qquad (1)$$

Figure 27:
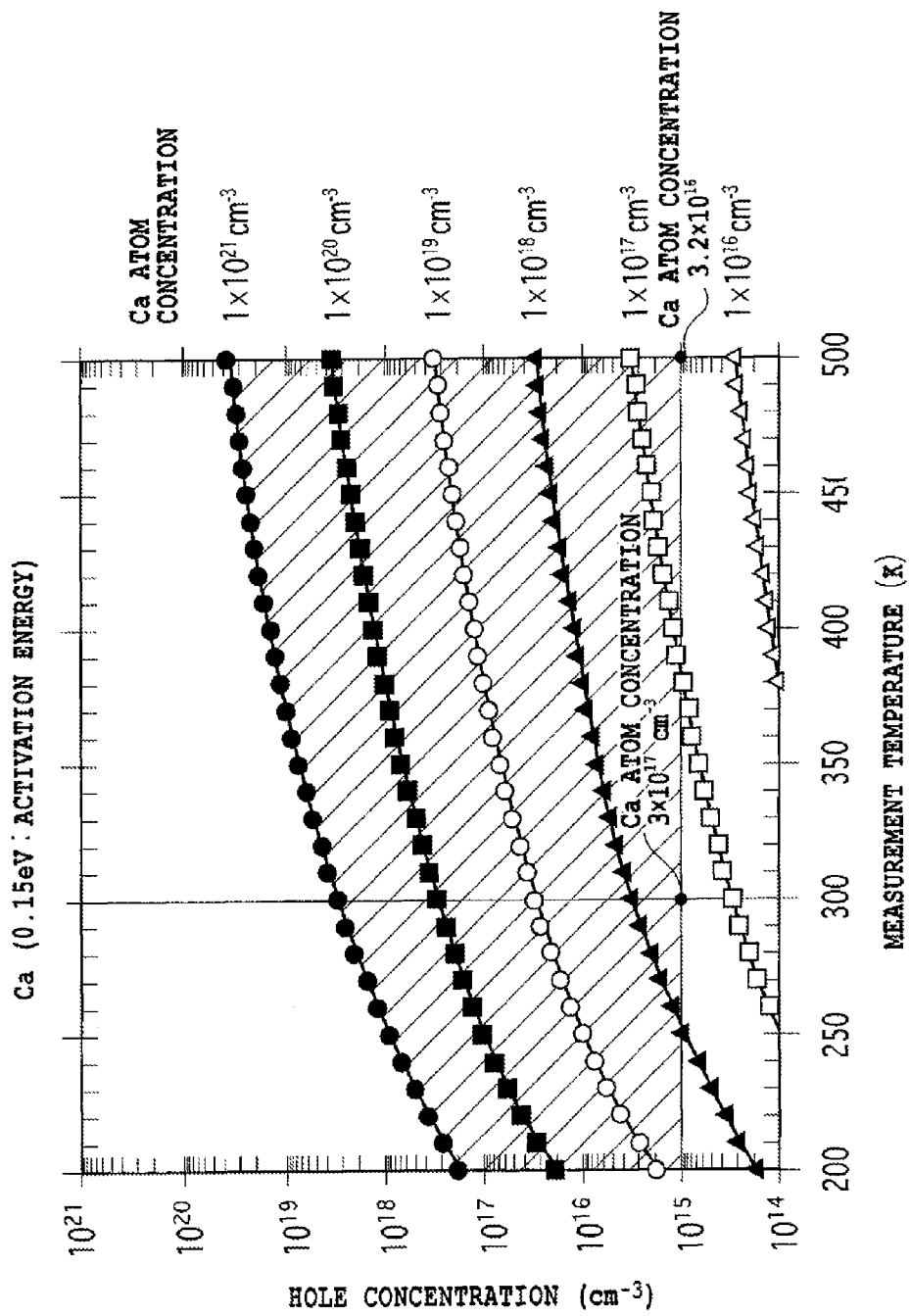
FIG. 27 is a graph showing temperature dependence of a hole concentration for each Ca atom concentration in a p-type diamond semiconductor according to embodiment 6 of the present invention.

Through the hole measurement, the temperature dependence of the hole concentration in a sample of each of the Ca dopant atom concentrations from $1.0 \times 10^{16}$ cm$^{-3}$ to $1.0 \times 10^{21}$ cm$^{-3}$, is measured. From this result, FIG. 27 shows the temperature dependence of a hole concentration for each Ca atom concentration in the p-type diamond semiconductor according to embodiment 6 of the present invention. In FIG. 27 measurement temperature (K) is represented by the horizontal axis and the hole concentration (cm$^{-3}$) in the p-type diamond semiconductor is represented by the vertical axis, and the measured values for each Ca atom concentration (cm$^{-3}$) in the p-type diamond semiconductor are plotted.

In order to obtain a hole concentration of $1.0 \times 10^{15}$ cm$^{-3}$ at about 300K which is a practical level, a Ca atom concentration of no less than $3.0 \times 10^{17}$ cm$^{-3}$ is required. The deterioration in the quality of the diamond crystal occurs in Ca atom concentration exceeding $1.0 \times 10^{21}$ cm$^{-3}$. Accordingly, the dopant atom concentration in the Ca-doped p-type diamond semiconductor element at about 300K which is a practical level is required to be no less than $3.0 \times 10^{17}$ cm$^{-3}$ and no more than $1.0 \times 10^{21}$ cm$^{-3}$.

It is seen from this that, using equation (1), a ratio (Ca/C) of the number of Ca atoms to the number of C atoms in the source gas is required to fall within a range from no less than 3.0 ppm to no more than $10^4$ ppm.

Using FIG. 27 which is the plot of the values of the hole concentration in the p-type diamond semiconductor at each temperature for each dopant atom concentration, a dopant atom concentration enabling the hole concentration in the p-type diamond semiconductor to reach $1.0 \times 10^{15}$ cm$^{-3}$ at each temperature can be found. For example, $3.2 \times 10^{16}$ cm$^{-3}$ is derived from FIG. 27 as a Ca atom concentration enabling the hole concentration in the p-type diamond semiconductor to reach $1.0\times10^{15}$ cm$^{-3}$ at 500K. It is seen from equation (1) that the ratio (Ca/C) of the number of Ca atoms to the number of C atoms in the source gas in this case is required to fall within the range from 0.32 ppm or more to $10^4$ ppm or less.

In the range of $1.0\times10^{21}$ cm$^{-3}$ or less, the higher the Ca atom concentration, the higher the hole concentration, resulting in, needless to say, a diamond semiconductor further suited to practical use.

Also, in the P-type diamond semiconductor according the embodiment it is possible to obtain a room-temperature hole concentration about $5.7\times10^3$ times that in a conventional p-type diamond semiconductor doped with B, with the same dopant atom concentration.

Also, the requirement for functioning as a p-type semiconductor is that the hole concentration is no less than $1.0\times10^{15}$ cm$^{-3}$ and the dopant atom concentration is no more than $1.0\times10^{21}$ cm$^{-3}$. For this reason, the p-type diamond semiconductor according to embodiment 6 functions as a p-type semiconductor under the conditions of being included in the region enclosed by the line of the hole concentration $1.0\times10^{15}$ cm$^{-3}$ and the line of the Ca atom concentration $1.0\times10^{21}$ cm$^{-3}$. For example, embodiment 6 can function as a p-type semiconductor even in any temperature other than 300K. The region enabling functioning as a p-type semiconductor in embodiment 6 is considerably wider than that in the case of a conventional p-type diamond semiconductor doped with B, resulting in superiority in function as a p-type semiconductor under various conditions.

Also, the mobility, at room temperature, of holes in the p-type diamond semiconductor film provided by the embodiment is 200 cm$^2$/Vs under the conditions of a Ca atom concentration of $1.0\times10^{19}$ cm$^{-3}$.

(Embodiment 7)

In a microwave plasma chemical vapor deposition technique, by using as a feedstock a gas mixture of a total flow rate of 300 ccm comprising a reaction gas including a methane gas ($CH_4$) at a flow ratio of 1%, a dopant gas and $H^2$ as the remainder, a diamond semiconductor film of the present invention is grown to 1.0 μm thickness on a diamond single-crystal of (001) surface orientation. The pressure in the reaction tube is 50 Torr and the microwave source has a frequency of 2.45 GHz and a power of 1.3 kW. Here, as the dopant gas, either dimethylcadmium (($CH_3$)$_2$Cd: DMCd) or diethylcadmium (($C_2H_5$)$_2$Cd: DECd), which is an organometallic material including Cd, is used.

Hole measurement is conducted on the obtained diamond semiconductor films to evaluate the hole coefficient, whereby it can be confirmed that these diamond semiconductor films are p-type semiconductors.

Also, the Cd atom concentration in the diamond semiconductor film is measured by the SIMS measurement, and when the ratio of the number of Cd atoms to the number of C atoms in the source gas (Cd/C)x (ppm) is represented by the horizontal axis and the Cd atom concentration in the semiconductor film y (cm$^{-3}$) is represented by the vertical axis, the relationship is, as shown in FIG. 24, $$X(\text{ppm})\times10^{17}=y(\text{cm}^{-3}) \quad (1)$$

Figure 28:
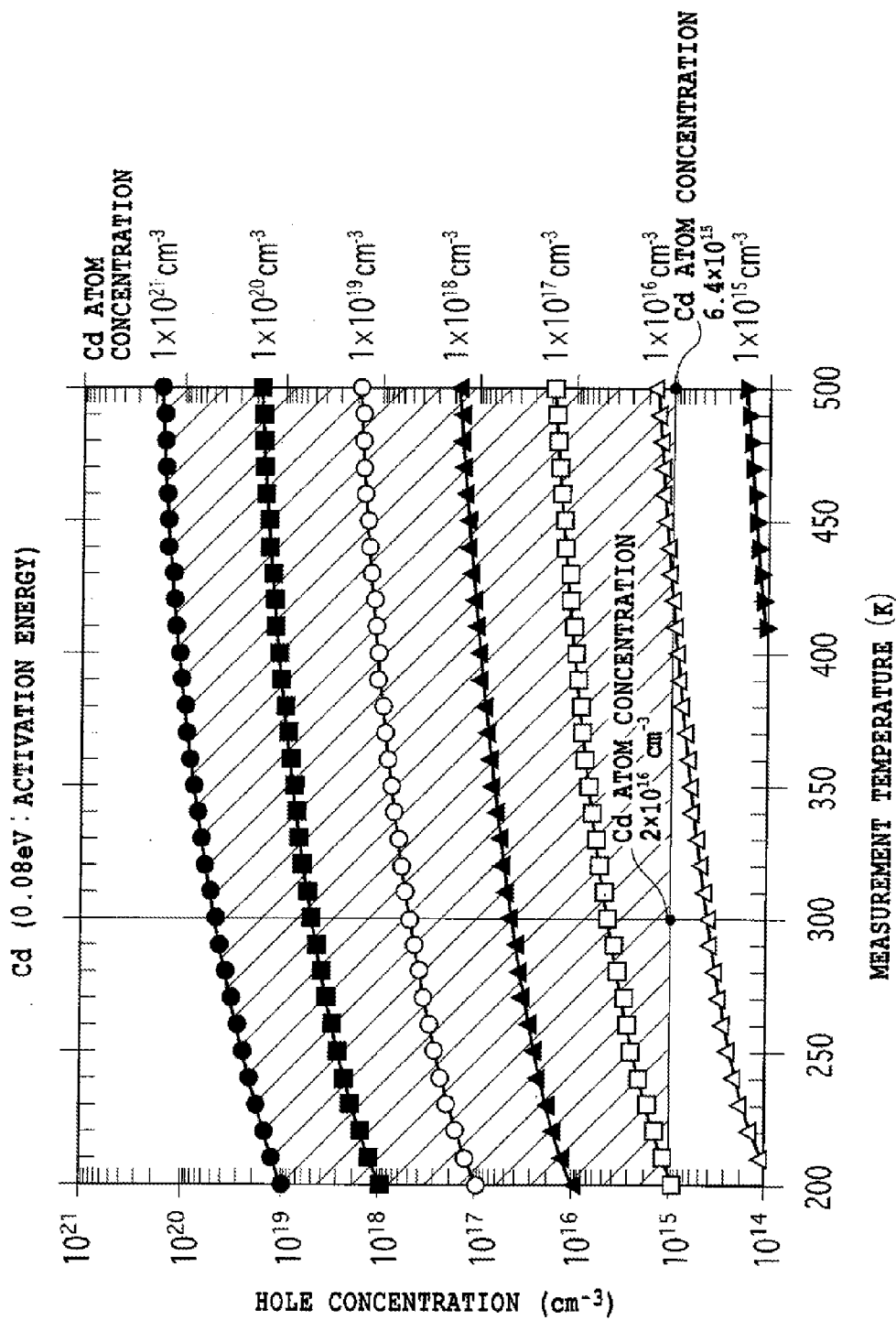
FIG. 28 is a graph showing temperature dependence of a hole concentration for each Cd atom concentration in a p-type diamond semiconductor according to embodiment 7 of the present invention.

FIG. 28 shows the temperature dependence of a hole concentration for each Cd atom concentration in a p-type diamond semiconductor according to embodiment 7 of the present invention. In FIG. 28 measurement temperature (K) is represented by the horizontal axis and the hole concentration (cm$^{-3}$) in the p-type diamond semiconductor is represented by the vertical axis, and the measured values for each Cd atom concentration (cm$^{-3}$) in the p-type diamond semiconductor are plotted.

In order to obtain a hole concentration of $1.0\times10^{15}$ cm$^{-3}$ at about 300K which is a practical level, a Cd atom concentration of no less than $2.0\times10^{16}$ cm$^{-3}$ is required. It is known that deterioration in the quality of the diamond crystal occurs in the Cd atom concentration exceeding $1.0\times10^{21}$ cm$^{-3}$. Accordingly, the dopant atom concentration in the Cd-doped p-type diamond semiconductor element at a practical level is required to be no less than $2.0\times10^{16}$ cm$^{-3}$ and no more than $1.0\times10^{21}$ cm$^{-3}$.

It is seen from this that, using equation (1), the ratio (Cd/C) of the number of Cd atoms to the number of C atoms in the source gas is required to fall within a range from no less than 0.2 ppm to no more than $10^4$ ppm.

Using FIG. 28 which is the plot of the values of the hole concentration in the p-type diamond semiconductor at each temperature for each dopant atom concentration, the dopant atom concentration enabling the hole concentration in the p-type diamond semiconductor to reach $1.0\times10^{15}$ cm$^{-3}$ at each temperature can be found. For example, $6.4\times10^{15}$ cm$^{-3}$ is derived from FIG. 28 as a Cd atom concentration enabling the hole concentration in the p-type diamond semiconductor to reach $1.0\times10^{15}$ cm$^{-3}$ at 500K. It is seen from equation (1) that the ratio (Cd/C) of the number of Cd atoms to the number of C atoms in the source gas in this case is required to fall within the range of from no less than 0.064 ppm to no more than $10^4$ ppm.

In the range of no more than $1.0\times10^{21}$ cm$^{-3}$, the higher the Cd atom concentration in the p-type diamond semiconductor film, the higher the hole concentration, resulting in, needless to say, a diamond semiconductor further suited to practical use.

Also, the requirement for functioning as a p-type semiconductor is that the hole concentration is no less than $1.0\times10^{15}$ cm$^{-3}$ and the dopant atom concentration is no more than $1.0\times10^{21}$ cm$^{-3}$. For this reason, the p-type diamond semiconductor according to embodiment 7 functions as a p-type semiconductor under the conditions of being included in the region enclosed by the line of the hole concentration $1.0\times10^{15}$ cm$^{-3}$ and the line of the Cd atom concentration $1.0\times10^{21}$ cm$^{-3}$. For example, embodiment 7 can function as the p-type semiconductor even in any temperature other than 300K. The region enabling functioning as a p-type semiconductor in embodiment 7 is considerably wider than that in the case of a conventional p-type diamond semiconductor doped with B, resulting in superiority in function as a p-type semiconductor under various conditions.

Also, Table 5 shows the comparison result of the mobility, at 300K, of holes of the p-type diamond semiconductor films which respectively are obtained when dimethylcadmium (($CH_3$)$_2$Cd: DMCd), diethylcadmium (($C_2H_5$)$_2$Cd: DECd) or cadmium chloride ($CdCl_2$) of the present invention is used as a dopant gas.

TABLE 5

(All in Cd atom concentration of $1.0\times10^{19}$ cm$^{-3}$)

| Cd dopant material | Hole mobility at room temperature (cm$^2$/Vs) |
|---|---|
| DMCd | 1350 |
| DECd | 1250 |
| CdCl$_2$ | 150 |

As shown in Table 5, the room-temperature hole mobility in the case of using dimethylcadmium ($(CH_3)_2Cd$: DMCd) and diethylcadmium ($(C_2H_5)_2Cd$: DECd) is about 8 times or more higher than that in the case of using cadmium chloride ($CdCl_2$), resulting in the diamond semiconductor having notably outstanding characteristics.

(Embodiment 8)

In a microwave plasma chemical vapor deposition technique, by using as a feedstock a gas mixture of a total flow rate of 300 ccm comprising a reaction gas including a methane gas ($CH_4$) at a flow ratio of 1%, a dopant gas and $H^2$ as the remainder, a diamond semiconductor film of the present invention is grown to 1.0 µm thickness on a diamond single-crystal of (001) surface orientation. The pressure in the reaction tube is 50 Torr and the microwave source has a frequency of 2.45 GHz and a power of 1.3 kW. Here, as the dopant gas, either trimethylgallium ($(CH_3)_3Ga$: TMGa) or triethylgallium ($(C_2H_5)_3Ga$: TEGa), which is an organometallic material including Ga, is used.

Hole measurement is conducted on the obtained diamond semiconductor films to evaluate the hole coefficient, whereby it can be confirmed that these diamond semiconductor films are p-type semiconductors.

Also, the Ga atom concentration in the diamond semiconductor film is measured by the SIMS measurement, and when the ratio of the number of Ga atoms to the number of C atoms in the source gas (Ga/C)x (ppm) is represented by the horizontal axis and the Ga atom concentration in the semiconductor film y ($cm^{-3}$) is represented by the vertical axis, the relationship is, as shown in FIG. 24, $$X(\text{ppm}) \times 10^{17} = y(\text{cm}^{-3}) \quad (1)$$

Figure 29:
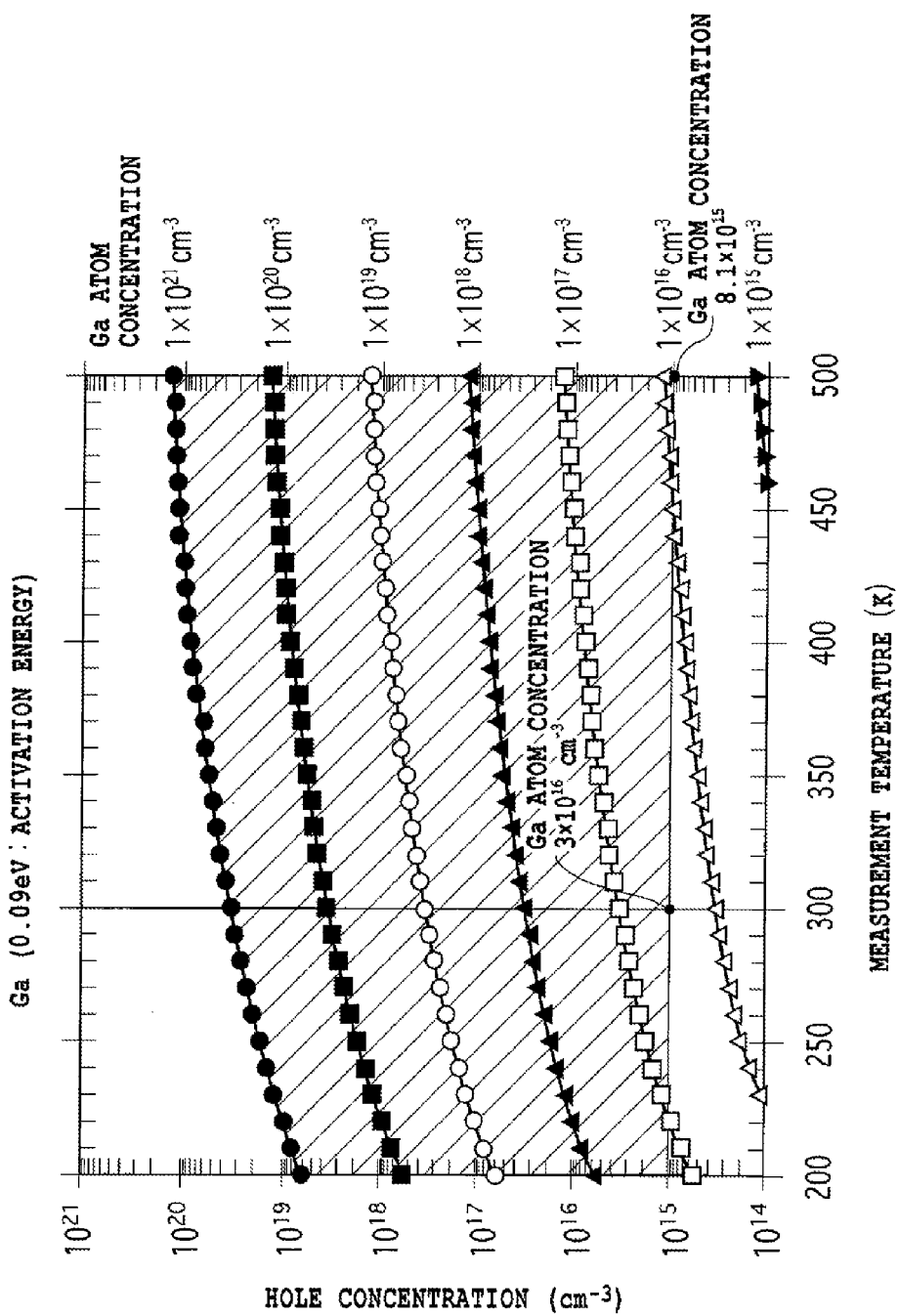
FIG. 29 is a graph showing temperature dependence of a hole concentration for each Ga atom concentration in a p-type diamond semiconductor according to embodiment 8 of the present invention.

FIG. 29 shows the temperature dependence of a hole concentration for each Ga atom concentration in a p-type diamond semiconductor according to embodiment 8 of the present invention. In FIG. 29 measurement temperature (K) is represented by the horizontal axis and the hole concentration ($cm^{-3}$) in the p-type diamond semiconductor is represented by the vertical axis, and the measured values for each Ga atom concentration ($cm^{-3}$) in the p-type diamond semiconductor are plotted.

In order to obtain a hole concentration of $1.0 \times 10^{15}$ $cm^{-3}$ at about 300K which is a practical level, a Ga atom concentration of $3.0 \times 10^{16}$ $cm^{-3}$ or more is required. It is known that the deterioration in the quality of the diamond crystal occurs in the Ga atom concentration exceeding $1.0 \times 10^{21}$ $cm^{-3}$. Accordingly, the dopant atom concentration in the Ga-doped p-type diamond semiconductor element at a practical level is required to be no less than $3.0 \times 10^{16}$ $cm^{-3}$ and no more than $1.0 \times 10^{21}$ $cm^{-3}$.

It is seen from this that, using equation (1), the ratio (Ga/C) of the number of Ga atoms to the number of C atoms in the source gas is required to fall within a range from no less than 0.3 ppm to no more than $10^4$ ppm.

Using FIG. 29 which is the plot of the values of the hole concentration in the p-type diamond semiconductor at each temperature for each dopant atom concentration, a dopant atom concentration enabling the hole concentration in the p-type diamond semiconductor to reach $1.0 \times 10^{15}$ $cm^{-3}$ at each temperature can be found. For example, $8.1 \times 10^{15}$ $cm^{-3}$ is derived from FIG. 29 as a Ga atom concentration enabling the hole concentration in the p-type diamond semiconductor to reach $1.0 \times 10^{15}$ $cm^{-3}$ at 500K. It is seen from equation (1) that the ratio (Ga/C) of the number of Ga atoms to the number of C atoms in the source gas in this case is required to fall within the range of from no less than 0.081 ppm to no more than $10^4$ ppm.

In the range of $1.0 \times 10^{21}$ $cm^{-3}$ or less, the higher the Ga atom concentration in the p-type diamond semiconductor film, the higher the hole concentration, resulting in, needless to say, a diamond semiconductor further suited to practical use.

Also, the requirement for functioning as a p-type semiconductor is that the hole concentration is no less than $1.0 \times 10^{15}$ $cm^{-3}$ and the dopant atom concentration is no more than $1.0 \times 10^{21}$ $cm^{-3}$. For this reason, the p-type diamond semiconductor according to embodiment 8 functions as a p-type semiconductor under the conditions of being included in the region enclosed by the line of the hole concentration $1.0 \times 10^{15}$ $cm^{-3}$ and the line of the Ga atom concentration $1.0 \times 10^{21}$ $cm^{-3}$. For example, embodiment 8 can function as a p-type semiconductor even in any temperature other than 300K. The region in which the function as a p-type semiconductor is achieved in embodiment 8 is considerably wider than that in the case of a conventional p-type diamond semiconductor doped with B, resulting in superiority in function as a p-type semiconductor under various conditions.

Also, Table 6 shows the mobility, at 300K, of holes in each of the p-type diamond semiconductor films obtained when trimethylgallium ($(CH_3)_3Ga$: TMGa), triethylgallium ($(C_2H_5)_3Ga$: TEGa) or gallium chloride ($GaCl_3$) of the present invention is used as a dopant gas.

TABLE 6

| (All in Ga atom concentration of $1.0 \times 10^{19}$ $cm^{-3}$) | |
|---|---|
| Ga dopant material | Hole mobility at room temperature ($cm^2/Vs$) |
| TMGa | 1600 |
| TEGa | 1450 |
| $GaCl_3$ | 200 |

As shown in Table 6, the room-temperature hole mobility in the case of using trimethylgallium ($(CH_3)_3Ga$: TMGa) or triethylgallium ($(C_2H_5)_3Ga$: TEGa) is about 7 times or more higher than that in the case of using gallium chloride ($GaCl_3$), resulting in the diamond semiconductor having notably outstanding characteristics.

(Embodiment 9)

In a microwave plasma chemical vapor deposition technique, by using as a feedstock a gas mixture of a total flow rate of 300 ccm comprising a reaction gas including a methane gas ($CH_4$) at a flow ratio of 1%, a dopant gas and $H^2$ as the remainder, a diamond semiconductor film of the present invention is grown to 1.0 µm thickness on a diamond single-crystal of (001) surface orientation. The pressure in the reaction tube is 50 Torr and the microwave source has a frequency of 2.45 GHz and a power of 1.3 kW. Here, as the dopant gas, either trimethylindium ($(CH_3)_3In$: TMIn) or triethylindium ($(C_2H_5)_3In$: TEIn), which is an organometallic material including In, is used.

Hole measurement is conducted on the obtained diamond semiconductor films to evaluate the hole coefficient, whereby it can be confirmed that these diamond semiconductor films are p-type semiconductors.

Also, the In atom concentration in the diamond semiconductor film is measured by the SIMS measurement, and when the ratio of the number of In atoms to the number of C atoms in the source gas (In/C)x (ppm) is represented by the horizontal axis and the In atom concentration in the semiconductor film y ($cm^{-3}$) is represented by the vertical axis, the relationship is, as shown in FIG. 24, $$X(\text{ppm}) \times 10^{17} = y(\text{cm}^{-3}) \quad (1)$$

Figure 30:
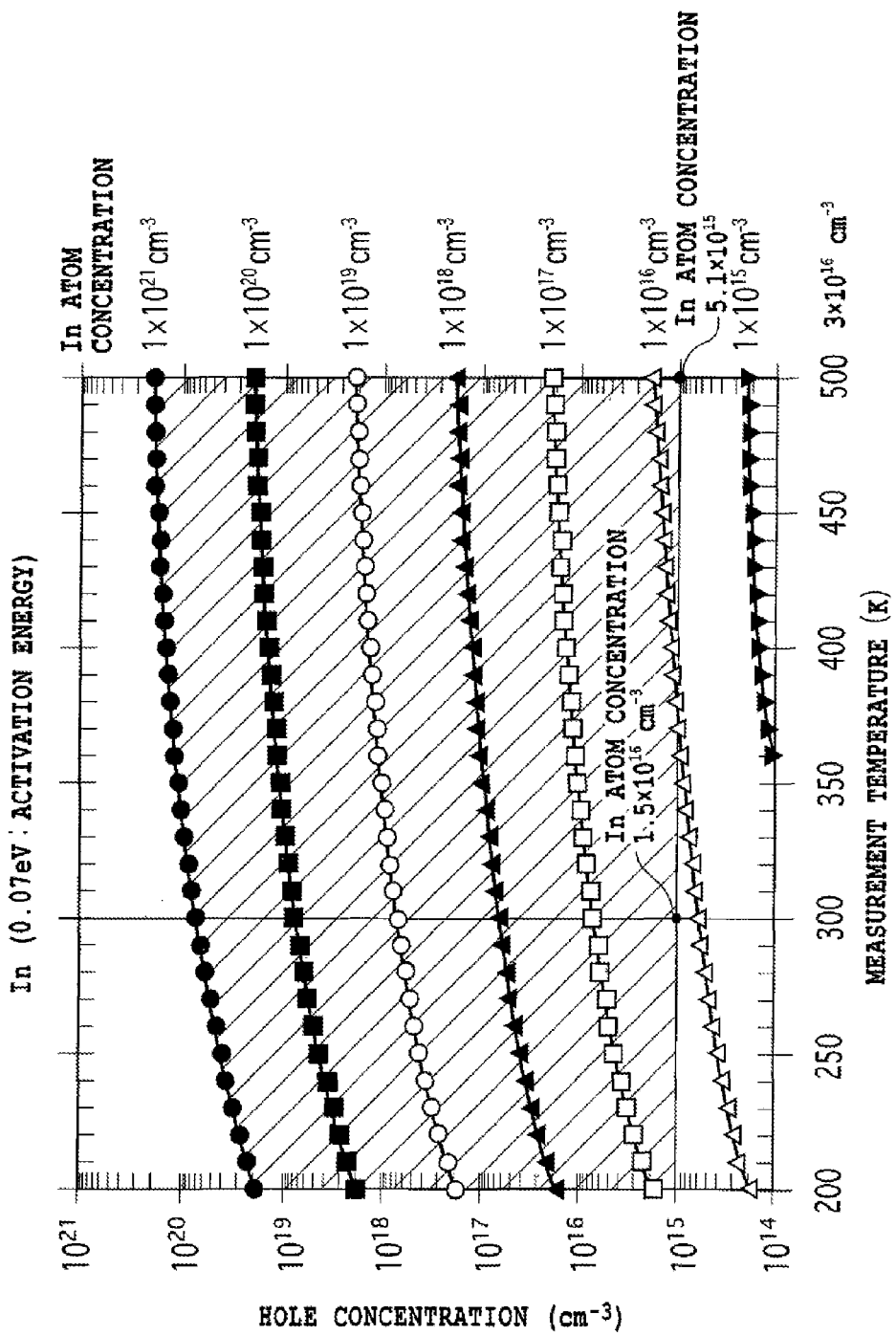
FIG. 30 is a graph showing temperature dependence of a hole concentration for each In atom concentration in a p-type diamond semiconductor according to embodiment 9 of the present invention.

FIG. 30 shows the temperature dependence of a hole concentration for each In atom concentration in a p-type diamond semiconductor according to embodiment 9 of the present invention. In FIG. 30 measurement temperature (K) is represented by the horizontal axis and the hole concentration ($cm^{-3}$) in the p-type diamond semiconductor is represented by the vertical axis, and the measured values for each In atom concentration ($cm^{-3}$) in the p-type diamond semiconductor are plotted.

In order to obtain a hole concentration of $1.0 \times 10^{15}$ $cm^{-3}$ at about 300K which is a practical level, an In atom concentration of $1.5 \times 10^{16}$ $cm^{-3}$ or more is required. It is known that the deterioration in the quality of the diamond crystal occurs in the In atom concentration exceeding $1.0 \times 10^{21}$ $cm^{-3}$. Accordingly, the dopant atom concentration in the In-doped p-type diamond semiconductor element at a practical level is required to be no less than $1.5 \times 10^{16}$ $cm^{-3}$ and no more than $1.0 \times 10^{21}$ $cm^{-3}$.

It is seen from this that, using equation (1), a ratio (In/C) of the number of In atoms to the number of C atoms in the source gas is required to fall within a range of from no less than 0.15 ppm to no more than $10^4$ ppm.

Using FIG. 30 which is the plot of the values of the hole concentration in the p-type diamond semiconductor at each temperature for each dopant atom concentration, a dopant atom concentration enabling the hole concentration in the p-type diamond semiconductor to reach $1.0 \times 10^{15}$ $cm^{-3}$ at each temperature can be found. For example, $5.1 \times 10^{15}$ $cm^{-3}$ is derived from FIG. 30 as an In atom concentration enabling the hole concentration in the p-type diamond semiconductor to reach $1.0 \times 10^{15}$ $cm^{-3}$ at 500K. It is seen from equation (1) that the ratio (In/C) of the number of In atoms to the number of C atoms in the source gas in this case is required to fall within the range of from no less than 0.051 ppm to no more than $10^4$ ppm.

In the range of $1.0 \times 10^{21}$ $cm^{-3}$ or less, the higher the In atom concentration in the p-type diamond semiconductor film, the higher the hole concentration, resulting in, needless to say, a diamond semiconductor further suited to practical use.

Also, the requirement for functioning as a p-type semiconductor is that the hole concentration is $1.0 \times 10^{15}$ $cm^{-3}$ or more and the dopant atom concentration is $1.0 \times 10^{21}$ $cm^{-3}$ or less. For this reason, the p-type diamond semiconductor according to embodiment 9 functions as a p-type semiconductor under the conditions of being included in the region enclosed by the line of the hole concentration $1.0 \times 10^{15}$ $cm^{-3}$ and the line of the In atom concentration $1.0 \times 10^{21}$ $cm^{-3}$. For example, embodiment 9 can function as a p-type semiconductor even in any temperature other than 300K. The region enabling functioning as a p-type semiconductor in embodiment 9 is considerably wider than that in the case of a conventional p-type diamond semiconductor doped with B, resulting in superiority in function as a p-type semiconductor under various conditions.

Also, Table 7 shows the mobility, at 300K, of holes in each of the p-type diamond semiconductor films obtained when trimethylindium (($CH_3)_3$In: TMIn), triethylindium (($C_2H_5)_3$In: TEIn) or indium chloride ($InCl_3$) of the present invention is used as a dopant gas.

TABLE 7

(All in In atom concentration of $1.0 \times 10^{19}$ $cm^{-3}$)

| In dopant material | Hole mobility at room temperature ($cm^2$/Vs) |
|---|---|
| TMIn | 1500 |
| TEIn | 1400 |
| $InCl_3$ | 200 |

As shown in Table 7, the room-temperature hole mobility in the case of using trimethylindium (($CH_3)_3$In: TMIn) or triethylindium (($C_2H_5)_3$In: TEIn) is about 7 times or more higher than that in the case of using indium chloride ($InCl_3$), resulting in the diamond semiconductor having notably outstanding characteristics.

(Embodiment 10)

Li may be used as dopant and an ion implantation technique may be used to implant the Li dopant into a diamond single-crystal under the conditions of an acceleration voltage of 150 kV and a dose of $10^{15}$ $cm^{-2}$ to produce Li-impurity-doped diamond. As an alternative to the ion implantation technique, the Li-impurity-doped diamond may be produced by a microwave plasma chemical vapor deposition technique in which solid-state Li is introduced into plasma. By using as a feedstock a reaction gas of a total flow rate of 300 ccm comprising a methane gas ($CH_4$) at a flow ratio of 1%, a dopant gas and $H^2$ as the remainder, a diamond semiconductor film of the present invention is grown to 1.0 µm thickness on a diamond single-crystal of (001) surface orientation. Here, the pressure in the reaction tube is 50 Torr and the microwave source has a frequency of 2.45 GHz and a power of 1.3 kW. Here, as the dopant gas, any of the three, methyllithium ($CH_3Li$), ethyllithium ($C_2H_5Li$) and propyllithium ($C_3H_7Li$), may be used.

Then, annealing is performed on the Li-impurity-doped diamond thus obtained. Hole measurement is conducted on the Li-doped diamond semiconductor films of the present invention thus obtained to evaluate the hole coefficient, whereby it can be confirmed that these diamond semiconductor film is a p-type semiconductor. In addition, the Li dopant atom concentration in the diamond semiconductor film is measured by the SIMS measurement.

Figure 39:
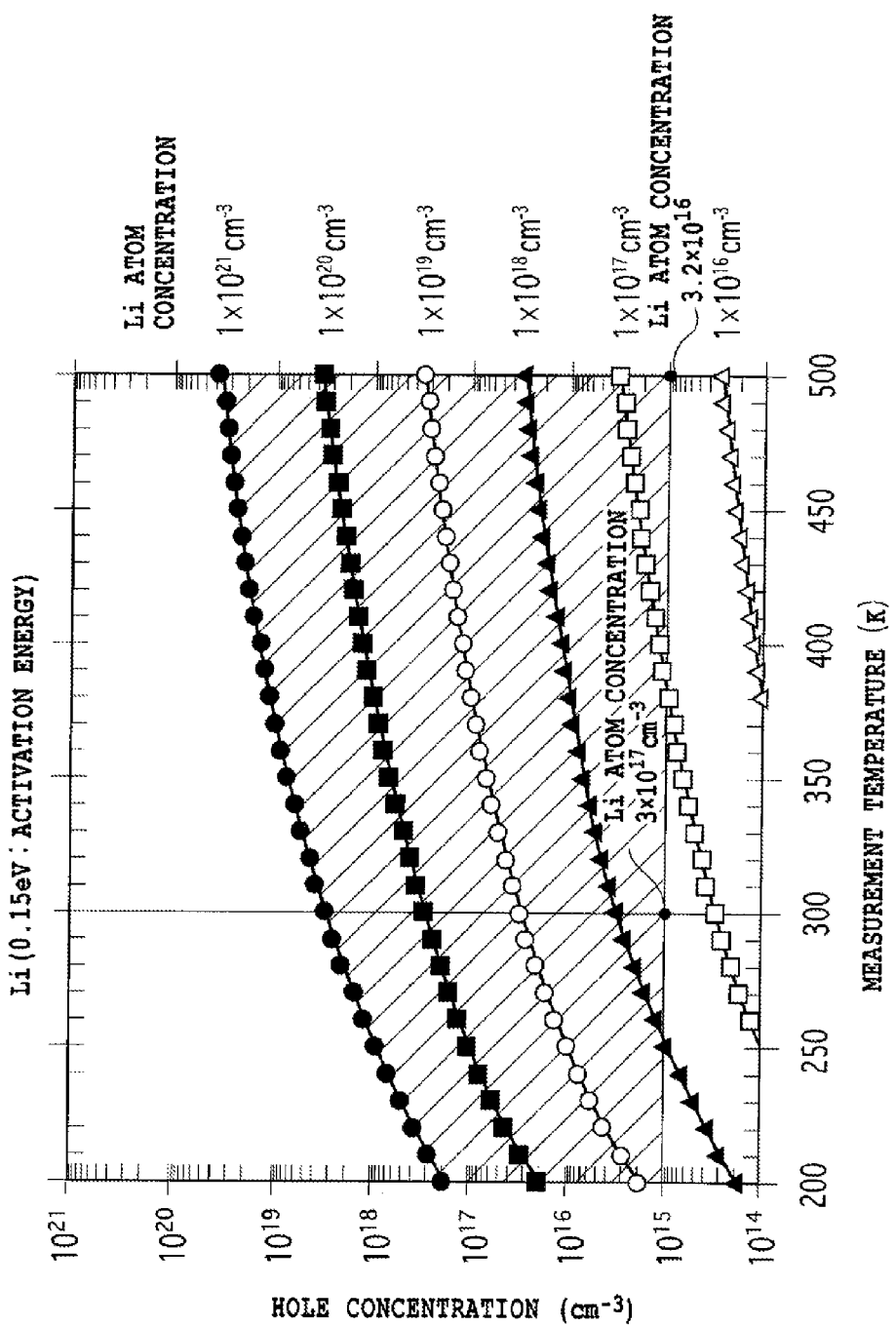
FIG. 39 is a graph showing temperature dependence of a hole concentration for each Li atom concentration in a p-type diamond semiconductor according to embodiment 10 of the present invention.

Through the hole measurement, the temperature dependence of the hole concentration in a sample of each of the Li dopant atom concentrations from $1.0 \times 10^{16}$ $cm^{-3}$ to $1.0 \times 10^{21}$ $cm^{-3}$, is measured. From this result, FIG. 39 shows the temperature dependence of a hole concentration for each Li atom concentration in the p-type diamond semiconductor according to embodiment 10 of the present invention. In FIG. 39 measurement temperature (K) is represented by the horizontal axis and the hole concentration ($cm^{-3}$) in the p-type diamond semiconductor is represented by the vertical axis, and the measured values for each Li atom concentration ($cm^{-3}$) in the p-type diamond semiconductor are plotted.

In order to obtain a hole concentration of $1.0 \times 10^{15}$ $cm^{-3}$ at about 300K which is a practical level, a Li atom concentration of $3.0 \times 10^{17}$ $cm^{-3}$ or more is required. It is known that deterioration in the quality of the diamond crystal occurs in a Li atom concentration exceeding $1.0 \times 10^{21}$ $cm^{-3}$. Accordingly, the dopant atom concentration in the Li-doped p-type diamond semiconductor element at about 300K in the practical level is required to be no less than $3.0 \times 10^{17}$ $cm^{-3}$ and no more than $1.0 \times 10^{21}$ $cm^{-3}$.

Using FIG. 39 which is the plot of the values of the hole concentration in the p-type diamond semiconductor at each temperature for each concentration of the dopant atoms, a dopant atom concentration enabling the hole concentration in the p-type diamond semiconductor to reach $1.0 \times 10^{15}$ $cm^{-3}$ at each temperature can be found. For example, $3.2 \times 10^{16}$ $cm^{-3}$ is derived from FIG. 39 as a Li atom concentration enabling the hole concentration in the p-type diamond semiconductor to reach $1.0 \times 10^{15}$ $cm^{-3}$ at 500K.

In the range of $1.0 \times 10^{21}$ $cm^{-3}$ or less, the higher the Li atom concentration, the higher the hole concentration, resulting in, needless to say, a diamond semiconductor further suited to practical use.

Also, in the P-type diamond semiconductor according to the embodiment it is possible to obtain a room-temperature hole concentration about 5700 times that in a conventional p-type diamond semiconductor doped with B, with the same dopant atom concentration.

Also, the requirement for functioning as a p-type semiconductor is that the hole concentration is $1.0 \times 10^{15}$ cm$^{-3}$ or more and the dopant atom concentration is $1.0 \times 10^{21}$ cm$^{-3}$ or less. For this reason, the p-type diamond semiconductor according to embodiment 10 functions as a p-type semiconductor under the conditions of being included in the region enclosed by the line of the hole concentration $1.0 \times 10^{15}$ cm$^{-3}$ and the line of the Li atom concentration $1.0 \times 10^{21}$ cm$^{-3}$. For example, embodiment 10 can function as a p-type semiconductor even in any temperature other than 300K. The region enabling functioning as a p-type semiconductor in embodiment 10 is considerably wider than that in the case of a conventional p-type diamond semiconductor doped with B, resulting in superiority in function as a p-type semiconductor under various conditions.

TABLE 8

(All in Li atom concentration of $1.0 \times 10^{19}$ cm$^{-3}$)

| Li dopant material | Hole mobility at room temperature (cm$^2$/Vs) |
|---|---|
| Methyl Li | 1350 |
| Ethyl Li | 1250 |
| Propyl Li | 150 |

(Embodiment 11)

In a microwave plasma chemical vapor deposition technique, by using as a feedstock a gas mixture of a total flow rate of 300 ccm comprising a reaction gas including a methane gas (CH$_4$) at a flow ratio of 1%, a dopant gas and H$^2$ as the remainder, a diamond semiconductor film of the present invention is grown to 1.0 μm thickness on a diamond single-crystal of (001) surface orientation. The pressure in the reaction tube is 50 Torr and the microwave source has a frequency of 2.45 GHz and a power of 1.3 kW. Here, as the dopant gas, bis-cyclopentadienyl magnesium (($C_5H_5$)$_2$Mg: $Cp_2$Mg) or bis-methylcyclopentadienyl magnesium (($CH_3C_5H_4$)$_2$Mg: MCp$_2$Mg), which is an organometallic material including Mg, is used.

Hole measurement is conducted on the obtained diamond semiconductor films to evaluate the hole coefficient, whereby it can be confirmed that these diamond semiconductor films are p-type semiconductors.

Also, the Mg atom concentration in the diamond semiconductor film is measured by the SIMS measurement, and when the ratio of the number of Mg atoms to the number of C atoms in the source gas (Mg/C)x (ppm) is represented by the horizontal axis and the Mg atom concentration in the semiconductor film y (cm$^{-3}$) is represented by the vertical axis, the relationship is, as shown in FIG. 24, $$X(\text{ppm}) \times 10^{17} = y(\text{cm}^{-3}) \quad (1)$$

Figure 31:
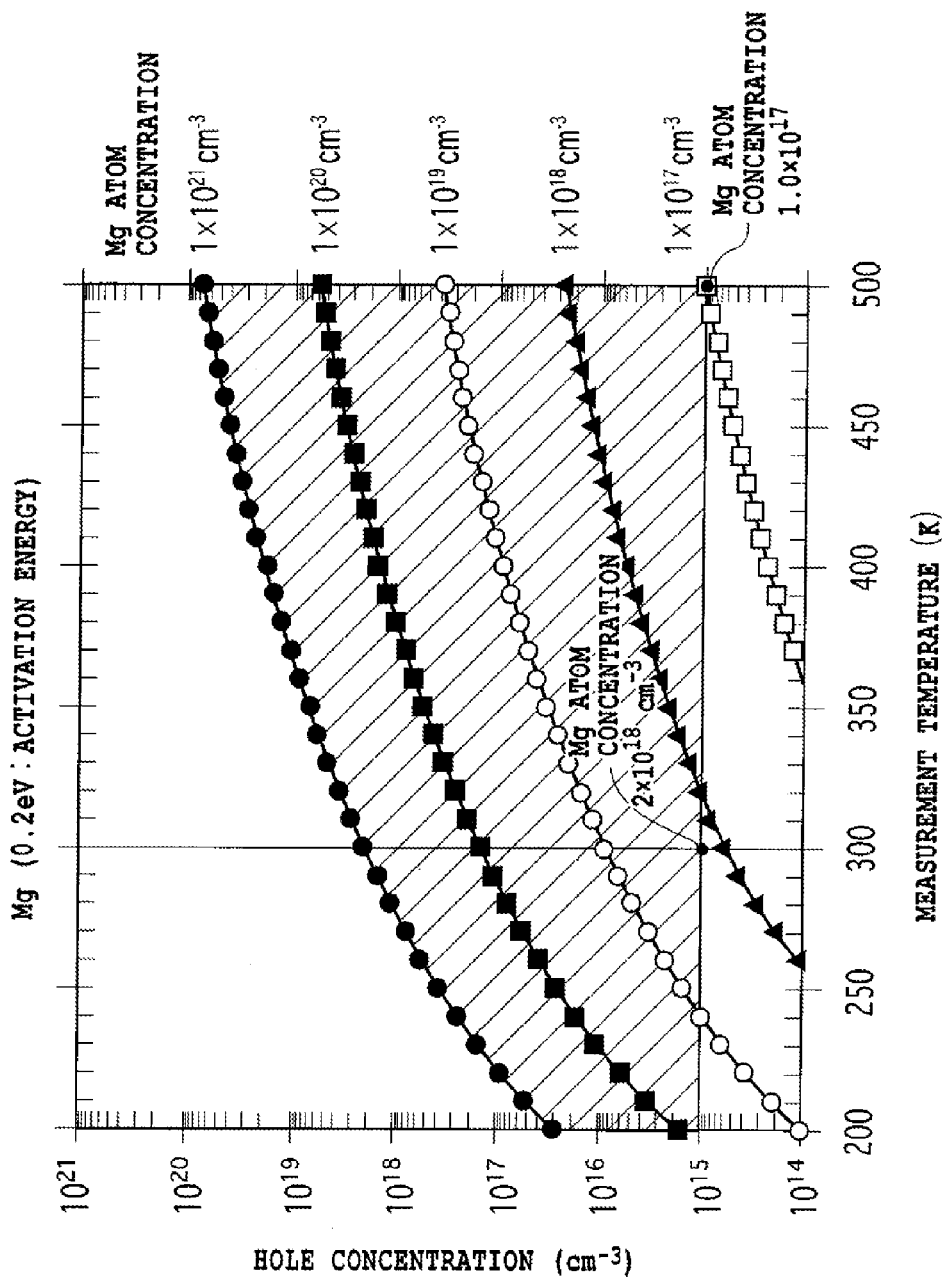
FIG. 31 is a graph showing temperature dependence of a hole concentration for each Mg atom concentration in a p-type diamond semiconductor according to embodiment 11 of the present invention.

FIG. 31 shows the temperature dependence of a hole concentration for each Mg atom concentration in a p-type diamond semiconductor according to embodiment 11 of the present invention. In FIG. 31 measurement temperature (K) is represented by the horizontal axis and the hole concentration (cm$^{-3}$) in the p-type diamond semiconductor is represented by the vertical axis, and the measured values for each Mg atom concentration (cm$^{-3}$) in the p-type diamond semiconductor are plotted.

In order to obtain a hole concentration of $1.0 \times 10^{15}$ cm$^{-3}$ at about 300K which is a practical level, a Mg atom concentration of $2.0 \times 10^{18}$ cm$^{-3}$ or more is required. It is known that deterioration in the quality of the diamond crystal occurs in the Mg atom concentration exceeding $1.0 \times 10^{21}$ cm$^{-3}$. Accordingly, the dopant atom concentration in the Mg-doped p-type diamond semiconductor element at a practical level is required to be no less than $2.0 \times 10^{18}$ cm$^{-3}$ and no more than $1.0 \times 10^{21}$ cm$^{-3}$.

It is seen from this that, using equation (1), the ratio (Mg/C) of the number of Mg atoms to the number of C atoms in the source gas is required to fall within a range of from no less than 20 ppm to no more than 10$^4$ ppm.

Using FIG. 31 which is the plot of the values of the hole concentration in the p-type diamond semiconductor at each temperature for each dopant atom concentration, the dopant atom concentration enabling the hole concentration in the p-type diamond semiconductor to reach $1.0 \times 10^{15}$ cm$^{-3}$ at each temperature can be found. For example, $1.0 \times 10^{17}$ cm$^{-3}$ is derived from FIG. 31 as an Mg atom concentration enabling the hole concentration in the p-type diamond semiconductor to reach $1.0 \times 10^{15}$ cm$^{-3}$ at 500K. It is seen from equation (1) that the ratio (Mg/C) of the number of Mg atoms to the number of C atoms in the source gas in this case is required to fall within the range of from no less than 1.0 ppm to no more than 10$^4$ ppm.

In the range of $1.0 \times 10^{21}$ cm$^{-3}$ or less, the higher the Mg atom concentration in the p-type diamond semiconductor film, the higher the hole concentration is, resulting in, needless to say, a diamond semiconductor further suited to practical use.

Also, the requirement for functioning as a p-type semiconductor is that the hole concentration is $1.0 \times 10^{15}$ cm$^{-3}$ or more and the dopant atom concentration is $1.0 \times 10^{21}$ cm$^{-3}$ or less. For this reason, the p-type diamond semiconductor according to embodiment 11 functions as a p-type semiconductor under the conditions of being included in the region enclosed by the line of the hole concentration $1.0 \times 10^{15}$ cm$^{-3}$ and the line of the Mg atom concentration $1.0 \times 10^{21}$ cm$^{-3}$. For example, embodiment 11 can function as a p-type semiconductor even in any temperature other than 300K. The region enabling functioning as a p-type semiconductor in embodiment 11 is considerably wider than that in the case of a conventional p-type diamond semiconductor doped with B, resulting in superiority in function as a p-type semiconductor under various conditions.

Also, Table 9 shows the mobility, at 300K, of holes in each of the p-type diamond semiconductor films obtained when bis-cyclopentadienyl magnesium (($C_5H_5$)$_2$Mg: Cp$_2$Mg), bis-methylcyclopentadienyl magnesium (($CH_3C_5H_4$)$_2$Mg: MCp$_2$Mg) or magnesium chloride (MgCl$_2$) of the present invention is used as a dopant gas.

TABLE 9

(All in Mg atom concentration of $1.0 \times 10^{19}$ cm$^{-3}$)

| Mg dopant material | Hole mobility at room temperature (cm$^2$/Vs) |
|---|---|
| Cp2Mg | 1350 |
| MCp2Mg | 1250 |
| MgCl$_2$ | 100 |

As shown in Table 9, the room-temperature hole mobility in the case of using bis-cyclopentadienyl magnesium (($C_5H_5$)$_2$Mg: Cp$_2$Mg) and bis-methylcyclopentadienyl magnesium (($CH_3C_5H_4$)$_2$Mg: MCp$_2$Mg) is about 12 times or more higher than that in the case of using magnesium chloride ($MgCl_2$), resulting in the diamond semiconductor having notably outstanding characteristics.

(Embodiment 12)

In a microwave plasma chemical vapor deposition technique, by using as a feedstock a gas mixture of a total flow rate of 300 ccm comprising a reaction gas including a methane gas ($CH_4$) at a flow ratio of 1%, a dopant gas and $H^2$ as the remainder, a diamond semiconductor film of the present invention is grown to 1.0 μm thickness on a diamond single-crystal of (001) surface orientation. The pressure in the reaction tube is 50 Torr and the microwave source has a frequency of 2.45 GHz and a power of 1.3 kW. Here, as the dopant gas, dimethylzinc (($CH_3)_2Zn$: DMZn) or diethylzinc (($C_2H_5)_2Zn$: DEZn), which is an organometallic material including Zn, is used.

Hole measurement is conducted on the diamond semiconductor films thus obtained to evaluate the hole coefficient, whereby it can be confirmed that these diamond semiconductor films are p-type semiconductors.

Also, the Zn atom concentration in the diamond semiconductor film is measured by the SIMS measurement, and when the ratio of the number of Zn atoms to the number of C atoms in the source gas (Zn/C)x (ppm) is represented by the horizontal axis and the Zn atom concentration in the semiconductor film y ($cm^{-3}$) is represented by the vertical axis, the relationship is, as shown in FIG. 24, $$X(\text{ppm}) \times 10^{17} = y(\text{cm}^{-3}) \quad (1)$$

Figure 32:
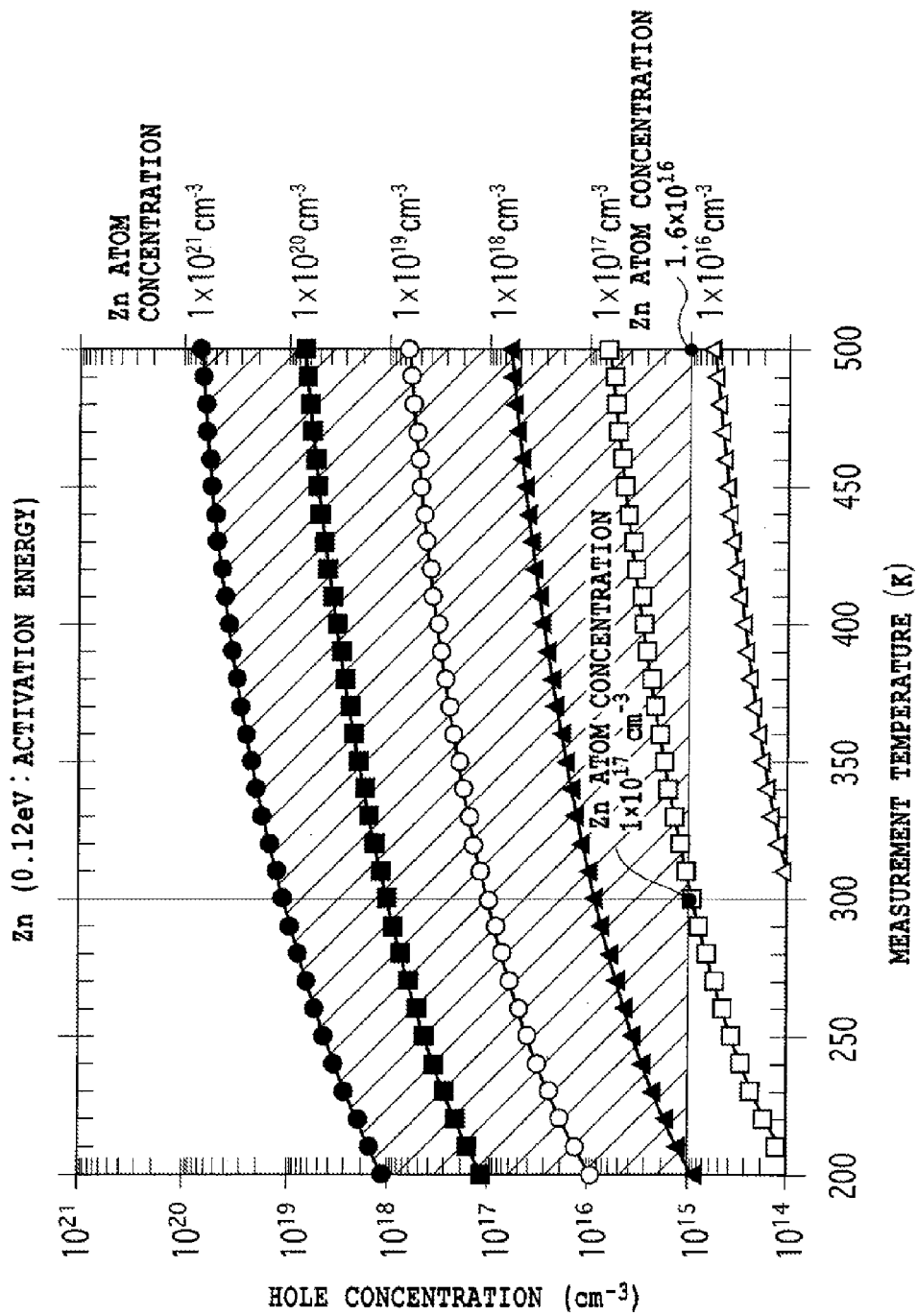
FIG. 32 is a graph showing temperature dependence of a hole concentration for each Zn atom concentration in a p-type diamond semiconductor according to embodiment 12 of the present invention.

FIG. 32 shows the temperature dependence of a hole concentration for each Zn atom concentration in a p-type diamond semiconductor according to embodiment 12 of the present invention. In FIG. 32 measurement temperature (K) is represented by the horizontal axis and the hole concentration ($cm^{-3}$) in the p-type diamond semiconductor is represented by the vertical axis, and the measured values for each Zn atom concentration ($cm^{-3}$) in the p-type diamond semiconductor are plotted.

In order to obtain a hole concentration of $1.0 \times 10^{15}$ $cm^{-3}$ at about 300K which is a practical level, a Zn atom concentration of $1.0 \times 10^{17}$ $cm^{-3}$ or more is required. It is known that deterioration in the quality of the diamond crystal occurs in the Zn atom concentration exceeding $1.0 \times 10^{21}$ $cm^{-3}$. Accordingly, the dopant atom concentration in the Zn-doped p-type diamond semiconductor element at a practical level is required to be no less than $1.0 \times 10^{17}$ $cm^{-3}$ and no more than $1.0 \times 10^{21}$ $cm^{-3}$.

It is seen from this that, using equation (1), the ratio (Zn/C) of the number of Zn atoms to the number of C atoms in the source gas is required to fall within a range of from no less than 1.0 ppm to no more than $10^4$ ppm.

Using FIG. 32 which is the plot of the values of the hole concentration in the p-type diamond semiconductor at each temperature for each dopant atom concentration, a dopant atom concentration enabling the hole concentration in the p-type diamond semiconductor to reach $1.0 \times 10^{15}$ $cm^{-3}$ at each temperature can be found. For example, $1.6 \times 10^{16}$ $cm^{-3}$ is derived from FIG. 32 as a Zn atom concentration enabling the hole concentration in the p-type diamond semiconductor to reach $1.0 \times 10^{15}$ $cm^{-3}$ at 500K. It is seen from equation (1) that the ratio (Zn/C) of the number of Zn atoms to the number of C atoms in the source gas in this case is required to fall within the range of from no less than 0.16 ppm to no more than $10^4$ ppm.

In the range of $1.0 \times 10^{21}$ $cm^{-3}$ or less, the higher the Zn atom concentration in the p-type diamond semiconductor film, the higher the hole concentration, resulting in, needless to say, a diamond semiconductor further suited to practical use.

Also, the requirement for functioning as a p-type semiconductor is that the hole concentration is $1.0 \times 10^{15}$ $cm^{-3}$ or more and the dopant atom concentration is $1.0 \times 10^{21}$ $cm^{-3}$ or less. For this reason, the p-type diamond semiconductor according to embodiment 12 functions as a p-type semiconductor under the conditions of being included in the region enclosed by the line of the hole concentration $1.0 \times 10^{15}$ $cm^{-3}$ and the line of the Zn atom concentration $1.0 \times 10^{15}$ $cm^{-3}$. For example, embodiment 12 can function as a p-type semiconductor even in any temperature other than 300K. The region in which the function as a p-type semiconductor is achieved in embodiment 12 is considerably wider than that in the case of a conventional p-type diamond semiconductor doped with B, resulting in superiority in function as a p-type semiconductor under various conditions.

Also, Table 10 shows the mobility, at 300K, of holes in each of the p-type diamond semiconductor films obtained when dimethylzinc (($CH_3)_2Zn$: DMZn), diethylzinc (($C_2H_5)_2Zn$: DEZn) or zinc chloride ($ZnCl_2$) used in the present invention is used as a dopant gas.

TABLE 10

(All in Zn atom concentration of $1.0 \times 10^{19}$ $cm^{-3}$)

| Zn dopant material | Hole mobility at room temperature ($cm^2/Vs$) |
| --- | --- |
| DMZn | 1200 |
| DEZn | 1150 |
| $ZnCl_2$ | 50 |

As shown in Table 10, the room-temperature hole mobility in the case of using dimethylzinc (($CH_3)_2Zn$: DMZn) or diethylzinc (($C_2H_5)_2Zn$: DEZn) is about 23 times or more higher than that in the case of using zinc chloride ($ZnCl_2$), resulting in the diamond semiconductor having notably outstanding characteristics.

(Embodiment 13)

Diamond powder is mixed with Al, Be, Ca, Cd, Ga, In, Li, Mg or Zn as dopant and the mixture is dissolved in a Fe—Ni solution. It is placed for 7 hours under the conditions of 5.0 GPa and about $1.4 \times 10^{3}$ °C., with the result that a p-type diamond semiconductor film of the present invention can be obtained by the ultra-high-temperature and high-pressure technique. Hole measurement is conducted on the p-type diamond semiconductor films of the present invention thus obtained to evaluate the hole coefficient, whereby it can confirmed that these p-type diamond semiconductor films are p-type semiconductors.

Also, Table 11 shows the hole concentration and the hole mobility in the p-type diamond semiconductor film at 300K when the dopant atom concentrations in the diamond semiconductor films are measured by the SIMS measurement and the ratio of the atom concentration (dopant atom/C) is equally fixed at 0.01%.

TABLE 11

| Dopant | Room-temperature hole concentration ($cm^{-3}$) | Hole mobility ($cm^2/(V \cdot s)$) |
| --- | --- | --- |
| B (conventional art) | $6.2 \times 10^{12}$ | 200 |
| Al | $4.5 \times 10^{16}$ | 960 |
| Be | $1.4 \times 10^{17}$ | 1000 |

TABLE 11-continued

| Dopant | Room-temperature hole concentration (cm$^{-3}$) | Hole mobility (cm$^2$/(V·s)) |
|---|---|---|
| Ca | 3.0 × 10$^{16}$ | 1150 |
| Cd | 4.5 × 10$^{17}$ | 970 |
| Ga | 3.1 × 10$^{17}$ | 1000 |
| In | 6.7 × 10$^{17}$ | 950 |
| Li | 3.0 × 10$^{16}$ | 1150 |
| Mg | 4.4 × 10$^{15}$ | 1100 |
| Zn | 9.7 × 10$^{16}$ | 1130 |

The room-temperature hole concentration in the case of doping Al, Be, Ca, Cd, Ga, In, Li, Mg or Zn is 4.8×10$^3$ to 1.1×10$^5$ times higher than that in the case of doping B in the conventional art (6.2×10$^{12}$ cm$^{-3}$), and notably outstanding. Also, the room-temperature hole mobility in the case of doping Al, Be, Ca, Cd, Ga, In, Li, Mg or Zn is 4.7 to 5.7 times higher than that in the case of doping B in a conventional art (200 cm$^2$/(Vs)), and notably outstanding.

(Embodiment 14)

Al, Be, Ca, Cd, Ga, In, Li, Mg or Zn is used as dopant and an ion implantation technique is used to implant the dopant into a diamond single-crystal under the conditions of an acceleration voltage of 150 kV and a dose of 10$^{15}$ cm$^{-2}$ to produce impurity-doped diamond. Then, the diamond thus obtained is annealed. Hole measurement is conducted on the impurity-doped diamond semiconductor films of the present invention thus obtained to evaluate the hole coefficient, whereby it can be confirmed that these diamond semiconductor films are p-type semiconductors.

Also, Table 12 shows the hole concentration and the hole mobility in the p-type diamond semiconductor film at 300K when the dopant atom concentrations in the diamond semiconductor films are measured by the SIMS measurement and the dopant atom concentration is equally fixed at 1.0×10$^{19}$ cm$^{-3}$.

TABLE 12

| Dopant | Room-temperature hole concentration (cm$^{-3}$) | Hole mobility (cm$^2$/(V·s)) |
|---|---|---|
| B (conventional art) | 3 × 10$^{12}$ | 50 |
| Al | 2 × 10$^{16}$ | 900 |
| Be | 7 × 10$^{16}$ | 950 |
| Ca | 2 × 10$^{16}$ | 1050 |
| Cd | 4 × 10$^{17}$ | 940 |
| Ga | 2 × 10$^{17}$ | 950 |
| In | 4 × 10$^{17}$ | 930 |
| Li | 2 × 10$^{16}$ | 1050 |
| Mg | 3 × 10$^{15}$ | 1050 |
| Zn | 8 × 10$^{16}$ | 1030 |

The room-temperature hole concentration in the case of doping Al, Be, Ca, Cd, Ga, In, Li, Mg or Zn is 1.0×10$^3$ to 6.7×10$^5$ times higher than that in the case of doping B in the conventional art (3.0×10$^{12}$ cm$^{-3}$), and notably outstanding. On the other hand, the room-temperature hole mobility in the case of doping Al, Be, Ca, Cd, Ga, In, Li, Mg or Zn is 18 to 21 times higher than that in the case of doping B in the conventional art (50 cm$^2$/(Vs)), and notably outstanding.

(Embodiment 15)

Figure 33:
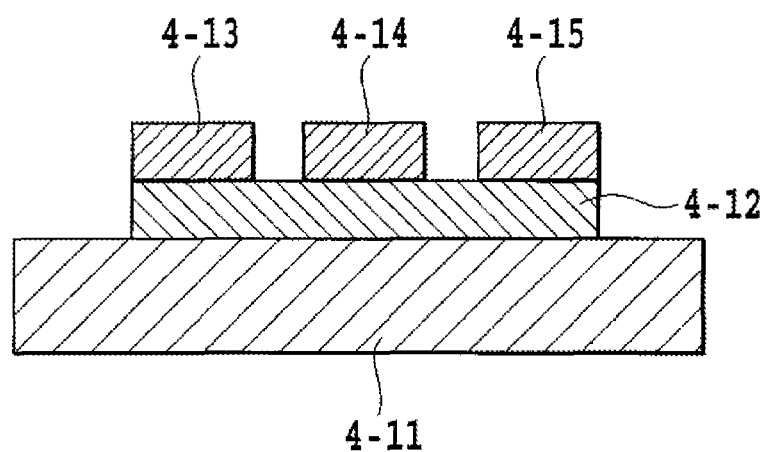
FIG. 33 is a sectional schematic diagram illustrating MESFET (metal-semiconductor field-effect transistor) according to embodiment 15 of the present invention.

FIG. 33 illustrates a structural cross-section view of an MESFET (Metal-Semiconductor Field-Effect Transistor) according to embodiment 15 of the present invention. In a microwave plasma chemical vapor deposition technique, by using as a feedstock a gas mixture of a total flow rate of 300 ccm comprising a reaction gas including a methane gas (CH$_4$) at a flow ratio of 1%, a dopant gas and H$^2$ as the remainder, a p-type diamond semiconductor film 4-12 is grown to 1.0 μm thickness on a diamond substrate 4-11. In the embodiment, the pressure in the reaction tube is 50 Torr and the microwave source has a frequency of 2.45 GHz and a power of 1.3 kW. Here, as the dopant, Al, Ca, Cd, Ga, In, Li, Mg or Zn is used.

In the use of Be as dopant, by an ion implantation technique, the Be dopant is implanted into a diamond single-crystal under the conditions of an acceleration voltage of 150 kV and a dose of 10$^{15}$ cm$^{-2}$ to produce the p-type diamond semiconductor film 4-12.

To achieve electrical insulation between transistors, in the area outside the transistor, the p-type diamond semiconductor film 4-12 is etched away until the diamond substrate 4-11 is exposed. Specifically, the etching is carried out such that the p-type diamond semiconductor film 4-12 has the area of the surface in the direction at right angles to the stacking direction reduced so as to be smaller than the diamond substrate 4-11, with the portion located around the center of the diamond substrate 4-11 still remaining.

On the p-type diamond semiconductor film 4-12, gold (Au) is evaporated as a source electrode 4-13, Al as a gate electrode 4-14 and Au as a drain electrode 4-15 to produce a FET.

Table 13 shows transconductance (gm) (amplification factor) at 300K, of a conventional MESFET and the MESFET according to embodiment 15 of the present invention, in which the dopant atom concentration of the p-type diamond semiconductor film 4-12 is 1.0×10$^{18}$ cm$^{-3}$.

TABLE 13

| Dopant | Transconductance (mS/mm) |
|---|---|
| B (conventional art) | 1.0 × 10$^{-4}$ |
| Al | 1.2 × 10$^2$ |
| Be | 1.5 × 10$^2$ |
| Ca | 1.1 × 10$^2$ |
| Cd | 9.0 × 10 |
| Ga | 8.0 × 10 |
| In | 1.0 × 10$^2$ |
| Li | 1.1 × 10$^2$ |
| Mg | 1.2 × 10$^2$ |
| Zn | 9.0 × 10 |

In the conventional MESFET having the B-doped diamond semiconductor film, the gm=0.0001 mS/mm, whereas the MESFET having the p-type diamond semiconductor film doped with Al, Be, Ca, Cd, Ga, In, Li, Mg or Zn has a gm 8.0×10$^5$ to 1.5×10$^6$ times higher, which is notably outstanding.

The gm values of the MESFET according to embodiment 15 shown in Table 13 are the results obtained by being provided with the p-type diamond semiconductor film 4-12 produced by the microwave plasma chemical vapor deposition technique. In the case of using the ion implantation or the high-temperature and high-pressure synthesis technique for the process of producing the p-type diamond semiconductor film 4-12, the transconductance (gm) decreases so as to be half of that in embodiment 15, but is still highly outstanding as compared with that in the conventional MEFET.

(Embodiment 16)

Figure 34:
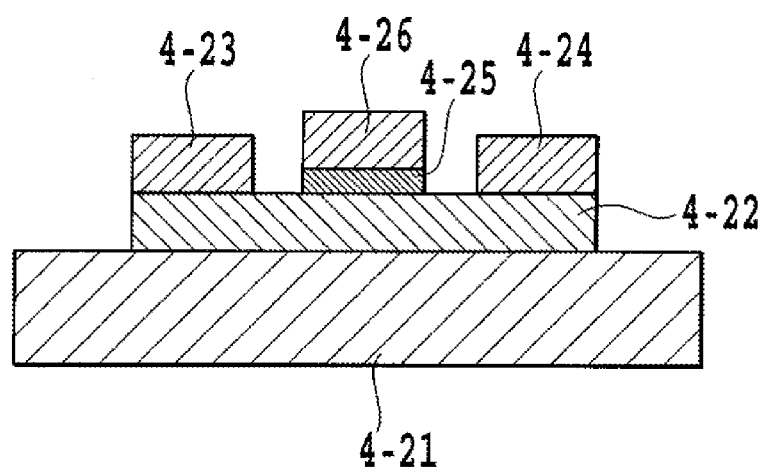
FIG. 34 is a sectional schematic diagram illustrating MISFET (metal-insulating film-semiconductor field-effect transistor) according to embodiment 16 of the present invention.

FIG. 34 illustrates a structural cross-section view of an MISFET (Metal-Insulating film-Semiconductor Field-Effect Transistor) according to embodiment 16 of the present invention. In a microwave plasma chemical vapor deposition technique, by using as a feedstock a gas mixture of a total flow rate of 300 ccm comprising a reaction gas including a methane gas (CH$_4$) at a flow ratio of 1%, a dopant gas and H$^2$ as the remainder, a diamond semiconductor film 4-22 is grown to 1.0 µm thickness on a diamond substrate 4-21. In the embodiment, the pressure in the reaction tube is 50 Torr and the microwave source has a frequency of 2.45 GHz and a power of 1.3 kW. Here, as the dopant in the p-type diamond semiconductor film 4-22, Al, Ca, Cd, Ga, In, Li, Mg or Zn is used.

In the use of Be as the dopant, by an ion implantation technique, the Be dopant is implanted into a diamond single-crystal under the conditions of an acceleration voltage of 150 kV and a dose of $10^{15}$ cm$^{-2}$ to produce the p-type diamond semiconductor film 4-22.

To achieve electrical insulation between transistors, the peripheral portion of the diamond semiconductor film 4-22 is etched away until the diamond substrate 4-21 is exposed. Specifically, the etching is carried out such that the diamond semiconductor film 4-22 has the area of the surface in the direction at right angles to the stacking direction reduced so as to be smaller than the diamond substrate 4-21, with the portion located around the center of the diamond substrate 4-21 still remaining.

On the diamond semiconductor film 4-22, Au is evaporated as a source electrode 4-23, Au as a drain electrode 4-24, SiO$_2$ as an insulating film 4-25 in a gate area and Al as a gate electrode 4-26 to produce a FET.

Table 14 shows transconductance (gm) (amplification factor) at 300K, of a conventional MESFET and the MISFET according to embodiment 16 of the present invention, in which the dopant atom concentration of the diamond semiconductor film 4-22 is $1.0\times10^{18}$ cm$^{-3}$.

TABLE 14

| Dopant | Transconductance (mS/mm) |
|---|---|
| B (conventional art) | $1.0 \times 10^{-5}$ |
| Al | $1.1 \times 10^2$ |
| Be | $1.3 \times 10^2$ |
| Ca | $1.0 \times 10^2$ |
| Cd | $8.5 \times 10$ |
| Ga | $7.5 \times 10$ |
| In | $9.0 \times 10$ |
| Li | $1.0 \times 10^2$ |
| Mg | $8.0 \times 10$ |
| Zn | $6.5 \times 10$ |

In the conventional MISFET having the B-doped p-type diamond semiconductor film, the gm=$1.0\times10^{-5}$ mS/mm, whereas the MISFET having the diamond semiconductor film doped with Al, Be, Ca, Cd, Ga, In, Li, Mg or Zn has a gm $7.5\times10^6$ to $1.3\times10^7$ times, which is notably outstanding.

The gm values of the MISFET according to embodiment 12 shown in Table 14 are the results obtained by being provided with the diamond semiconductor film 4-22 produced by the microwave plasma chemical vapor deposition technique. In the case of using the ion implantation or the high-temperature and high-pressure synthesis technique for the process of producing the diamond semiconductor film 4-22, the transconductance (gm) decreases so as to be half of that in embodiment 12, but is still highly outstanding as compared with that in the conventional MEFET.

(Embodiment 17)

Figure 35:
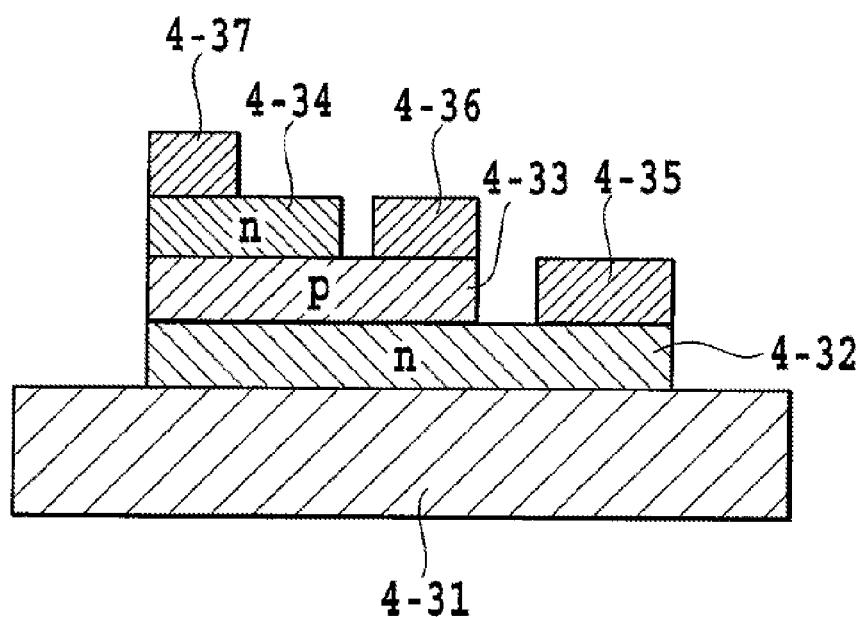
FIG. 35 is a sectional schematic diagram illustrating an npn-type bipolar transistor according to embodiment 17 of the present invention.

FIG. 35 illustrates a structural cross-section view of an npn-type bipolar transistor according to embodiment 17 of the present invention. In a microwave plasma chemical vapor deposition technique, a gas mixture of a total flow rate of 300 ccm comprising a reaction gas including a methane gas (CH$_4$) at a flow ratio of 1%, a dopant gas and H$^2$ as the remainder is used as a feedstock, to grow, on a diamond substrate 4-31, in order, an n-type diamond semiconductor film 4-32 of 5.0 µm thickness and then a p-type diamond semiconductor film 4-33 and an n-type diamond semiconductor film 4-34 which are of 0.5 µm thickness. In the embodiment, the pressure in the reaction tube is 50 Torr and the microwave source has a frequency of 2.45 GHz and a power of 1.3 kW. Here, as the dopant in the p-type semiconductor film 4-33, Al, Ca, Cd, Ga, In, Li, Mg or Zn is used.

In the use of Be as the dopant, by an ion implantation technique, the Be dopant is implanted into a diamond single-crystal under the conditions of an acceleration voltage of 150 kV and a dose of $10^{15}$ cm$^{-2}$ to produce the p-type diamond semiconductor film 4-33.

To achieve electrical insulation between transistors, the peripheral portion of the n-type diamond semiconductor film 4-32 is etched away until the diamond substrate 4-31 is exposed. Also, for forming electrodes, the p-type diamond semiconductor film 4-33 and the n-type diamond semiconductor film 4-34 are etched away as shown in FIG. 35. Ti is evaporated as a collector electrode 4-35 on the n-type diamond semiconductor film 4-32, Ni as a base electrode 4-36 on the p-type diamond semiconductor film 4-33, and Ti as an emitter electrode 4-37 on the n-type diamond semiconductor film 4-34.

Table 15 shows a current amplification factor β at 300K, of a conventional npn-type bipolar transistor and the npn-type bipolar transistor according to embodiment 17 of the present invention, in which the dopant atom concentration of the p-type diamond semiconductor film 4-33 is $1.0\times10^{18}$ cm$^{-3}$.

TABLE 15

| Dopant | Current amplification factor β |
|---|---|
| B (conventional art) | $1.0 \times 10^{-2}$ |
| Al | $2.0 \times 10^3$ |
| Be | $5.0 \times 10^2$ |
| Ca | $2.0 \times 10^3$ |
| Cd | $1.6 \times 10^3$ |
| Ga | $1.4 \times 10^3$ |
| In | $1.2 \times 10^3$ |
| Li | $2.0 \times 10^3$ |
| Mg | $1.6 \times 10^3$ |
| Zn | $1.4 \times 10^3$ |

In the conventional npn-type bipolar transistor having the B-doped p-type diamond semiconductor film, the β=$1.0\times10^{-2}$, whereas the npn-type bipolar transistor having the p-type diamond semiconductor film doped with Al, Be, Ca, Cd, Ga, In, Li, Mg or Zn has β $5.0\times10^4$ to $2.0\times10^5$ times, which is notably outstanding.

The current amplification factors β of the npn-type bipolar transistor according to embodiment 17 shown in Table 15 are the results obtained by being provided with the p-type diamond semiconductor film 4-33 produced using the microwave plasma chemical vapor deposition technique. In the case of using the ion implantation or the high-temperature and high-pressure synthesis technique for the process of producing the p-type diamond semiconductor film 4-33, the current amplification factor β decreases so as to be half of that in embodiment 17, but is still highly outstanding as compared with that in the conventional npn-type bipolar transistor.

(Embodiment 18)

Figure 36:
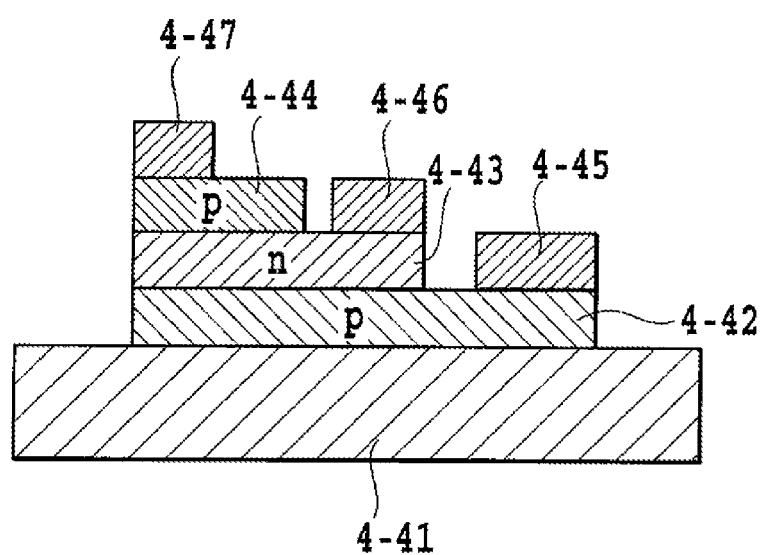
FIG. 36 is a sectional schematic diagram illustrating an pnp-type bipolar transistor according to embodiment 18 of the present invention.

FIG. 36 illustrates a structural cross-section view of a pnp-type bipolar transistor according to embodiment 18 of the present invention. In a microwave plasma chemical vapor deposition technique, a gas mixture of a total flow rate of 300 ccm comprising a reaction gas including a methane gas (CH$_4$) at a flow ratio of 1%, a dopant gas and H$^2$ as the remainder is used as a feedstock, to grow, on a diamond substrate 4-41, in order, a p-type diamond semiconductor film 4-42 of 5.0 µm thickness, and an n-type diamond semiconductor film 4-43 and a p-type diamond semiconductor film 4-44 which are of 0.5 μm thickness. In the embodiment, the pressure in the reaction tube is 50 Torr and the microwave source has a frequency of 2.45 GHz and a power of 1.3 kW. Here, as the dopant in the p-type semiconductor films 4-42 and 4-44, Al, Ca, Cd, Ga, In, Li, Mg or Zn is used.

In the use of Be as the dopant, by an ion implantation technique, the Be dopant is implanted into a diamond single-crystal under the conditions of an acceleration voltage of 150 kV and a dose of $10^{15}$ cm$^{-2}$ to produce the p-type diamond semiconductor films 4-42 and 4-44.

To achieve electrical insulation between transistors, the peripheral portion of the p-type diamond semiconductor film 4-42 is etched away until the diamond substrate 4-41 is exposed. Also, for forming electrodes, the n-type diamond semiconductor film 4-43 and the p-type diamond semiconductor film 4-44 are etched away as shown in FIG. 36. Ni is evaporated as a collector electrode 4-45 on the p-type diamond semiconductor film 4-42, Ti as a base electrode 4-46 on the n-type diamond semiconductor film 4-43, and Ni as an emitter electrode 4-47 on the p-type diamond semiconductor film 4-44.

Table 16 shows a current amplification factor β at 300K, of a conventional pnp-type bipolar transistor and the pnp-type bipolar transistor according to embodiment 18 of the present invention, in which the dopant atom concentration of the p-type diamond semiconductor films 4-42 and 4-44 is 1.0× $10^{18}$ cm$^{-3}$.

TABLE 16

| Dopant | Current amplification factor β |
|---|---|
| B (conventional art) | $1.0 \times 10^{-3}$ |
| Al | $1.7 \times 10^{3}$ |
| Be | $4.0 \times 10^{2}$ |
| Ca | $1.8 \times 10^{3}$ |
| Cd | $1.5 \times 10^{3}$ |
| Ga | $1.3 \times 10^{3}$ |
| In | $1.2 \times 10^{3}$ |
| Li | $1.8 \times 10^{3}$ |
| Mg | $1.5 \times 10^{3}$ |
| Zn | $1.3 \times 10^{3}$ |

In the conventional pnp-type bipolar transistor having the B-doped p-type diamond semiconductor film, the β=1.0×10$^3$, whereas the pnp-type bipolar transistor having the p-type diamond semiconductor film doped with Al, Be, Ca, Cd, Ga, In, Li, Mg or Zn has β 4.0×10$^5$ to 1.8×10$^6$ times, which is notably outstanding.

The current amplification factors β of the pnp-type bipolar transistor according to embodiment 18 shown in Table 16 are the results obtained by being provided with the p-type diamond semiconductor films 4-42 and 4-44 produced using the microwave plasma chemical vapor deposition technique. In the case of using the ion implantation or the high-temperature and high-pressure synthesis technique for the process of producing the p-type diamond semiconductor films 4-42 and 4-44, the current amplification factor β decreases so as to be half of that in embodiment 18, but is still highly outstanding as compared with that in the conventional pnp-type bipolar transistor.

(Embodiment 19)

Figure 37:
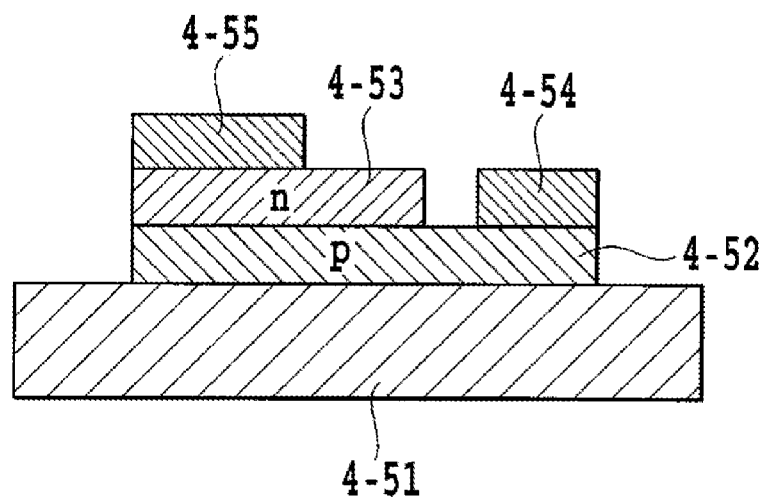
FIG. 37 is a sectional schematic diagram illustrating a light emitting diode (LED) according to embodiment 19 of the present invention.
Figure 38:
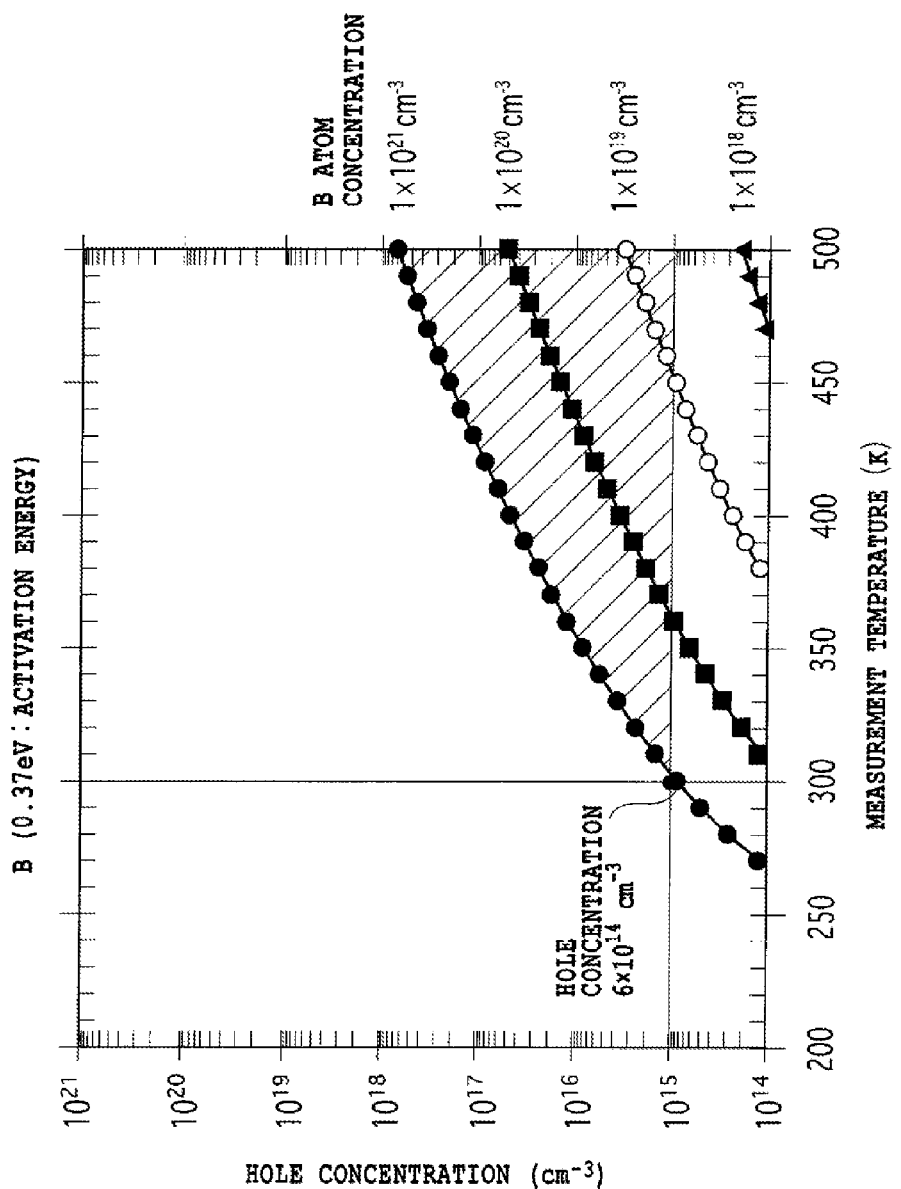
FIG. 38 is a graph showing temperature dependence of a hole concentration for each B atom concentration in a conventional p-type diamond semiconductor.

FIG. 37 illustrates a structural cross-section view of a light emitting diode (LED) according to embodiment 19 of the present invention. In a microwave plasma chemical vapor deposition technique, a gas mixture of a total flow rate of 300 ccm comprising a reaction gas including a methane gas (CH$_4$) at a flow ratio of 1%, a dopant gas and H$^2$ as the remainder is used as a feedstock, to grow, on a diamond substrate 4-51, in order, a p-type diamond semiconductor film 4-52 of 5.0 μm thickness and an n-type diamond semiconductor film 4-53 of 0.5 μm thickness. In the embodiment, the pressure in the reaction tube is 50 Torr and the microwave source has a frequency of 2.45 GHz and a power of 1.3 kW. Here, as the dopant in the p-type semiconductor film 4-52, Al, Ca, Cd, Ga, In, Li, Mg or Zn is used.

In the use of Be as the dopant, by an ion implantation technique, the Be dopant is implanted into a diamond single-crystal under the conditions of an acceleration voltage of 150 kV and a dose of $10^{15}$ cm$^{-2}$ to produce the p-type diamond semiconductor film 4-52.

To achieve electrical insulation between LEDs, the p-type diamond semiconductor film 4-52 and the n-type diamond semiconductor film 4-53 are etched away as illustrated in FIG. 37. Also, an Ni anode electrode 4-54 is evaporated on the p-type diamond semiconductor film 4-52, and a Ti cathode electrode 4-55 is evaporated on the n-type diamond semiconductor film 4-53.

Table 17 shows emission intensities (output power density) at a wavelength of 235 nm of a conventional light emitting diode (LED) and the LED according to embodiment 19 of the present invention when the applied voltage is 7V and the current density is 10 A/mm$^2$.

TABLE 17

| Dopant | Output power density (mW/mm$^2$) |
|---|---|
| B (conventional art) | $1.0 \times 10^{-4}$ |
| Al | $5.0 \times 10^{3}$ |
| Be | $4.0 \times 10^{3}$ |
| Ca | $2.8 \times 10^{3}$ |
| Cd | $4.0 \times 10^{3}$ |
| Ga | $7.1 \times 10^{3}$ |
| In | $5.0 \times 10^{3}$ |
| Li | $2.8 \times 10^{3}$ |
| Mg | $4.7 \times 10^{3}$ |
| Zn | $4.7 \times 10^{3}$ |

It is seen that the output power density in the case of using B in the conventional art is 1.0×10$^{-4}$ mW/mm$^2$, but the output power density in the case of using Al, Be, Ca, Cd, Ga, In, Li, Mg or Zn is 2.8×10$^7$ to 7.1×10$^7$ times higher, which is notably outstanding.

In FIG. 37, the p-type diamond semiconductor film 4-52 and the n-type diamond semiconductor film 4-53 are stacked in this order, but even in the reversed order the characteristics are not changed. In other words, the same results as those in Table 17 are obtained equally in an LED having an n-type diamond semiconductor film and a p-type diamond semiconductor film stacked in this order on the diamond substrate 4-51.

The emission intensities (output power density) at a wavelength of 235 nm of LED according to embodiment 19 shown in Table 17 are the results obtained by being provided with the p-type diamond semiconductor film 4-52 produced using the microwave plasma chemical vapor deposition technique. In the case of using the ion implantation or the high-temperature and high-pressure synthesis technique for the process of producing the p-type diamond semiconductor film 4-52, the emission intensity (output power density) at a wavelength of 235 nm decreases so as to be approximately half, but the LED still has outstanding characteristics as compared with that in the conventional LED.

The present invention attaches importance to the use of any of the following nine, Al, Be, Ca, Cd, Ga, In, Li, Mg and Zn as dopant in a p-type diamond semiconductor, and is not limited to the process of producing the p-type diamond semiconductor film used in each of the embodiments.

Next, a process for producing a diamond semiconductor according to the present invention in order to attain the fifth object will be described in detail.

The present invention makes it possible to produce a high quality diamond semiconductor by providing a protective layer to protect an ion-implanted diamond thin-film formed on the surface before high-temperature and high-pressure annealing is performed so as to make it possible to eliminate damage caused by ion implantation while preventing the surface from being etched by the high-temperature and high-pressure annealing.

(Embodiment 20)

Figure 40A:
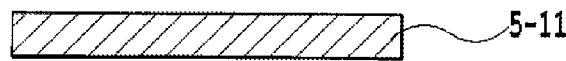
FIG. 40A is a diagram illustrating a process-step in producing a diamond semiconductor according to embodiment 1 of the present invention.
Figure 40B:
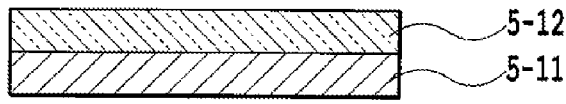
FIG. 40B is a diagram illustrating a process-step in producing a diamond semiconductor according to embodiment 1 of the present invention.

FIGS. 40A to 40G illustrate the process-steps in producing a diamond semiconductor according to embodiment 20 of the present invention. A diamond substrate 5-11 is prepared (FIG. 40A). A microwave plasma CVD apparatus is used to laminate a diamond thin-film 5-12 of 1 μm on the diamond substrate 5-11 at a substrate temperature of 700° C. using methane as a reaction gas (FIG. 40B). The embodiment employs the microwave plasma CVD technique, but any technique can be employed as long as the diamond thin-film 5-12 is formed. A diamond single crystal produced by high-temperature and high-pressure synthesis may be used.

Figure 40C:
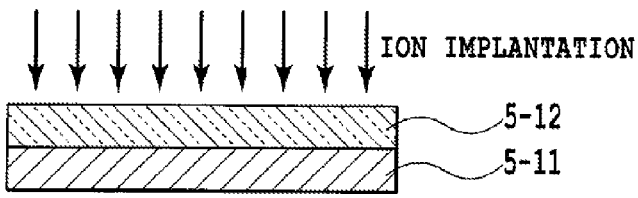
FIG. 40C is a diagram illustrating a process-step in producing a diamond semiconductor according to embodiment 1 of the present invention.
Figure 40D:
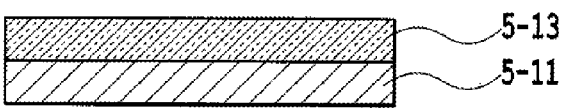
FIG. 40D is a diagram illustrating a process-step in producing a diamond semiconductor according to embodiment 1 of the present invention.

An ion implanting apparatus is used to implant dopant into the diamond thin-film 5-12 at an acceleration voltage of 60 kV and a dose of $1 \times 10^{14}$ cm$^{-2}$ (FIGS. 40C, 40D). Here, as the implanted dopant, we have B, Al, Ga, In, Zn, Cd, Be, Mg, Ca, P, As, Sb, O, S, Se, Li, Na, and K.

Figure 40E:
FIG. 40E is a diagram illustrating a process-step in producing a diamond semiconductor according to embodiment 1 of the present invention.

Then, a protective layer (platinum) 5-14 is formed on the ion-implanted diamond thin-film 5-13 (FIG. 40E). In the embodiment, platinum is used as the protective layer 5-14, but the protective layer 5-14 may be a multilayer film of various metals, alloy, oxides, nitrides and combinations of these having a thin-film of 0.01 μm to 10 μm. In particular, the protective layer 5-14 is desirably designed as a layer of a metal including at least one of the five, titanium, tungsten, platinum, palladium and molybdenum, or a layer of $Al_{1-x}Si_xO_{1-y}N_y$ ($0 \leq x \leq 1$, $0 \leq y \leq 1$), or a layer comprising many layers of no less than two of them. The protective layer 5-14 may be produced by vapor deposition, sputtering, CVD technique, laser ablation technique.

Figure 40F:
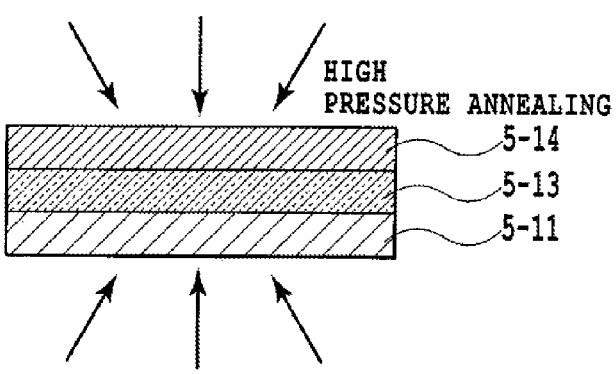
FIG. 40F is a diagram illustrating a process-step in producing a diamond semiconductor according to embodiment 1 of the present invention.

The ion implanted diamond thin-film 5-13 with the protective layer 5-14 formed thereon is placed in an ultra-high-temperature and high-pressure firing furnace, and is annealed at a pressure and a temperature of no less than 3.5 GPa and no less than 600° C. (FIG. 40F). In other words, the annealing is carried out under the conditions of the pressure P (kbar) and the temperature T (K) being a pressure of no less than 35 kbar and a temperature of no less than 873K which satisfy the relation of the expression P>7.1+0.027T (see non-patent document 7).

Figure 40G:
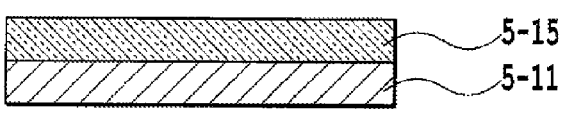
FIG. 40G is a diagram illustrating a process-step in producing a diamond semiconductor according to embodiment 1 of the present invention.

The protective layer 5-14 is removed by acid, and then a semiconductor diamond thin-film 5-15 is obtained (FIG. 40G).

By way of example, after electrodes have been formed on the semiconductor diamond thin-film 5-15 which is produced through the annealing for one hour under the conditions of 1400° C. and 7 GPa, hole measurement is conducted on the thin-film 5-15 to determine polarity, carrier concentration at room temperature and mobility at room temperature. Table 18 shows the polarity, the carrier concentration and mobility at room temperature for each dopant of the semiconductor diamond thin-film 5-15 in this example.

TABLE 18

| Dopant | Polarity | Room-temperature carrier concentration (cm$^{-3}$) | Room-temperature mobility (cm$^2$/Vs) |
|---|---|---|---|
| B | P-type | $3 \times 10^{13}$ | 1100 |
| Al | P-type | $5 \times 10^{15}$ | 1000 |
| Ga | P-type | $7 \times 10^{16}$ | 900 |
| In | P-type | $6 \times 10^{16}$ | 800 |
| Zn | P-type | $5 \times 10^{16}$ | 900 |
| Cd | P-type | $6 \times 10^{16}$ | 950 |
| Be | P-type | $7 \times 10^{17}$ | 1000 |
| Mg | P-type | $8 \times 10^{17}$ | 1150 |
| Ca | P-type | $2 \times 10^{17}$ | 800 |
| P | N-type | $3 \times 10^{11}$ | 650 |
| As | N-type | $7 \times 10^{15}$ | 700 |
| Sb | N-type | $5 \times 10^{15}$ | 950 |
| O | N-type | $3 \times 10^{13}$ | 250 |
| S | N-type | $6 \times 10^{13}$ | 800 |
| Se | N-type | $5 \times 10^{14}$ | 700 |
| Li | N-type | $6 \times 10^{14}$ | 600 |
| Na | N-type | $3 \times 10^{14}$ | 650 |
| K | N-type | $5 \times 10^{14}$ | 500 |

As shown in Table 18, the semiconductor diamond thin-film 5-15 has the characteristics of a high-quality P-type/N-type semiconductor which are unable to be provided by conventional producing processes, as a result of forming the protective layer 5-14 on the ion implanted diamond thin-film 5-13 before performing the high-temperature and high-pressure annealing.

Figure 42:
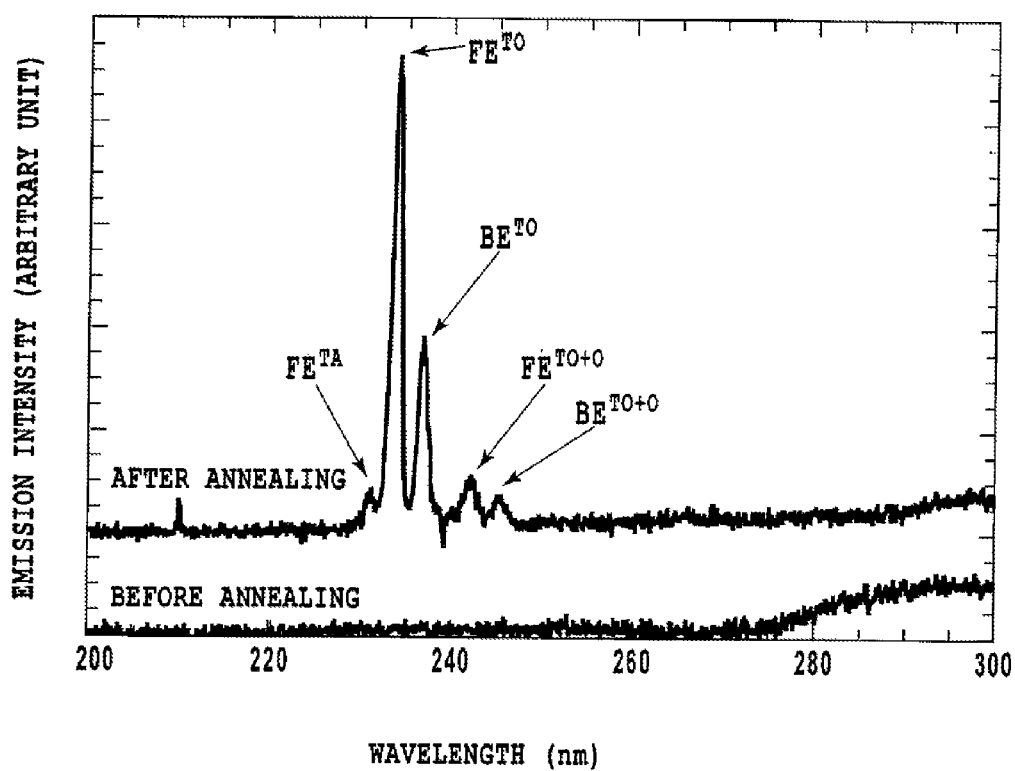
FIG. 42 is a graph showing cathode luminescence (CL) spectra (measurement temperature: 10K) before and after high-temperature high-pressure annealing is performed on a diamond thin-film implanted with ions of boron (B) as dopant.
Figure 43A:
FIG. 43A is a diagram illustrating a process-step in producing a diamond semiconductor using an ion implantation technique according to conventional art.
Figure 43B:
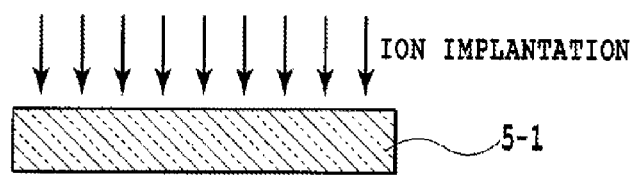
FIG. 43B is a diagram illustrating a process-step in producing a diamond semiconductor using an ion implantation technique according to conventional art.
Figure 43C:
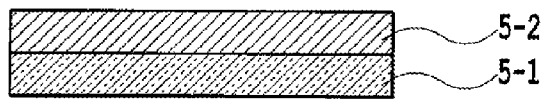
FIG. 43C is a diagram illustrating a process-step in producing a diamond semiconductor using an ion implantation technique according to conventional art.
Figure 43D:
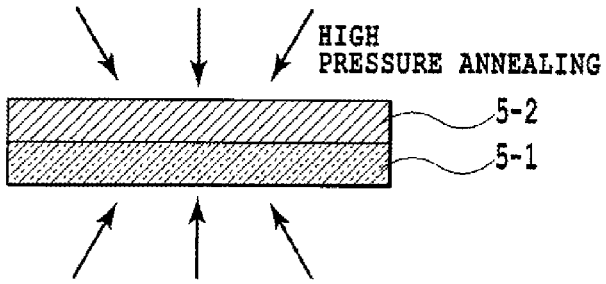
FIG. 43D is a diagram illustrating a process-step in producing a diamond semiconductor using an ion implantation technique according to conventional art.
Figure 43E:
FIG. 43E is a diagram illustrating a process-step in producing a diamond semiconductor using an ion implantation technique according to conventional art.

Further, FIG. 42 shows the cathode luminescence (CL) spectra (measurement temperature: 10K) before and after high-temperature and high-pressure annealing is performed on a diamond thin-film implanted with boron (B) ions as dopant by way of example. In the ion implanted diamond thin-film 5-13 before the high-temperature and high-pressure annealing, the light-emission in relation to free exciton (FE) peculiar to a diamond is not observed. However, FE-related light-emission occurs in the semiconductor diamond thin-film 5-15 after high-temperature high-pressure annealing under the conditions of 1400° C. and 7 GPa. This FE light-emission results from exciton, and the emission intensity increases with an increase in the crystal quality. As a result, the crystal quality can be evaluated with reference to the emission intensity. Also, from the observation of bound-exciton light-emission (BE) originating in boron, it is seen that boron functions as dopant in the diamond thin-film.

These facts demonstrate that the crystal quality of the semiconductor diamond thin-film 5-15 so produced is improved as compared with that of the ion implanted diamond thin-film 5-13 before the high-temperature and high-pressure annealing, and that boron exists in the semiconductor diamond thin-film 5-15. Specifically, they demonstrate that, by implanting boron ions, crystal defects and an amorphous layer are introduced into the ion implanted diamond thin-film 5-13, resulting in the occurrence of deterioration of the diamond crystal, but, by the high-temperature and high-pressure annealing, these crystal defects and amorphous layer are removed and boron is activated as dopant.

As described above, the results of CL also suggest that the semiconductor diamond thin-film 5-15 obtained by the process of producing the diamond semiconductor according to the embodiment is a high-quality P-type/N-type diamond semiconductor such as is unable to be provided by conventional processes.

(Embodiment 21)

FIGS. 41A to 41F illustrate the process-steps in producing a diamond semiconductor according to embodiment 21 of the present invention. A diamond substrate 5-21 is prepared (FIG.

Figure 41A:
FIG. 41A is a diagram illustrating a process-step in producing a diamond semiconductor according to embodiment 2 of the present invention.
Figure 41B:
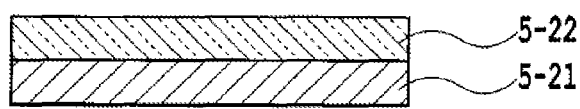
FIG. 41B is a diagram illustrating a process-step in producing a diamond semiconductor according to embodiment 2 of the present invention.

41A). A microwave plasma CVD apparatus is used to laminate a diamond thin-film of 1 μm onto the diamond substrate 5-21 at a substrate temperature of 700° C. using methane as a reaction gas (FIG. 41B).

Figure 41C:
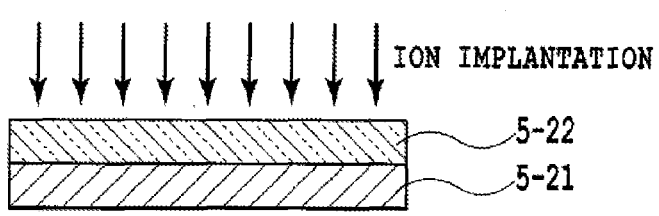
FIG. 41C is a diagram illustrating a process-step in producing a diamond semiconductor according to embodiment 2 of the present invention.
Figure 41D:
FIG. 41D is a diagram illustrating a process-step in producing a diamond semiconductor according to embodiment 2 of the present invention.

After that, an ion implanting apparatus is used to implant dopant into the diamond thin-film 5-22 thus produced at an acceleration voltage of 60 kV and a dose of $1×10^{14}$ cm$^{-2}$ (FIGS. 41C, 41D). As in the case of embodiment 20, as the dopant implanted at this stage, we have B, Al, Ga, In, Zn, Cd, Be, Mg, Ca, P, As, Sb, O, S, Se, Li, Na, and K.

Figure 41E:
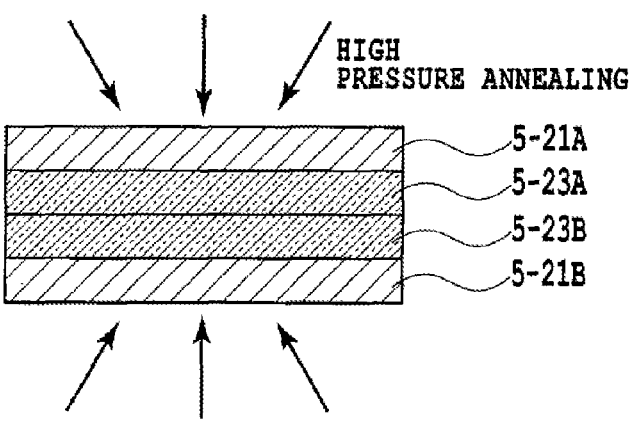
FIG. 41E is a diagram illustrating a process-step in producing a diamond semiconductor according to embodiment 2 of the present invention.

The two substrates with the ion implanted diamond thin-films formed thereon are superimposed each other such that the ion implanted diamond thin-films face inward, and are then placed in an ultra-high-temperature and high-pressure firing furnace. Specifically, the diamond substrates 5-21A and 5-21B are superimposed such that a diamond thin-film 5-23A formed on a diamond substrate 5-21A and a diamond thin-film 5-23B formed on a diamond substrate 5021B make contact with each other and are sandwiched between them. After that, the superimposed substrates are annealed in an ultra-high-temperature and high-pressure firing furnace at a pressure and a temperature of no less than 3.5 GPa and no less than 600° C. (FIG. 41E). In other words, the annealing is carried out under the conditions of the pressure P (kbar) and the temperature T (K) being a pressure of no less than 35 kbar and a temperature of no less than 873K, which satisfy the relation of expression P>7.1+0.027T (see non-patent document 7).

Figure 41F:
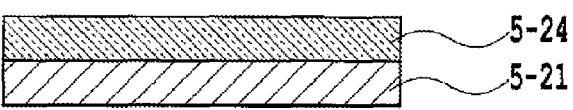
FIG. 41F is a diagram illustrating a process-step in producing a diamond semiconductor according to embodiment 2 of the present invention.

After the completion of the high-temperature and high-pressure annealing, the superimposed diamond substrates 5-21A and 5-21B are separated, thus obtaining high-quality semiconductor diamond thin-films 5-24 (FIG. 41F). Because the diamond thin-films 5-23A and 5-23B seldom bond with each other, the diamond thin-films 5-23A and 5-23B can be easily separated naturally or by applying a small shock.

By way of example, a diamond (100) substrate is used as the diamond substrate 5-21, and electrodes are formed on the semiconductor diamond thin-film 5-24 which is produced through high-temperature and high-pressure annealing for one hour under the conditions of 1400° C. and 7 GPa, and then hole measurement is conducted to determine polarity, carrier concentration and mobility at room temperature. Table 19 shows the polarity, the carrier concentration and mobility at room temperature for each dopant of the semiconductor diamond thin-film 5-24 in this example.

TABLE 19

| Dopant | Polarity | Room-temperature carrier concentration (cm$^{-3}$) | Room-temperature mobility (cm$^2$/Vs) |
|---|---|---|---|
| B  | P-type | $1 × 10^{13}$ | 1100 |
| Al | P-type | $4 × 10^{15}$ | 900 |
| Ga | P-type | $5 × 10^{16}$ | 900 |
| In | P-type | $5 × 10^{16}$ | 800 |
| Zn | P-type | $4 × 10^{16}$ | 900 |
| Cd | P-type | $6 × 10^{16}$ | 950 |
| Be | P-type | $5 × 10^{17}$ | 1000 |
| Mg | P-type | $6 × 10^{17}$ | 1100 |
| Ca | P-type | $1 × 10^{17}$ | 800 |
| P  | N-type | $3 × 10^{11}$ | 550 |
| As | N-type | $6 × 10^{15}$ | 700 |
| Sb | N-type | $3 × 10^{15}$ | 900 |
| O  | N-type | $3 × 10^{13}$ | 250 |
| S  | N-type | $6 × 10^{13}$ | 700 |
| Se | N-type | $5 × 10^{14}$ | 600 |
| Li | N-type | $5 × 10^{14}$ | 500 |
| Na | N-type | $3 × 10^{14}$ | 600 |
| K  | N-type | $2 × 10^{14}$ | 600 |

It is seen that, as shown in Table 19, the semiconductor diamond thin-films 5-24 produced in the embodiment have a high mobility at room temperature. These results demonstrate that the surface of the ion implanted diamond thin-film 5-23 is protected before the high-temperature and high-pressure annealing is carried out, thereby preventing the surface from being etched and providing high-quality P-type and N-type semiconductors such as are unable to be provided by conventional producing processes.

What is claimed is:

1. A process for producing a diamond semiconductor element, comprising:
   forming a first metal film on a diamond single-crystal thin-film;
   forming a second metal film on said first metal film, wherein said second metal film is thicker than said first metal film;
   forming, in a first area of said second metal film, a first aperture reaching the surface of said first metal film;
   etching away a part of the surface of said first metal film exposed by said first aperture to form a second aperture extending through said first metal film so as to reach the surface of said diamond single-crystal thin-film, the second aperture of the first metal film being narrower than the first aperture of the second metal film; and
   forming a third metal film on said diamond single-crystal thin-film exposed by said second aperture.

2. The process of processing the diamond semiconductor element according to claim 1, wherein in the step of forming said first aperture, said first aperture is formed such that the width of said first aperture is larger than the thickness of said second metal film.

3. The process of processing the diamond semiconductor element according to claim 1, wherein forming the second metal film on the first metal film comprises:
   coating a first portion of a top surface of the first metal film with a resist so as to leave a second portion of the top surface of the first metal film uncoated; and
   forming a second metal film on the second portion of the top surface of the first metal film and on a top surface of the resist; and
   wherein forming the first aperture in the first area of the second metal film comprises performing liftoff of the resist.

4. A method for producing a diamond semiconductor element, comprising:
   forming a first metal film on a top surface of a diamond single-crystal thin-film;
   coating a first portion of a top surface of the first metal film with a first resist so as to leave a second portion of the top surface of the first metal film uncoated;
   forming a second metal film on the second portion of the top surface of the first metal film and on a top surface of the first resist;
   performing liftoff of the first resist to form, in a portion of the second metal film, a first aperture extending through the second metal film to the first portion of the top surface of the first metal film, thereby openly exposing the first portion of the top surface of the first metal film;
   etching away an area of the exposed first portion of the top surface of the first metal film to form a second aperture extending through the first metal film to the surface of the diamond single-crystal thin-film, thereby openly exposing a portion of the top surface of the diamond single-crystal thin-film, the second aperture of the first metal film being narrower than the first aperture of the second metal film; and forming a third metal film on the exposed portion of the top surface of the diamond single-crystal thin-film through the first and second apertures.

5. The method recited in claim 4, further comprising, after performing liftoff of the first resist:
- coating a top surface of the second metal film and the exposed first portion of the top surface of the first metal film with a second resist; and
- etching away an area of the second resist positioned over the first portion of the top surface of the first metal film so as to expose the area of the top surface of the first metal film.

6. The method recited in claim 5, wherein forming the third metal film on the exposed portion of the top surface of the diamond single-crystal thin-film comprises:
- forming the third metal film on a top surface of the second resist and the exposed portion of the top surface of the diamond single-crystal thin-film; and
- performing liftoff of the second resist.

7. The method recited in claim 4, wherein the second portion of the top surface of the first metal film comprises two areas completely separated by the first portion.

8. The method recited in claim 4, whereby the etching produces an undercut on the first metal film.

9. The method recited in claim 4, wherein the third metal film is spaced apart from the first and second metal films.

10. The method recited in claim 4, wherein the diamond semiconductor element is formed such that:
- the first metal film is divided into a first section and a second section by the first aperture, the first and second sections being completely separated from each other;
- the second metal film is divided into a first section and a second section by the second aperture, the first and second sections being completely separated from each other;
- the first section of the first metal film and the first section of the second metal film combine to form a source electrode;
- the second section of the first metal film and the second section of the second metal film combine to form a drain electrode;
- the third metal film forms a gate electrode; and
- the source, drain, and gate electrodes are spaced apart from each other so as to not contact each other.

\* \* \* \* \*